(12) United States Patent
Elsherbini et al.

(10) Patent No.: US 12,300,666 B2
(45) Date of Patent: *May 13, 2025

(54) MICROELECTRONIC ASSEMBLIES WITH COMMUNICATION NETWORKS

(71) Applicant: Intel Corporation, Santa Clara, CA (US)

(72) Inventors: Adel A. Elsherbini, Tempe, AZ (US); Amr Elshazly, Hillsboro, OR (US); Arun Chandrasekhar, Chandler, AZ (US); Shawna M. Liff, Scottsdale, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/597,684

(22) Filed: Mar. 6, 2024

(65) Prior Publication Data

US 2024/0213216 A1    Jun. 27, 2024

Related U.S. Application Data

(63) Continuation of application No. 17/956,773, filed on Sep. 29, 2022, now Pat. No. 11,967,580, which is a
(Continued)

(51) Int. Cl.
*H01L 23/48* (2006.01)
*H01L 23/498* (2006.01)
(Continued)

(52) U.S. Cl.
CPC .... *H01L 25/0652* (2013.01); *H01L 23/49822* (2013.01); *H01L 25/50* (2013.01)

(58) Field of Classification Search
None
See application file for complete search history.

(56) References Cited

U.S. PATENT DOCUMENTS 7,402,901 B2   7/2008  Hatano
9,136,236 B2   9/2015  Starkston et al.
(Continued)

FOREIGN PATENT DOCUMENTS

WO   WO-2017052641   3/2017
WO   WO-2019132968   7/2019

OTHER PUBLICATIONS

Walton, M., "HBM Explained: Can Stacked Memory Give AMO the Edge It Needs?," Biz & IT; 5 pages (May 19, 2015).
(Continued)

*Primary Examiner* — Nicholas J Tobergte
(74) *Attorney, Agent, or Firm* — Schwabe, Williamson & Wyatt, P.C.

(57) ABSTRACT

Microelectronic assemblies, and related devices and methods, are disclosed herein. For example, in some embodiments, a microelectronic assembly may include a package substrate, a first die coupled to the package substrate with first interconnects, and a second die coupled to the first die with second interconnects, wherein the second die is coupled to the package substrate with third interconnects, a communication network is at least partially included in the first die and at least partially included in the second die, and the communication network includes a communication pathway between the first die and the second die.

20 Claims, 56 Drawing Sheets

Related U.S. Application Data continuation of application No. 17/706,156, filed on Mar. 28, 2022, now Pat. No. 11,749,642, which is a continuation of application No. 17/128,558, filed on Dec. 21, 2020, now Pat. No. 11,437,348, which is a continuation of application No. 16/648,464, filed as application No. PCT/US2017/068917 on Dec. 29, 2017, now Pat. No. 11,342,305.

(51) Int. Cl.
  *H01L 25/00* (2006.01)
  *H01L 25/065* (2023.01)

(56) References Cited

U.S. PATENT DOCUMENTS

| | | | |
|---|---|---|---|
| 9,379,074 | B2 | 6/2016 | Uzoh et al. |
| 9,754,890 | B2 | 9/2017 | Deshpande |
| 10,535,608 | B1 | 1/2020 | Rubin |
| 10,826,492 | B2 | 11/2020 | Dubey et al. |
| 11,133,256 | B2 | 9/2021 | Jain et al. |
| 11,217,535 | B2 | 5/2022 | Elsherbini |
| 11,967,580 | B2 * | 4/2024 | Elsherbini ........... H01L 23/3675 |
| 2002/0185337 | A1 | 12/2002 | Miura |
| 2014/0203457 | A1 | 7/2014 | Kim et al. |
| 2014/0264791 | A1 | 9/2014 | Manusharow et al. |
| 2015/0255427 | A1 | 9/2015 | Sung |
| 2016/0056102 | A1 | 2/2016 | Konchady et al. |
| 2016/0147463 | A1 | 5/2016 | Han et al. |
| 2016/0183361 | A1 * | 6/2016 | May .................. H01L 23/49866 174/257 |
| 2016/0343666 | A1 | 11/2016 | Deshpande |
| 2017/0062383 | A1 | 3/2017 | Yee et al. |
| 2017/0170121 | A1 | 6/2017 | Haba |
| 2017/0287838 | A1 | 10/2017 | Pietambaram et al. |
| 2018/0286840 | A1 | 10/2018 | Nair et al. |
| 2020/0273839 | A1 | 8/2020 | Elsherbini et al. |

OTHER PUBLICATIONS

PCT International Search Report and Written Opinion issued Sep. 28, 2018 in PCT Application No. PCT/ US2017/068917; 13 pages.
European Extended Search Report issued in EP Application No. 17936519 on Jul. 29, 2021; 10 pages.
Non-Final Office Action issued in U.S. Appl. No. 17/128,558 on Feb. 4, 2022; 25 pages.
Non-Final Office Action issued in U.S. Appl. No. 16/648,464 on Jun. 8, 2021; 18 pages.
PCT International Preliminary Report on Patentability issued Jul. 9, 2020 in PCT Application No. PCT/US2017/068917; 10 pages.
Non-Final Office Action issued in U.S. Appl. No. 17/706,156 on Jan. 4, 2023; 6 pages.
Office Action from European Patent Application No. 17936519.2, mailed Oct. 17, 2022, 9 pgs.
Office Action issued in U.S. Appl. No. 11/956,773 on Jun. 2, 2023; 12 pages.
Notice of Allowance from U.S. Appl. No. 17/706,156, mailed Apr. 28, 2023, 8 pgs.
European Extended Search Report issued in European Patent Application No. 22217230.6 mailed Aug. 16, 2023, 13 pages.
Office Action from European Patent Application No. 17936519.2, mailed Nov. 28, 2023, 16 pgs.

* cited by examiner

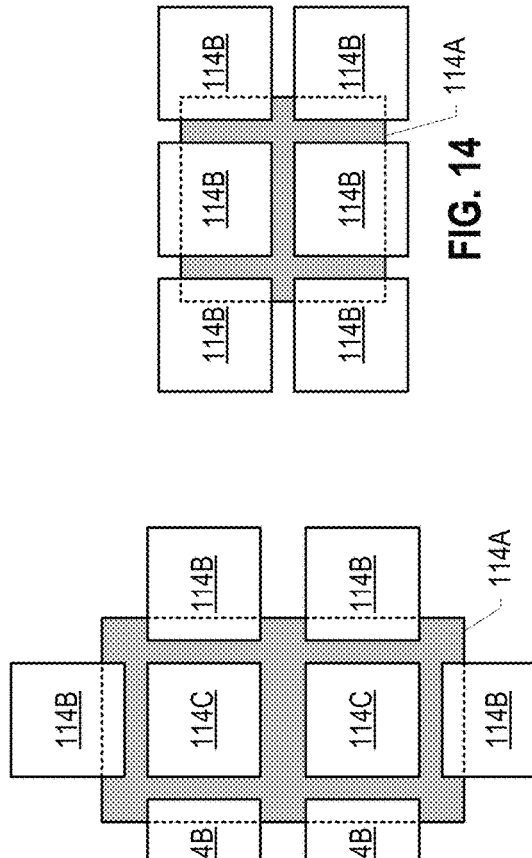
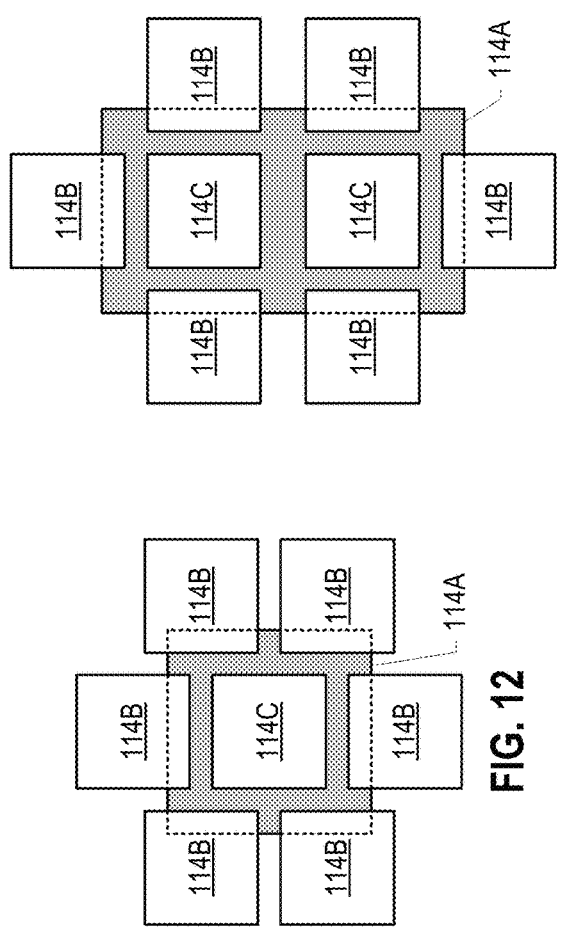
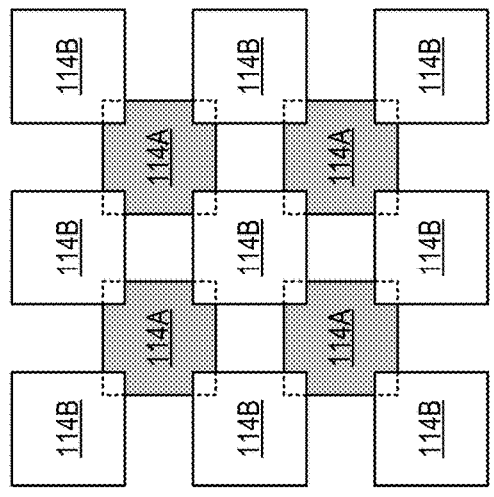
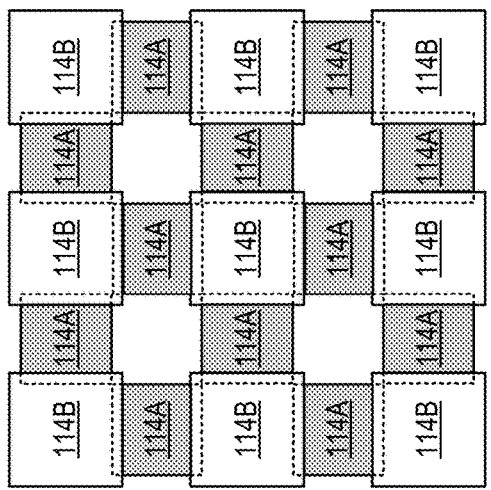

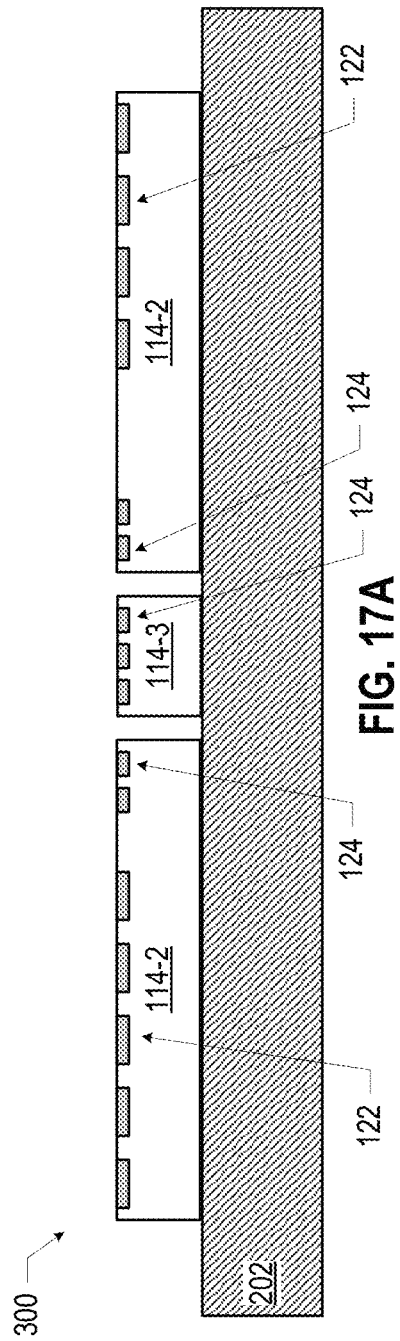

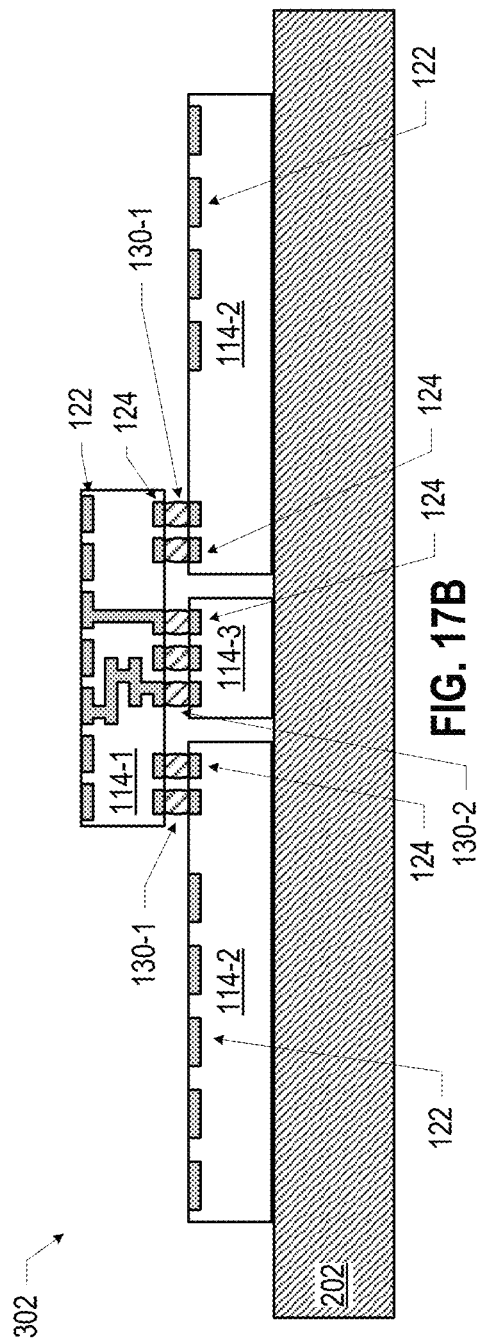

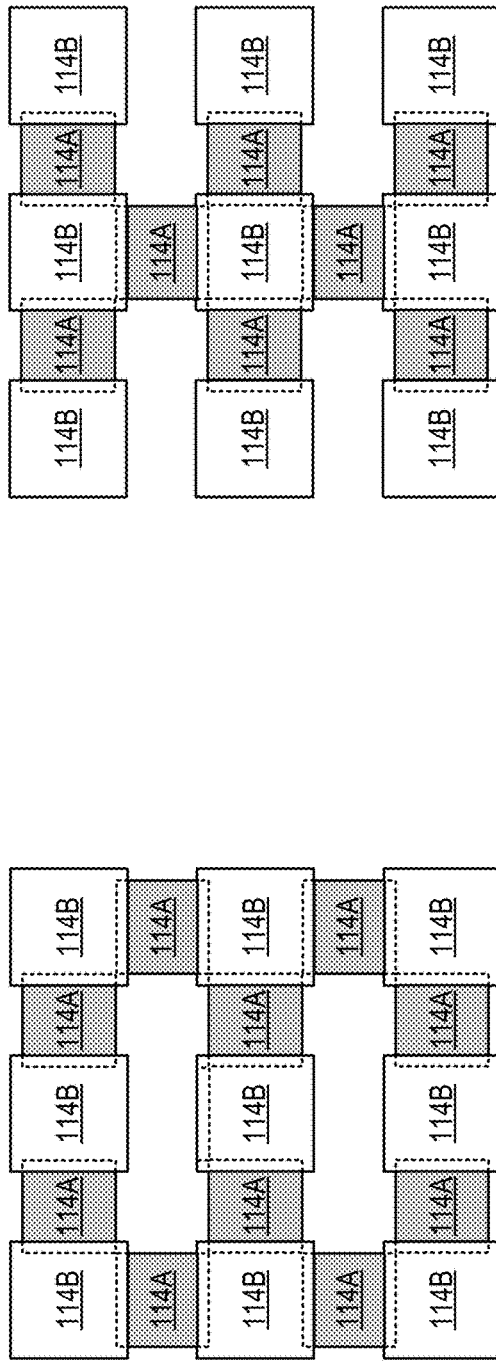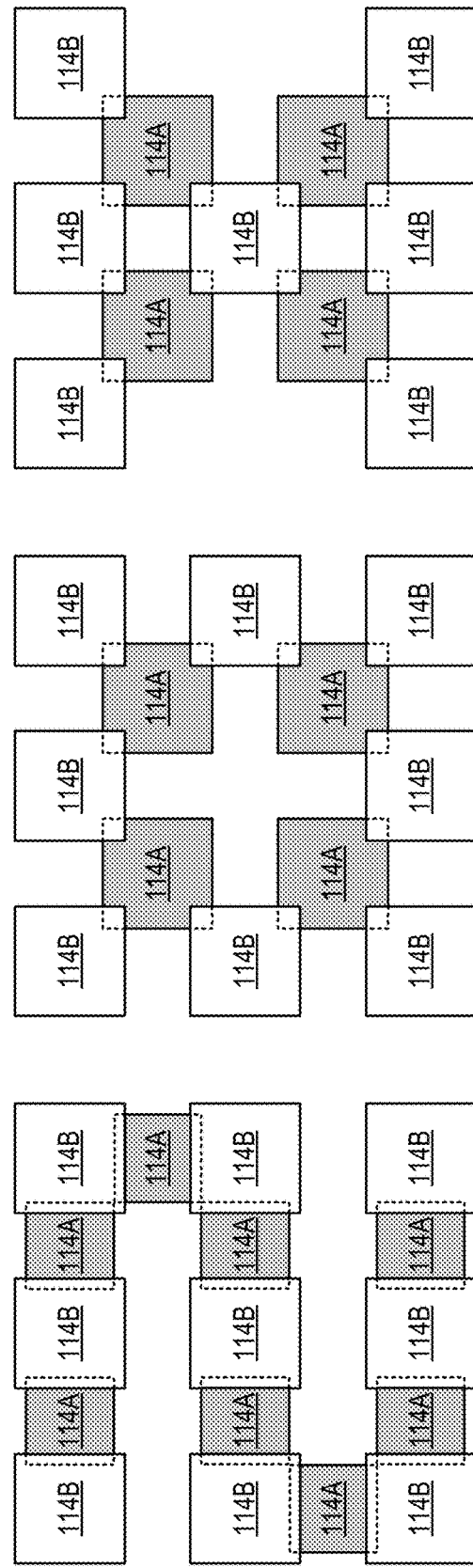

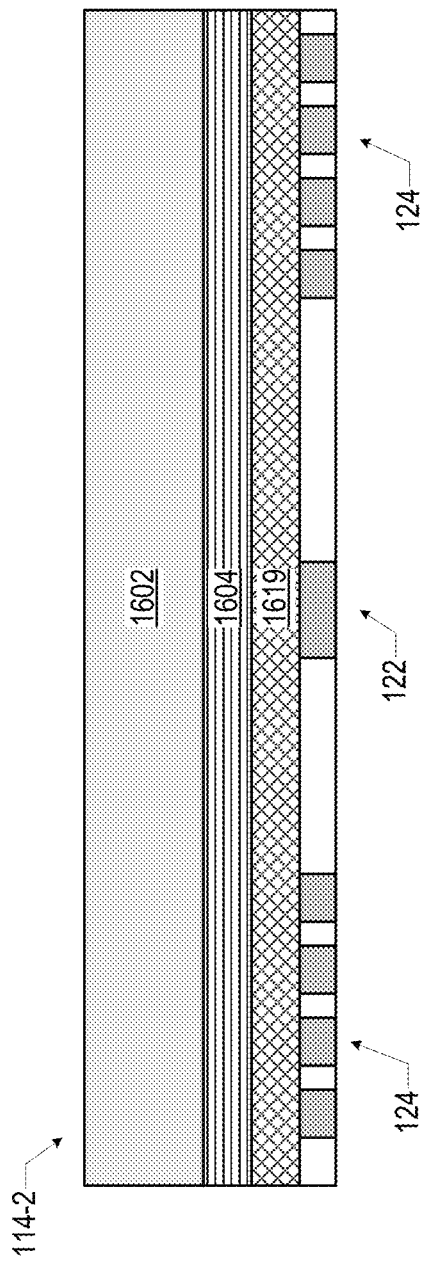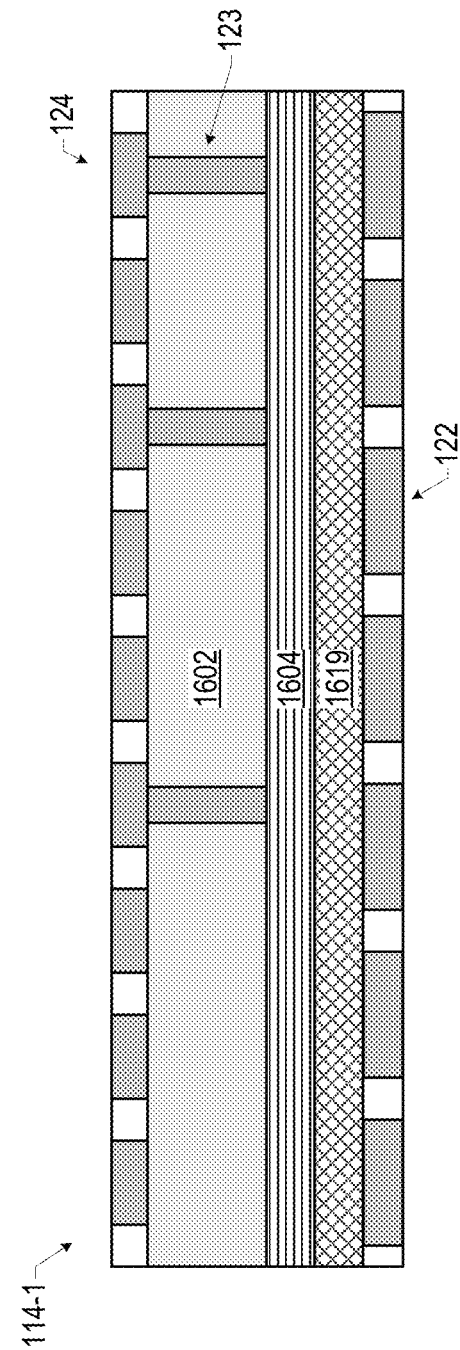

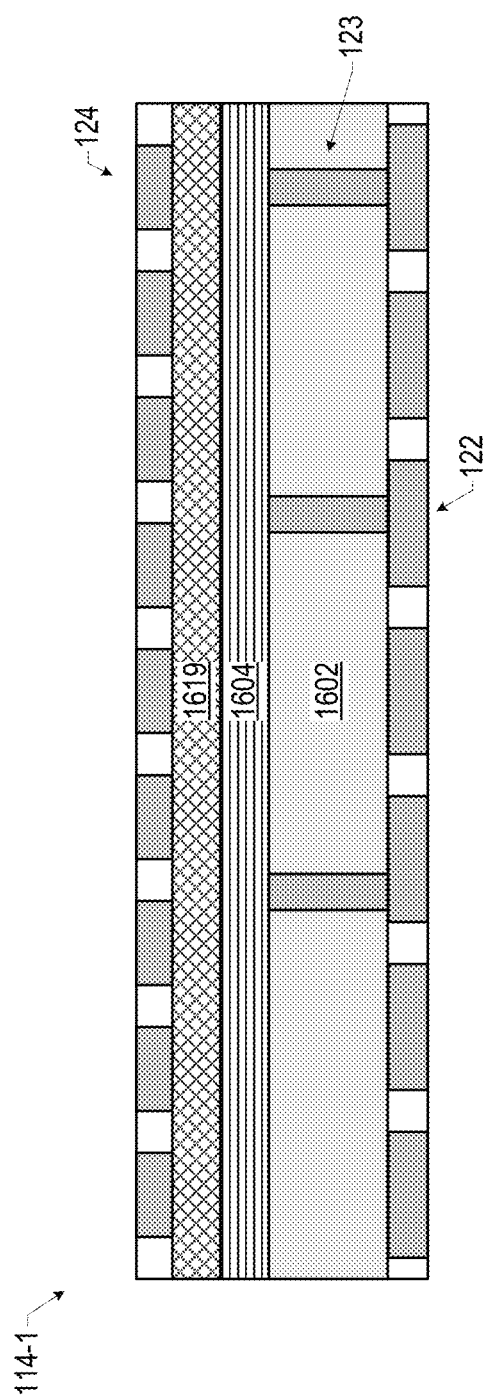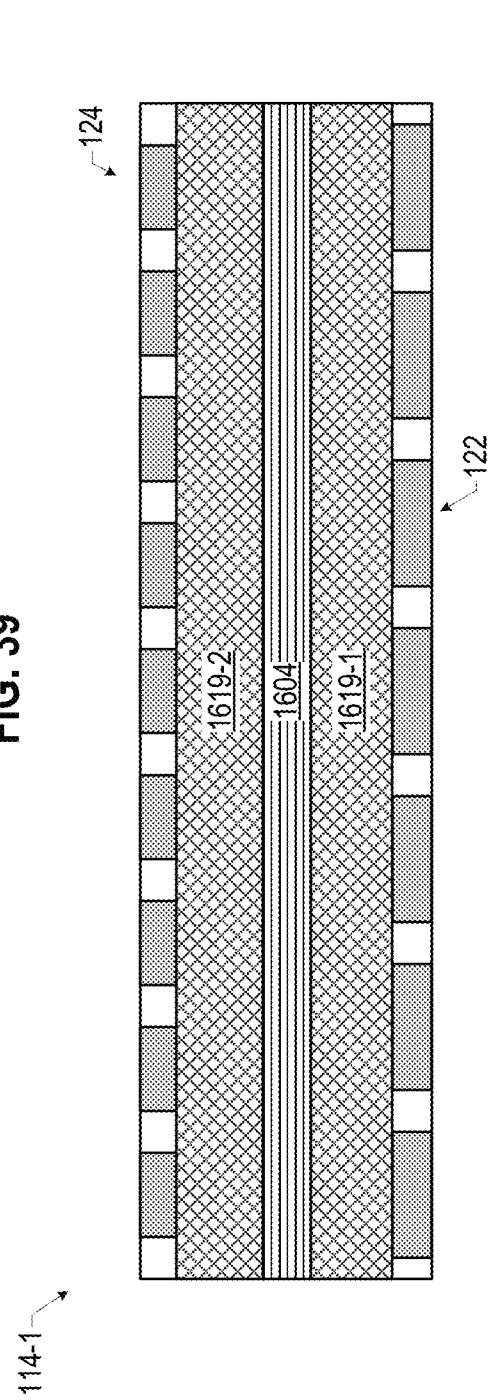

MICROELECTRONIC ASSEMBLIES WITH COMMUNICATION NETWORKS

CROSS-REFERENCE TO RELATED APPLICATIONS

This application is a continuation of U.S. patent application Ser. No. 17/956,773, filed Sep. 29, 2022, which is a continuation of U.S. patent application Ser. No. 17/706,156, filed Mar. 28, 2022, now U.S. Pat. No. 11,749,642, issued Sep. 5, 2023, which is a continuation of (and claims benefit of priority under 35 U.S.C. § 120 to) U.S. application Ser. No. 17/128,558, filed Dec. 21, 2020, now U.S. Pat. No. 11,437,348, issued Sep. 6, 2022, which is a continuation of U.S. application Ser. No. 16/648,464, filed Mar. 18, 2020, now U.S. Pat. No. 11,342,305, issued May 24, 2022, which is a national stage application under 35 U.S.C. § 371 of PCT International Application Serial No. PCT/US2017/068917, filed on Dec. 29, 2017 and entitled "MICROELECTRONIC ASSEMBLIES WITH COMMUNICATION NETWORKS," which are hereby incorporated by reference herein in their entireties.

BACKGROUND

Integrated circuit dies are conventionally coupled to a package substrate for mechanical stability and to facilitate connection to other components, such as circuit boards. The interconnect pitch achievable by conventional substrates is constrained by manufacturing, materials, and thermal considerations, among others.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 12-16 are top views of example arrangements of multiple dies in a microelectronic assembly, in accordance with various embodiments.

FIGS. 17A-17F are side, cross-sectional views of various stages in an example process for manufacturing the microelectronic assembly of FIG. 5, in accordance with various embodiments.

FIGS. 28-32 are top views of example arrangements of multiple dies in a microelectronic assembly, in accordance with various embodiments.

FIGS. 37-40 are side, cross-sectional views of example dies in a microelectronic assembly, in accordance with various embodiments.

DETAILED DESCRIPTION

Figure 1:
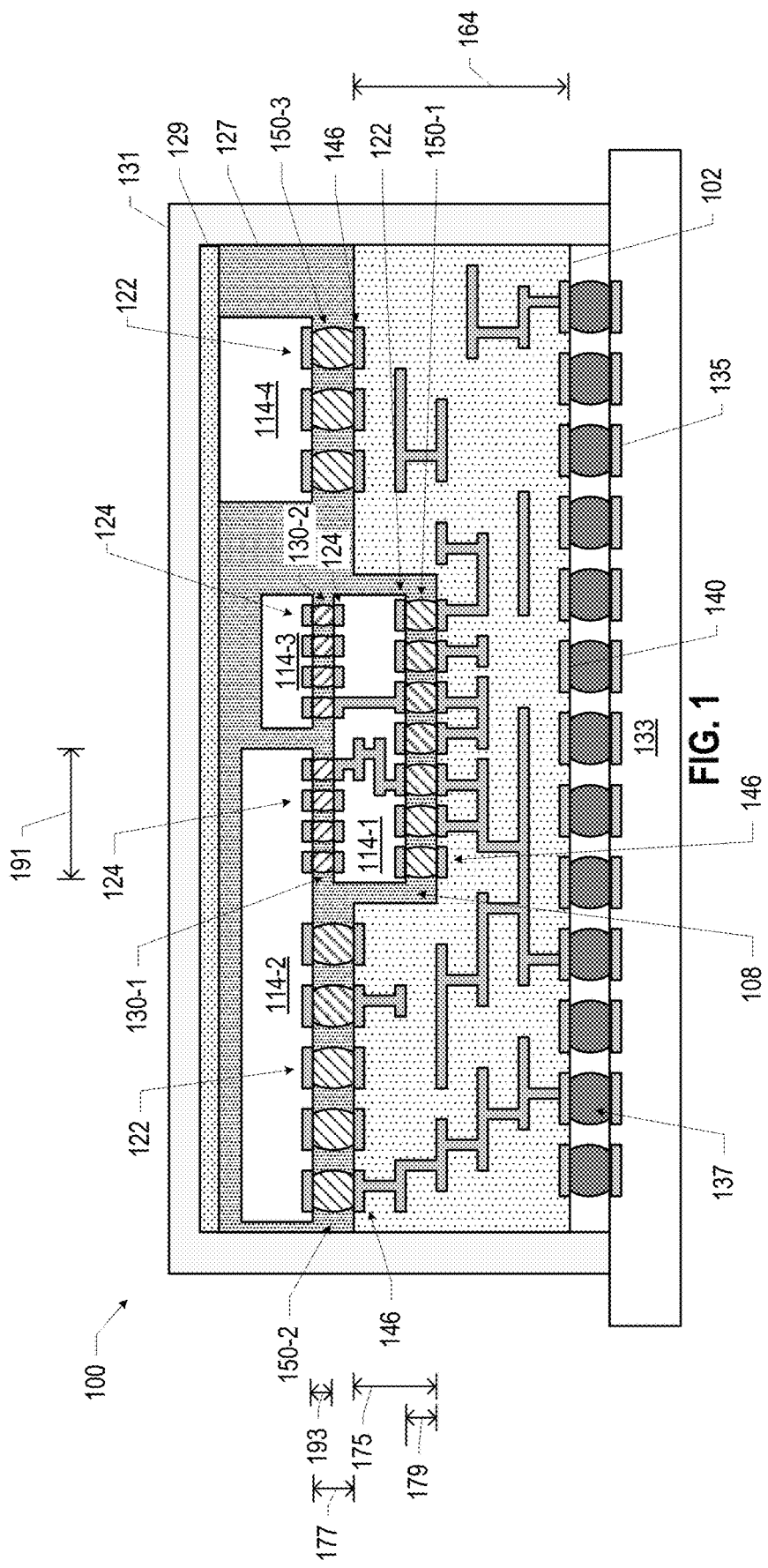
FIG. 1 is a side, cross-sectional view of an example microelectronic assembly, in accordance with various embodiments.

Microelectronic assemblies, and related devices and methods, are disclosed herein. For example, in some embodiments, a microelectronic assembly may include a package substrate, a first die coupled to the package substrate with first interconnects, and a second die coupled to the first die with second interconnects, wherein the second die is coupled to the package substrate with third interconnects, a communication network is at least partially included in the first die and at least partially included in the second die, and the communication network includes a communication pathway between the first die and the second die.

Communicating large numbers of signals between two or more dies in a multi-die integrated circuit (IC) package is challenging due to the increasingly small size of such dies, thermal constraints, and power delivery constraints, among others. Various ones of the embodiments disclosed herein may help achieve reliable attachment of multiple IC dies at a lower cost, with improved power efficiency, with higher bandwidth, and/or with greater design flexibility, relative to conventional approaches. Various ones of the microelectronic assemblies disclosed herein may exhibit better power delivery and signal speed while reducing the size of the package relative to conventional approaches. The microelectronic assemblies disclosed herein may be particularly advantageous for small and low-profile applications in computers, tablets, industrial robots, and consumer electronics (e.g., wearable devices).

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous, as are a "die" and an "IC die." The terms "top" and "bottom" may be used herein to explain various features of the drawings, but these terms are simply for ease of discussion, and do not imply a desired or required orientation. As used herein, the term "insulating" means "electrically insulating," unless otherwise specified.

When used to describe a range of dimensions, the phrase "between X and Y" represents a range that includes X and Y. For convenience, the phrase "FIG. 17" may be used to refer to the collection of drawings of FIGS. 17A-17F, the phrase "FIG. 18" may be used to refer to the collection of drawings of FIGS. 18A-18B, etc. Although certain elements may be referred to in the singular herein, such elements may include multiple sub-elements. For example, "an insulating material" may include one or more insulating materials. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via).

FIG. 1 is a side, cross-sectional view of a microelectronic assembly 100, in accordance with various embodiments. A number of elements are illustrated in FIG. 1 as included in the microelectronic assembly 100, but a number of these elements may not be present in a microelectronic assembly 100. For example, in various embodiments, the heat spreader 131, the thermal interface material 129, the mold material 127, the die 114-3, the die 114-4, the second-level interconnects 137, and/or the circuit board 133 may not be included. Further, FIG. 1 illustrates a number of elements that are omitted from subsequent drawings for ease of illustration, but may be included in any of the microelectronic assemblies 100 disclosed herein. Examples of such elements include the heat spreader 131, the thermal interface material 129, the mold material 127, the second-level interconnects 137, and/or the circuit board 133. Many of the elements of the microelectronic assembly 100 of FIG. 1 are included in other ones of the accompanying figures; the discussion of these elements is not repeated when discussing these figures, and any of these elements may take any of the forms disclosed herein. In some embodiments, individual ones of the microelectronic assemblies 100 disclosed herein may serve as a system-in-package (SiP) in which multiple dies 114 having different functionality are included. In such embodiments, the microelectronic assembly 100 may be referred to as an SiP.

The microelectronic assembly 100 may include a package substrate 102 coupled to a die 114-1 by die-to-package substrate (DTPS) interconnects 150-1. In particular, the top surface of the package substrate 102 may include a set of conductive contacts 146, and the bottom surface of the die 114-1 may include a set of conductive contacts 122; the conductive contacts 122 at the bottom surface of the die 114-1 may be electrically and mechanically coupled to the conductive contacts 146 at the top surface of the package substrate 102 by the DTPS interconnects 150-1. In the embodiment of FIG. 1, the top surface of the package substrate 102 includes a recess 108 in which the die 114-1 is at least partially disposed; the conductive contacts 146 to which the die 114-1 is coupled are located at the bottom of the recess 108. In other embodiments, the die 114-1 may not be disposed in a recess (e.g., as discussed below with reference to FIGS. 9-11). Any of the conductive contacts disclosed herein (e.g., the conductive contacts 122, 124, 146, 140, and/or 135) may include bond pads, posts, or any other suitable conductive contact, for example.

The package substrate 102 may include an insulating material (e.g., a dielectric material formed in multiple layers, as known in the art) and one or more conductive pathways through the dielectric material (e.g., including conductive traces and/or conductive vias, as shown). In some embodiments, the insulating material of the package substrate 102 may be a dielectric material, such as an organic dielectric material, a fire retardant grade 4 material (FR-4), bismaleimide triazine (BT) resin, polyimide materials, glass reinforced epoxy matrix materials, or low-k and ultra low-k dielectric (e.g., carbon-doped dielectrics, fluorine-doped dielectrics, porous dielectrics, and organic polymeric dielectrics). In particular, when the package substrate 102 is formed using standard printed circuit board (PCB) processes, the package substrate 102 may include FR-4, and the conductive pathways in the package substrate 102 may be formed by patterned sheets of copper separated by build-up layers of the FR-4. The conductive pathways in the package substrate 102 may be bordered by liner materials, such as adhesion liners and/or barrier liners, as suitable.

In some embodiments, one or more of the conductive pathways in the package substrate 102 may extend between a conductive contact 146 at the top surface of the package substrate 102 and a conductive contact 140 at the bottom surface of the package substrate 102. In some embodiments, one or more of the conductive pathways in the package substrate 102 may extend between a conductive contact 146 at the bottom of the recess 108 and a conductive contact 140 at the bottom surface of the package substrate 102. In some embodiments, one or more of the conductive pathways in the package substrate 102 may extend between different conductive contacts 146 at the top surface of the package substrate 102 (e.g., between a conductive contact 146 at the bottom of the recess 108 and a different conductive contact 146 at the top surface of the package substrate 102). In some embodiments, one or more of the conductive pathways in the package substrate 102 may extend between different conductive contacts 140 at the bottom surface of the package substrate 102.

The dies 114 disclosed herein may include an insulating material (e.g., a dielectric material formed in multiple layers, as known in the art) and multiple conductive pathways formed through the insulating material. In some embodiments, the insulating material of a die 114 may include a dielectric material, such as silicon dioxide, silicon nitride, oxynitride, polyimide materials, glass reinforced epoxy matrix materials, or a low-k or ultra low-k dielectric (e.g., carbon-doped dielectrics, fluorine-doped dielectrics, porous dielectrics, organic polymeric dielectrics, photo-imageable dielectrics, and/or benzocyclobutene-based polymers). In some embodiments, the insulating material of a die 114 may include a semiconductor material, such as silicon, germanium, or a III-V material (e.g., gallium nitride), and one or more additional materials. For example, an insulating material may include silicon oxide or silicon nitride. The conductive pathways in a die 114 may include conductive traces and/or conductive vias, and may connect any of the conductive contacts in the die 114 in any suitable manner (e.g., connecting multiple conductive contacts on a same surface or on different surfaces of the die 114). Example structures that may be included in the dies 114 disclosed herein are discussed below with reference to FIG. 44. The conductive pathways in the dies 114 may be bordered by liner materials, such as adhesion liners and/or barrier liners, as suitable.

In some embodiments, the die 114-1 may include conductive pathways to route power, ground, and/or signals to/from some of the other dies 114 included in the microelectronic assembly 100. For example, the die 114-1 may include through-substrate vias (TSVs, including a conductive material via, such as a metal via, isolated from the surrounding silicon or other semiconductor material by a barrier oxide) or other conductive pathways through which power, ground, and/or signals may be transmitted between the package substrate 102 and one or more dies 114 "on top" of the die 114-1 (e.g., in the embodiment of FIG. 1, the die 114-2 and/or the die 114-3). In some embodiments, the die 114-1 may include conductive pathways to route power, ground, and/or signals between different ones of the dies 114 "on top" of the die 114-1 (e.g., in the embodiment of FIG. 1, the die 114-2 and the die 114-3). In some embodiments, the die 114-1 may be the source and/or destination of signals communicated between the die 114-1 and other dies 114 included in the microelectronic assembly 100.

In some embodiments, the die 114-1 may not route power and/or ground to the die 114-2; instead, the die 114-2 may couple directly to power and/or ground lines in the package substrate 102. By allowing the die 114-2 to couple directly to power and/or ground lines in the package substrate 102, such power and/or ground lines need not be routed through the die 114-1, allowing the die 114-1 to be made smaller or to include more active circuitry or signal pathways.

In some embodiments, the die 114-1 may only include conductive pathways, and may not contain active or passive circuitry. In other embodiments, the die 114-1 may include active or passive circuitry (e.g., transistors, diodes, resistors, inductors, and capacitors, among others). In some embodiments, the die 114-1 may include one or more device layers including transistors (e.g., as discussed below with reference to FIG. 44. When the die 114-1 includes active circuitry, power and/or ground signals may be routed through the package substrate 102 and to the die 114-1 through the conductive contacts 122 on the bottom surface of the die 114-1.

Although FIG. 1 illustrates a specific number and arrangement of conductive pathways in the package of 102 and/or one or more of the dies 114, these are simply illustrative, and any suitable number and arrangement may be used. The conductive pathways disclosed herein (e.g., conductive traces and/or conductive vias) may be formed of any appropriate conductive material, such as copper, silver, nickel, gold, aluminum, or other metals or alloys, for example.

In some embodiments, the package substrate 102 may be a lower density medium and the die 114-1 may be a higher density medium. As used herein, the term "lower density" and "higher density" are relative terms indicating that the conductive pathways (e.g., including conductive lines and conductive vias) in a lower density medium are larger and/or have a greater pitch than the conductive pathways in a higher density medium. In some embodiments, a higher density medium may be manufactured using a modified semi-additive process or a semi-additive build-up process with advanced lithography (with small vertical interconnect features formed by advanced laser or lithography processes), while a lower density medium may be a PCB manufactured using a standard PCB process (e.g., a standard subtractive process using etch chemistry to remove areas of unwanted copper, and with coarse vertical interconnect features formed by a standard laser process).

Figure 2:
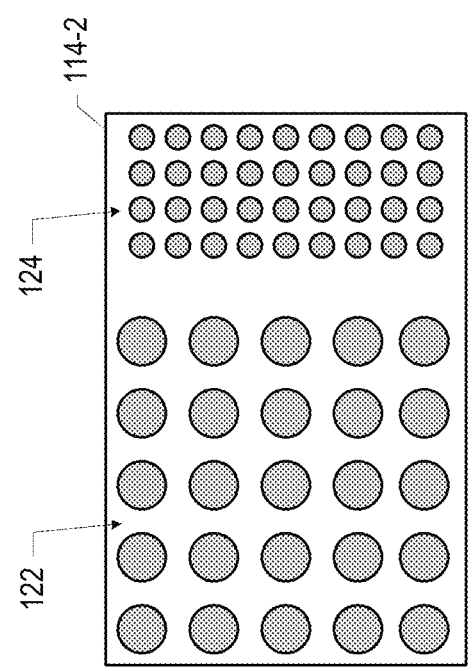
FIG. 2 is a bottom view of a die included in the microelectronic assembly of FIG. 1, in accordance with various embodiments.

The microelectronic assembly 100 of FIG. 1 may also include a die 114-2. The die 114-2 may be electrically and mechanically coupled to the package substrate 102 by DTPS interconnects 150-2, and may be electrically and mechanically coupled to the die 114-1 by die-to-die (DTD) interconnects 130-1. In particular, the top surface of the package substrate 102 may include a set of conductive contacts 146, and the bottom surface of the die 114-2 may include a set of conductive contacts 122; the conductive contacts 122 at the bottom surface of the die 114-1 may be electrically and mechanically coupled to the conductive contacts 146 at the top surface of the package substrate 102 by the DTPS interconnects 150-2. Further, the top surface of the die 114-1 may include a set of conductive contacts 124, and the bottom surface of the die 114-2 may include a set of conductive contacts 124; the conductive contacts 124 at the bottom surface of the die 114-2 may be electrically and mechanically coupled to some of the conductive contacts 124 at the top surface of the die 114-1 by the DTD interconnects 130-1. FIG. 2 is a bottom view of the die 114-2 of the microelectronic assembly 100 of FIG. 1, showing the "coarser" conductive contacts 122 and the "finer" conductive contacts 124. The die 114-2 of the microelectronic assembly 100 may thus be a single-sided die (in the sense that the die 114-2 only has conductive contacts 122/124 on a single surface), and may be a mixed-pitch die (in the sense that the die 114-2 has sets of conductive contacts 122/124 with different pitch). Although FIG. 2 illustrates the conductive contacts 122 and the conductive contacts 124 as each being arranged in a rectangular array, this need not be the case, and the conductive contacts 122 and 124 may be arranged in any suitable pattern (e.g., hexagonal, rectangular, different arrangements between the conductive contacts 122 and 124, etc.). A die 114 that has DTPS interconnects 150 and DTD interconnects 130 at the same surface may be referred to as a mixed pitch die 114; more generally, a die 114 that has interconnects 130 of different pitches at a same surface may be referred to as a mixed pitch die 114.

The die 114-2 may extend over the die 114-1 by an overlap distance 191. In some embodiments, the overlap distance 191 may be between 0.5 millimeters and 5 millimeters (e.g., between 0.75 millimeters and 2 millimeters, or approximately 1 millimeter).

The microelectronic assembly 100 of FIG. 1 may also include a die 114-3. The die 114-3 may be electrically and mechanically coupled to the die 114-1 by DTD interconnects 130-2. In particular, the bottom surface of the die 114-3 may include a set of conductive contacts 124 that are electrically and mechanically coupled to some of the conductive contacts 124 at the top surface of the die 114-1 by the DTD interconnects 130-2. In the embodiment of FIG. 1, the die 114-3 may be a single-sided, single-pitch die; in other embodiments, the die 114-3 may be a double-sided (or "multi-level," or "omni-directional") die, and additional components may be disposed on the top surface of the die 114-3.

As discussed above, in the embodiment of FIG. 1, the die 114-1 may provide high density interconnect routing in a localized area of the microelectronic assembly 100. In some embodiments, the presence of the die 114-1 may support direct chip attach of fine-pitch semiconductor dies (e.g., the dies 114-2 and 114-3) that cannot be attached entirely directly to the package substrate 102. In particular, as discussed above, the die 114-1 may support trace widths and spacings that are not achievable in the package substrate 102. The proliferation of wearable and mobile electronics, as well as Internet of Things (IoT) applications, are driving reductions in the size of electronic systems, but limitations of the PCB manufacturing process and the mechanical consequences of thermal expansion during use have meant that chips having fine interconnect pitch cannot be directly mounted to a PCB. Various embodiments of the microelectronic assemblies 100 disclosed herein may be capable of supporting chips with high-density interconnects and chips with low-density interconnects without sacrificing performance or manufacturability.

The microelectronic assembly 100 of FIG. 1 may also include a die 114-4. The die 114-4 may be electrically and mechanically coupled to the package substrate 102 by DTPS interconnects 150-3. In particular, the bottom surface of the die 114-4 may include a set of conductive contacts 122 that are electrically and mechanically coupled to some of the conductive contacts 146 at the top surface of the package substrate 102 by the DTPS interconnects 150-3. In the embodiment of FIG. 1, the die 114-4 may be a single-sided, single-pitch die; in other embodiments, the die 114-4 may be a double-sided die, and additional components may be disposed on the top surface of the die 114-4. Additional passive components, such as surface-mount resistors, capacitors, and/or inductors, may be disposed on the top surface or the bottom surface of the package substrate 102, or embedded in the package substrate 102.

The microelectronic assembly 100 of FIG. 1 may also include a circuit board 133. The package substrate 102 may be coupled to the circuit board 133 by second-level interconnects 137 at the bottom surface of the package substrate 102. In particular, the package substrate 102 may include conductive contacts 140 at its bottom surface, and the circuit board 133 may include conductive contacts 135 at its top surface; the second-level interconnects 137 may electrically and mechanically couple the conductive contacts 135 and the conductive contacts 140. The second-level interconnects 137 illustrated in FIG. 1 are solder balls (e.g., for a ball grid array arrangement), but any suitable second-level interconnects 137 may be used (e.g., pins in a pin grid array arrangement or lands in a land grid array arrangement). The circuit board 133 may be a motherboard, for example, and may have other components attached to it (not shown). The circuit board 133 may include conductive pathways and other conductive contacts (not shown) for routing power, ground, and signals through the circuit board 133, as known in the art. In some embodiments, the second-level interconnects 137 may not couple the package substrate 102 to a circuit board 133, but may instead couple the package substrate 102 to another IC package, an interposer, or any other suitable component.

The microelectronic assembly 100 of FIG. 1 may also include a mold material 127. The mold material 127 may extend around one or more of the dies 114 on the package substrate 102. In some embodiments, the mold material 127 may extend above one or more of the dies 114 on the package substrate 102. In some embodiments, the mold material 127 may extend between one or more of the dies 114 and the package substrate 102 around the associated DTPS interconnects 150; in such embodiments, the mold material 127 may serve as an underfill material. In some embodiments, the mold material 127 may extend between different ones of the dies 114 around the associated DTD interconnects 130; in such embodiments, the mold material 127 may serve as an underfill material. The mold material 127 may include multiple different mold materials (e.g., an underfill material, and a different overmold material). The mold material 127 may be an insulating material, such as an appropriate epoxy material. In some embodiments, the mold material 127 may include an underfill material that is an epoxy flux that assists with soldering the dies 114-1/114-2 to the package substrate 102 when forming the DTPS interconnects 150-1 and 150-2, and then polymerizes and encapsulates the DTPS interconnects 150-1 and 150-2. The mold material 127 may be selected to have a coefficient of thermal expansion (CTE) that may mitigate or minimize the stress between the dies 114 and the package substrate 102 arising from uneven thermal expansion in the microelectronic assembly 100. In some embodiments, the CTE of the mold material 127 may have a value that is intermediate to the CTE of the package substrate 102 (e.g., the CTE of the dielectric material of the package substrate 102) and a CTE of the dies 114.

The microelectronic assembly 100 of FIG. 1 may also include a thermal interface material (TIM) 129. The TIM 129 may include a thermally conductive material (e.g., metal particles) in a polymer or other binder. The TIM 129 may be a thermal interface material paste or a thermally conductive epoxy (which may be a fluid when applied and may harden upon curing, as known in the art). The TIM 129 may provide a path for heat generated by the dies 114 to readily flow to the heat spreader 131, where it may be spread and/or dissipated. Some embodiments of the microelectronic assembly 100 of FIG. 1 may include a sputtered back side metallization (not shown) across the mold material 127 and the dies 114; the TIM 129 (e.g., a solder TIM) may be disposed on this back side metallization.

The microelectronic assembly 100 of FIG. 1 may also include a heat spreader 131.

The heat spreader 131 may be used to move heat away from the dies 114 (e.g., so that the heat may be more readily dissipated by a heat sink or other thermal management device). The heat spreader 131 may include any suitable thermally conductive material (e.g., metal, appropriate ceramics, etc.), and may include any suitable features (e.g., fins). In some embodiments, the heat spreader 131 may be an integrated heat spreader.

The DTPS interconnects 150 disclosed herein may take any suitable form. In some embodiments, a set of DTPS interconnects 150 may include solder (e.g., solder bumps or balls that are subject to a thermal reflow to form the DTPS interconnects 150). DTPS interconnects 150 that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects 150 may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects 130 disclosed herein may take any suitable form. The DTD interconnects 130 may have a finer pitch than the DTPS interconnects 150 in a microelectronic assembly. In some embodiments, the dies 114 on either side of a set of DTD interconnects 130 may be unpackaged dies, and/or the DTD interconnects 130 may include small conductive bumps or pillars (e.g., copper bumps or pillars) attached to the conductive contacts 124 by solder. The DTD interconnects 130 may have too fine a pitch to couple to the package substrate 102 directly (e.g., too fine to serve as DTPS interconnects 150). In some embodiments, a set of DTD interconnects 130 may include solder. DTD interconnects 130 that include solder may include any appropriate solder material, such as any of the materials discussed above. In some embodiments, a set of DTD interconnects 130 may include an anisotropic conductive material, such as any of the materials discussed above. In some embodiments, the DTD interconnects 130 may be used as data transfer lanes, while the DTPS interconnects 150 may be used for power and ground lines, among others.

In some embodiments, some or all of the DTD interconnects 130 in a microelectronic assembly 100 may be metal-to-metal interconnects (e.g., copper-to-copper interconnects, or plated interconnects). In such embodiments, the conductive contacts 124 on either side of the DTD interconnect 130 may be bonded together (e.g., under elevated pressure and/or temperature) without the use of intervening solder or an anisotropic conductive material. In some embodiments, a thin cap of solder may be used in a metal-to-metal interconnect to accommodate planarity, and this solder may become an intermetallic compound during processing. In some metal-to-metal interconnects that utilize hybrid bonding, a dielectric material (e.g., silicon oxide, silicon nitride, silicon carbide, or an organic layer) may be present between the metals bonded together (e.g., between copper pads or posts that provide the associated conductive contacts 124). In some embodiments, one side of a DTD interconnect 130 may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, some or all of the DTD interconnects 130 in a microelectronic assembly 100 may be solder interconnects that include a solder with a higher melting point than a solder included in some or all of the DTPS interconnects 150. For example, when the DTD interconnects 130 in a microelectronic assembly 100 are formed before the DTPS interconnects 150 are formed (e.g., as discussed below with reference to FIGS. 17A-17F), solder-based DTD interconnects 130 may use a higher-temperature solder (e.g., with a melting point above 200 degrees Celsius), while the DTPS interconnects 150 may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth) or tin, silver, and bismuth. In some embodiments, a lower-temperature solder may include indium, indium and tin, or gallium.

In the microelectronic assemblies 100 disclosed herein, some or all of the DTPS interconnects 150 may have a larger pitch than some or all of the DTD interconnects 130. DTD interconnects 130 may have a smaller pitch than DTPS interconnects 150 due to the greater similarity of materials in the different dies 114 on either side of a set of DTD interconnects 130 than between the die 114 and the package substrate 102 on either side of a set of DTPS interconnects 150. In particular, the differences in the material composition of a die 114 and a package substrate 102 may result in differential expansion and contraction of the die 114 and the package substrate 102 due to heat generated during operation (as well as the heat applied during various manufacturing operations). To mitigate damage caused by this differential expansion and contraction (e.g., cracking, solder bridging, etc.), the DTPS interconnects 150 may be formed larger and farther apart than DTD interconnects 130, which may experience less thermal stress due to the greater material similarity of the pair of dies 114 on either side of the DTD interconnects. In some embodiments, the DTPS interconnects 150 disclosed herein may have a pitch between 80 microns and 300 microns, while the DTD interconnects 130 disclosed herein may have a pitch between 7 microns and 100 microns.

The elements of the microelectronic assembly 100 may have any suitable dimensions. Only a subset of the accompanying figures are labeled with reference numerals representing dimensions, but this is simply for clarity of illustration, and any of the microelectronic assemblies 100 disclosed herein may have components having the dimensions discussed herein For example, in some embodiments, the thickness 164 of the package substrate 102 may be between 0.1 millimeters and 1.4 millimeters (e.g., between 0.1 millimeters and 0.35 millimeters, between 0.25 millimeters and 0.8 millimeters, or approximately 1 millimeter). In some embodiments, the recess 108 may have a depth 175 between 10 microns and 200 microns (e.g., between 10 microns and 30 microns, between 30 microns and 100 microns, between 60 microns and 80 microns, or approximately 75 microns). In some embodiments, the depth 175 may be equal to a certain number of layers of the dielectric material in the package substrate 102. For example, the depth 175 may be approximately equal to between one and five layers of the dielectric material in the package substrate 102 (e.g., two or three layers of the dielectric material). In some embodiments, the depth 175 may be equal to the thickness of a solder resist material (not shown) on the top surface of the package substrate 102.

In some embodiments, the distance 179 between the bottom surface of the die 114-1 and the proximate top surface of the package substrate 102 (at the bottom of the recess 108) may be less than the distance 177 between the bottom surface of the die 114-2 and the proximate top surface of the package substrate 102. In some embodiments, the distance 179 may be approximately the same as the distance 177. In some embodiments, the distance 177 between the bottom surface of the die 114-2 and the proximate top surface of the package substrate 102 may be greater than the distance 193 between the bottom surface of the die 114-2 and the proximate top surface of the die 114-1. In other embodiments, the distance 177 may be less than or equal to the distance 193.

Figure 3:
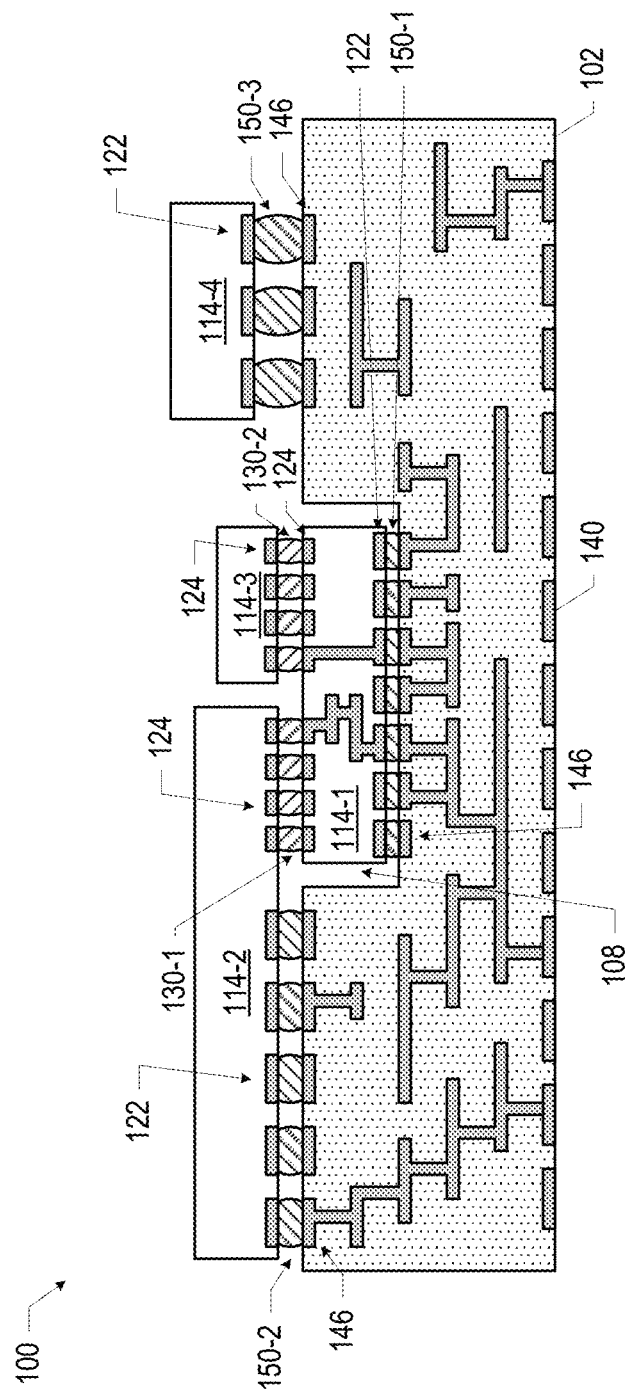
FIGS. 3-11 are side, cross-sectional views of example microelectronic assemblies, in accordance with various embodiments.

In some embodiments, the top surface of the die 114-1 may extend higher than the top surface of the package substrate 102, as illustrated in FIG. 1. In other embodiments, the top surface of the die 114-1 may be substantially coplanar with the top surface of the package substrate 102, or may be recessed below the top surface of the package substrate 102. FIG. 3 illustrates an example of the former embodiment. Although various ones of the figures illustrate microelectronic assemblies 100 having a single recess 108 in the package substrate 102, the thickness of 102 may include multiple recesses 108 (e.g., having the same or different dimensions, and each having a die 114 disposed therein), or no recesses 108. Examples of the former embodiments are discussed below with reference to FIGS. 7-8, and examples of the latter embodiments are discussed below with reference to FIGS. 9-11. In some embodiments, a recess 108 may be located at the bottom surface of the package substrate 102 (e.g., proximate to the conductive contacts 140), instead of or in addition to a recess 108 at the top surface of the package substrate 102.

Figure 4:
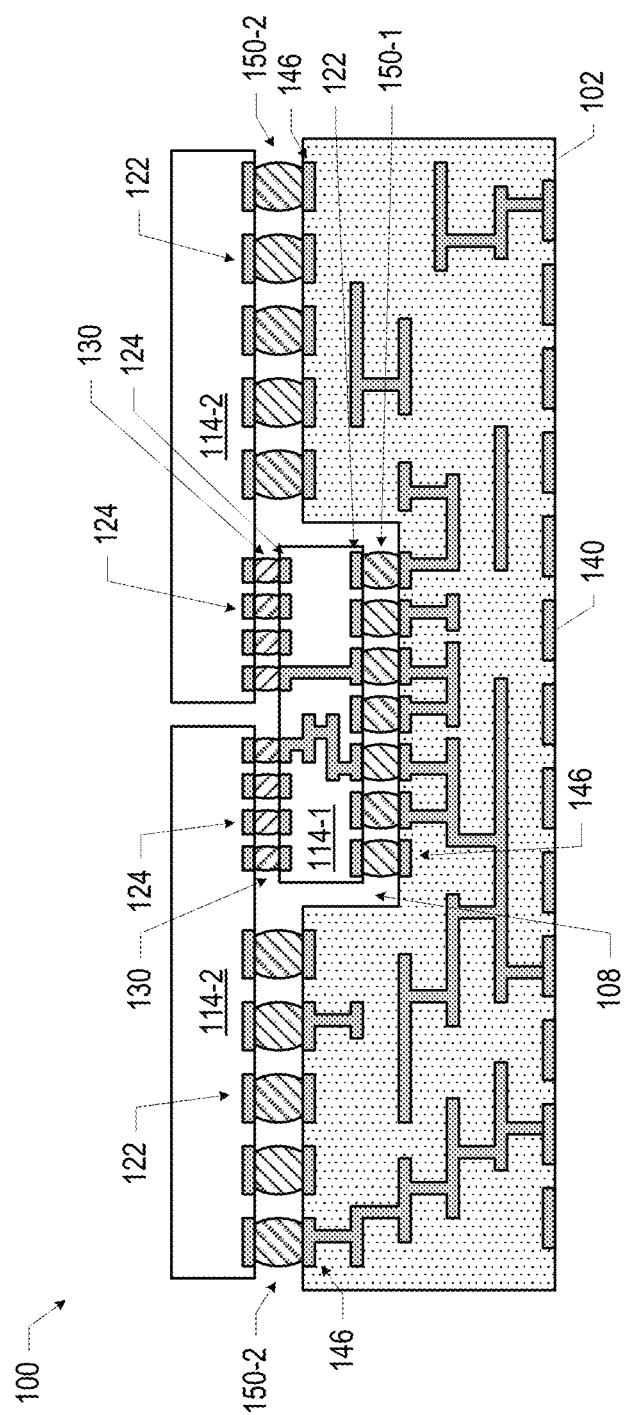

In the embodiment of FIG. 1, a single die 114-2 is illustrated as "spanning" the package substrate 102 and the die 114-1. In some embodiments of the microelectronic assemblies 100 disclosed herein, multiple dies 114 may span the package substrate 102 and another die 114. For example, FIG. 4 illustrates an embodiment in which two dies 114-2 each have conductive contacts 122 and conductive contacts 124 disposed at the bottom surfaces; the conductive contacts 122 of the dies 114-2 are coupled to conductive contacts 146 at the top surface of the package substrate 102 via DTPS interconnects 150-2, and the conductive contacts 124 of the dies 114-2 are coupled to conductive contacts 124 at the top surface of the die 114 via DTD interconnects 130. In some embodiments, power and/or ground signals may be provided directly to the dies 114 of the microelectronic assembly 100 of FIG. 4 through the package substrate 102, and the die 114-1 may, among other things, route signals between the dies 114-2.

Figure 5:
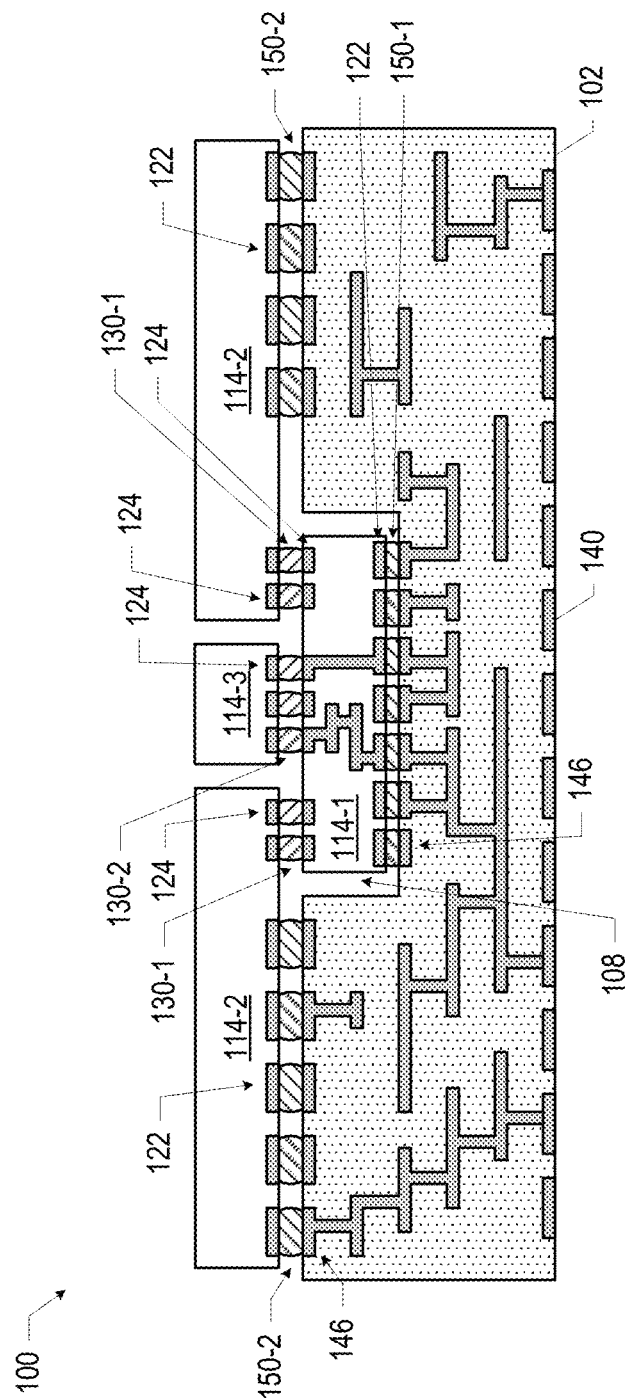

In some embodiments, the die 114-1 may be arranged as a bridge between multiple other dies 114, and may also have additional dies 114 disposed thereon. For example, FIG. 5 illustrates an embodiment in which two dies 114-2 each have conductive contacts 122 and conductive contacts 124 disposed at the bottom surfaces; the conductive contacts 122 of the dies 114-2 are coupled to conductive contacts 146 at the top surface of the package substrate 102 via DTPS interconnects 150-2, and the conductive contacts 124 of the dies 114-2 are coupled to conductive contacts 124 at the top surface of the die 114 via DTD interconnects 130 (e.g., as discussed above with reference to FIG. 4). Additionally, a die 114-3 (or multiple dies 114-3, not shown) is coupled to the die 114-1 by conductive contacts 124 on proximate surfaces of these dies 114 and intervening DTD interconnects 130-2 (e.g., as discussed above with reference to FIG. 1).

Figure 6:
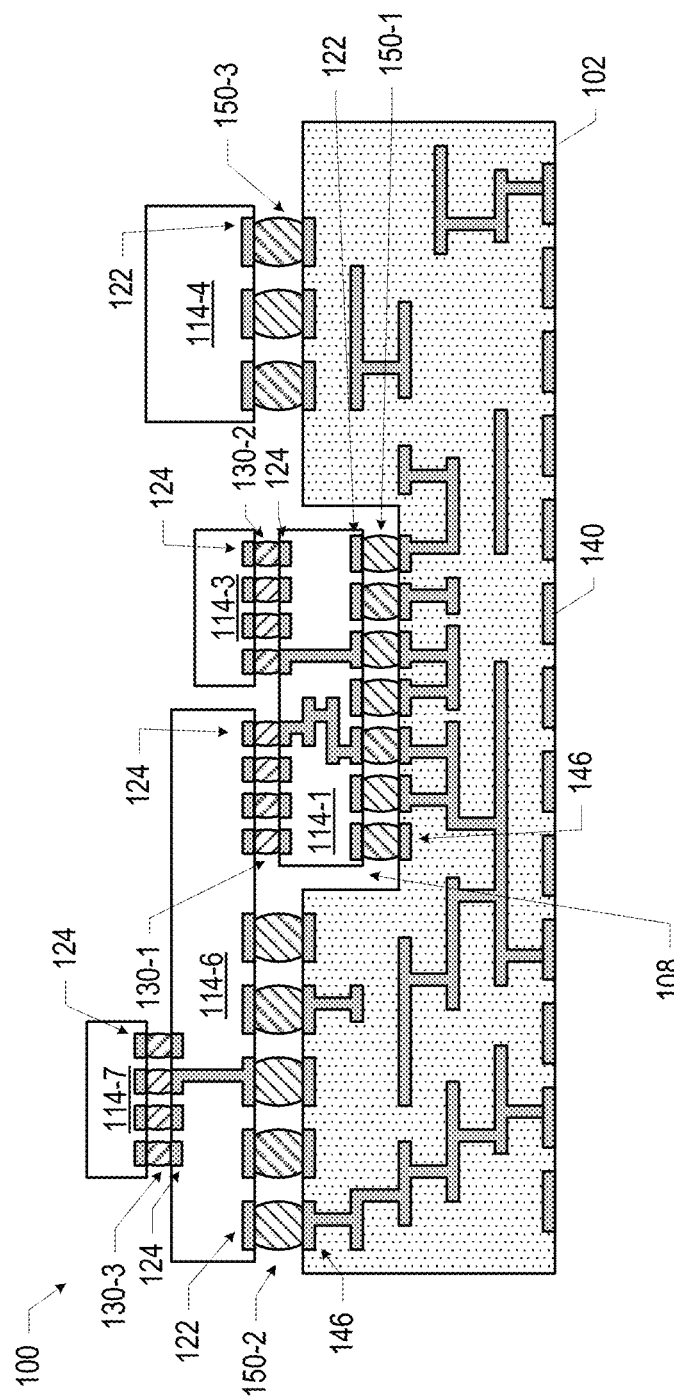

As noted above, any suitable number of the dies 114 in a microelectronic assembly 100 may be double-sided dies 114. For example, FIG. 6 illustrates a microelectronic assembly 100 sharing a number of elements with FIG. 1, but including a double-sided die 114-6. The die 114-6 includes conductive contacts 122 and 124 at its bottom surface; the conductive contacts 122 at the bottom surface of the die 114-6 are coupled to conductive contacts 146 at the top surface of the package substrate 102 via DTPS interconnects 150-2, and the conductive contacts 124 at the bottom surface of the die 114-6 are coupled to conductive contacts 124 at the top surface of the die 114-1 via DTD interconnects 130-1. The die 114-6 also includes conductive contacts 124 at its top surface; these conductive contacts 124 are coupled to conductive contacts 124 at the bottom surface of a die 114-7 by DTD interconnects 130-3.

Figure 7:
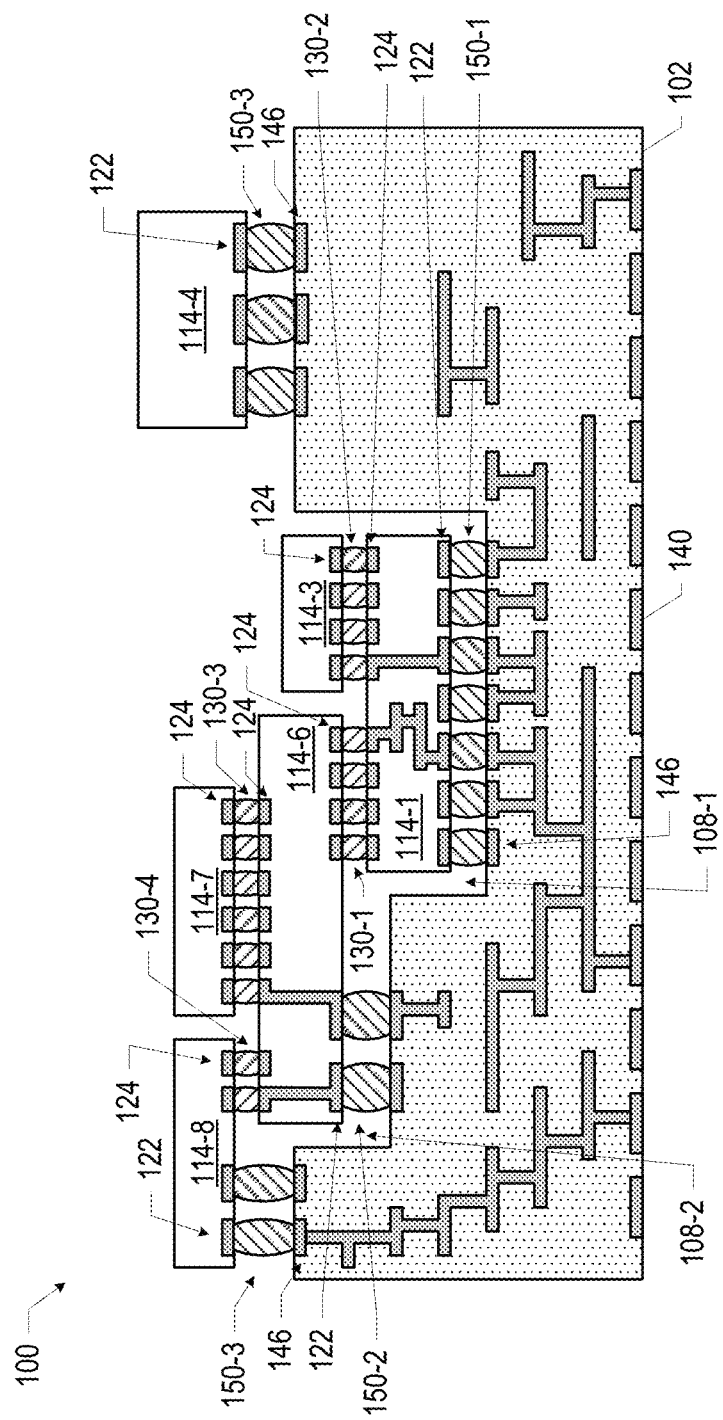

As noted above, a package substrate 102 may include one or more recesses 108 in which dies 114 are at least partially disposed. For example, FIG. 7 illustrates a microelectronic assembly 100 including a package substrate 102 having two recesses: a recess 108-1 and a recess 108-2. In the embodiment of FIG. 7, the recess 108-1 is nested in the recess 108-2, but in other embodiments, multiple recesses 108 need not be nested. In FIG. 7, the die 114-1 is at least partially disposed in the recess 108-1, and the dies 114-6 and 114-3 are at least partially disposed in the recess 108-2. In the embodiment of FIG. 7, like the embodiment of FIG. 6, the die 114-6 includes conductive contacts 122 and 124 at its bottom surface; the conductive contacts 122 at the bottom surface of the die 114-6 are coupled to conductive contacts 146 at the top surface of the package substrate 102 via DTPS interconnects 150-2, and the conductive contacts 124 at the bottom surface of the die 114-6 are coupled to conductive contacts 124 at the top surface of the die 114-1 via DTD interconnects 130-1. The die 114-6 also includes conductive contacts 124 at its top surface; these conductive contacts 124 are coupled to conductive contacts 124 at the bottom surface of a die 114-7 by DTD interconnects 130-3. Further, the microelectronic assembly 100 of FIG. 7 includes a die 114-8 that spans the package substrate 102 and the die 114-6. In particular, the die 114-8 includes conductive contacts 122 and 124 at its bottom surface; the conductive contacts 122 at the bottom surface of the die 114-8 are coupled to conductive contacts 146 at the top surface of the package substrate 102 via DTPS interconnects 150-3, and the conductive contacts 124 at the bottom surface of the die 114-8 are coupled to conductive contacts 124 at the top surface of the die 114-6 via DTD interconnects 130-4.

Figure 8:
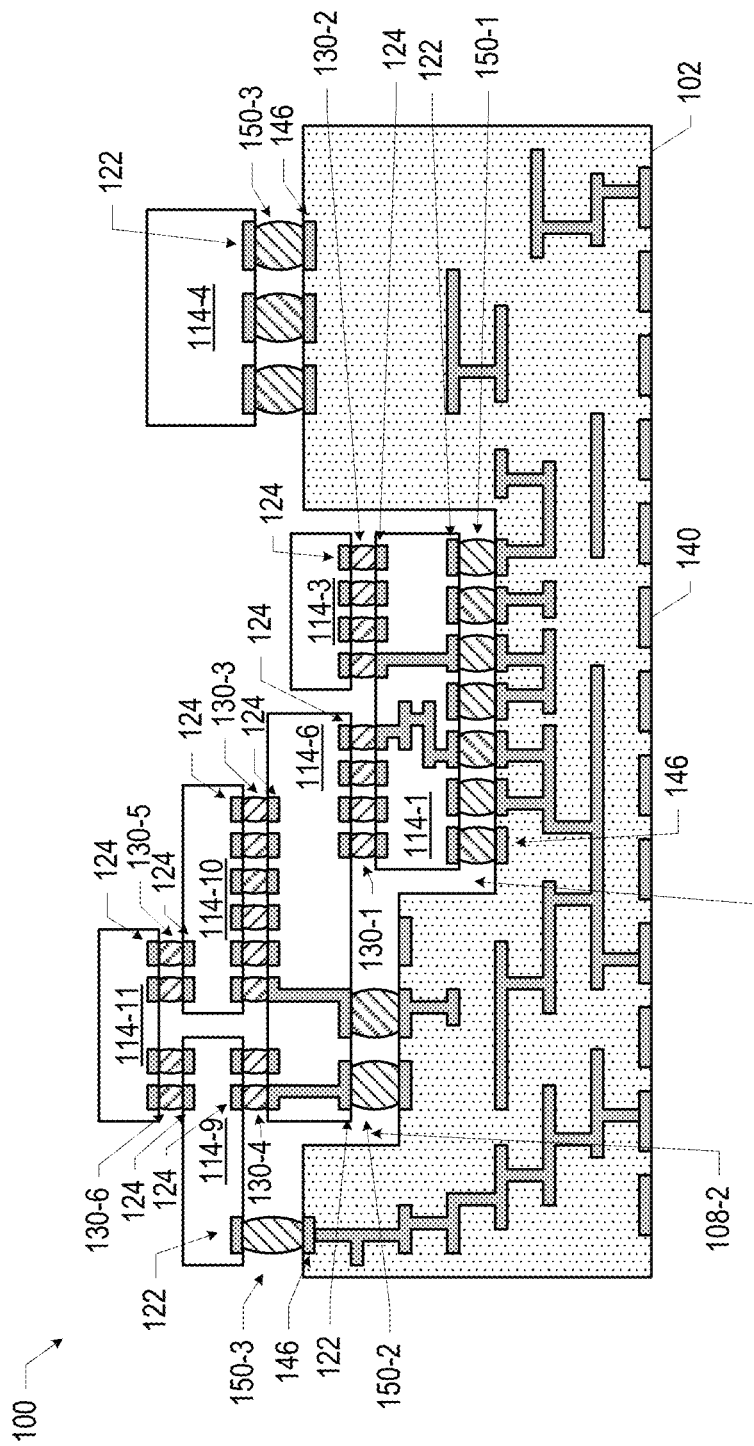

In various ones of the microelectronic assemblies 100 disclosed herein, a single die 114 may bridge to other dies 114 from "below" (e.g., as discussed above with reference to FIGS. 4 and 5) or from "above." For example, FIG. 8 illustrates a microelectronic assembly 100 similar to the microelectronic assembly 100 of FIG. 7, but including 2 double-sided dies 114-9 and 114-10, as well as an additional die 114-11. The die 114-9 includes conductive contacts 122 and 124 at its bottom surface; the conductive contacts 122 at the bottom surface of the die 114-9 are coupled to conductive contacts 146 at the top surface of the package substrate 102 via DTPS interconnects 150-3, and the conductive contacts 124 at the bottom surface of the die 114-9 are coupled to conductive contacts 124 at the top surface of the die 114-6 via DTD interconnects 130-4. The die 114-6 includes conductive contacts 124 at its top surface; these conductive contacts 124 are coupled to conductive contacts 124 at the bottom surface of a die 114-10 by DTD interconnects 130-3. Further, the die 114-11 includes conductive contacts 124 at its bottom surface; some of these conductive contacts 124 are coupled to conductive contacts 124 at the top surface of the die 114-9 by DTD interconnects 130-6, and some of these conductive contacts 124 are coupled to conductive contacts 124 at the top surface of the die 114-10 by DTD interconnects 130-5. The die 114-11 may thus bridge the dies 114-9 and 114-10.

Figure 9:
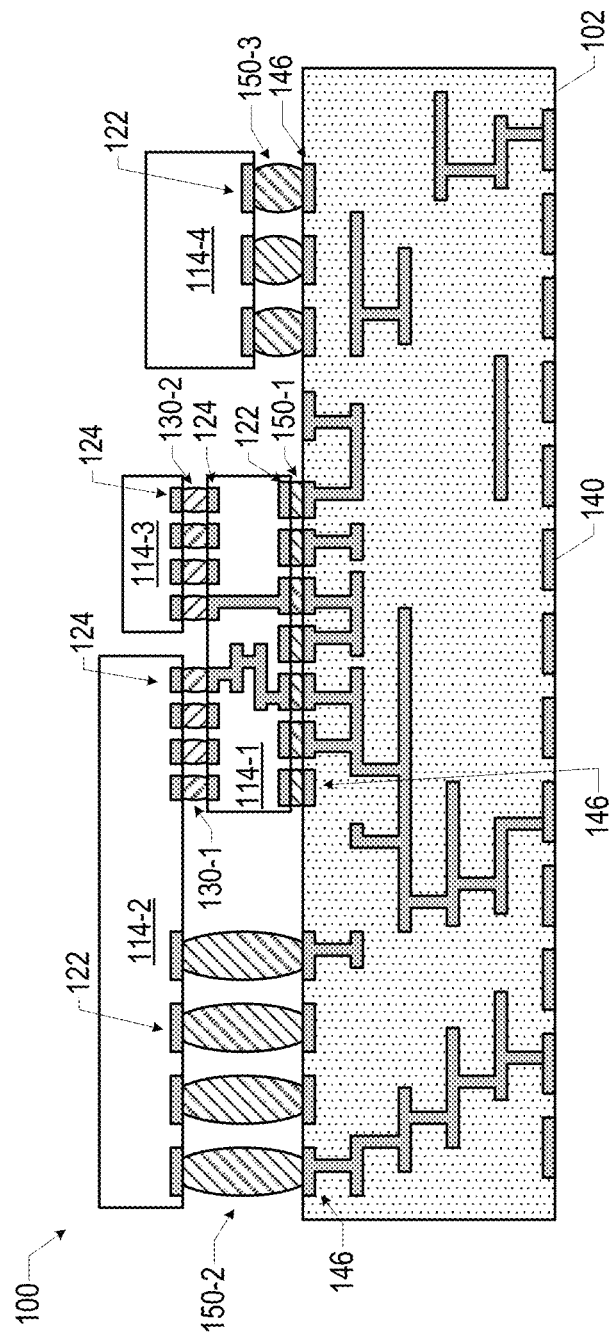
Figure 10:
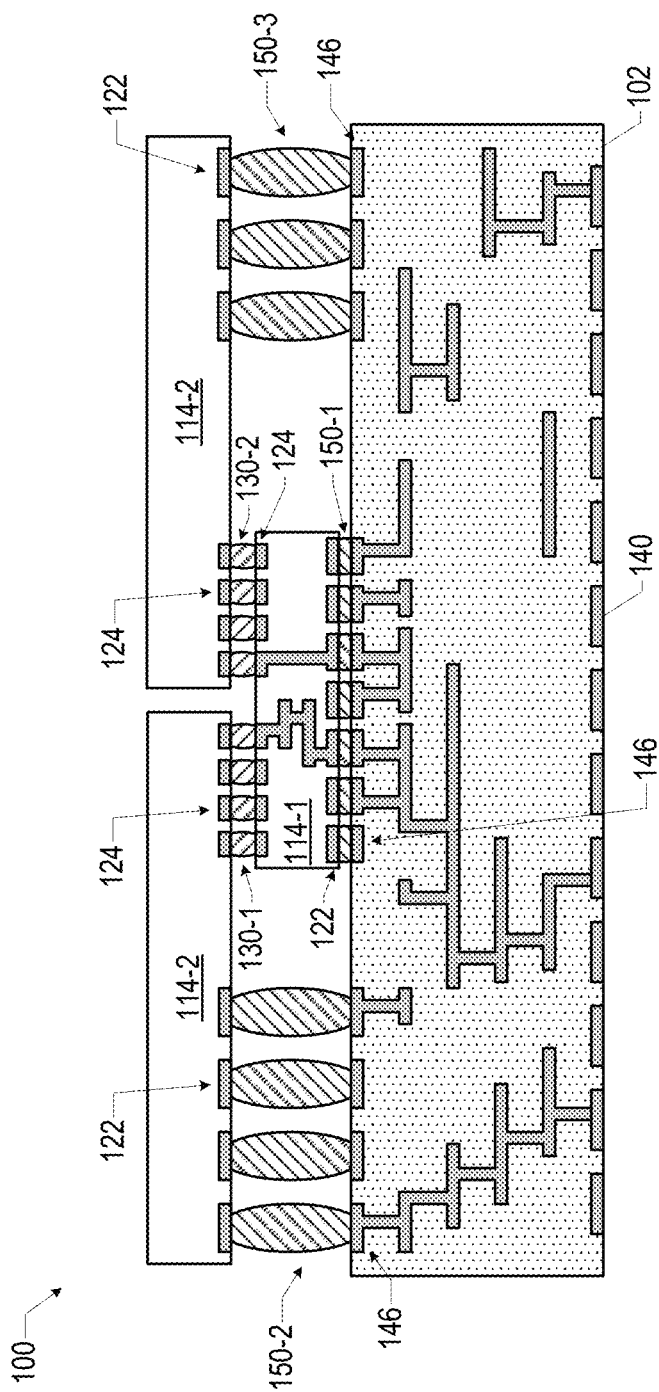

As noted above, in some embodiments, the package substrate 102 may not include any recesses 108. For example, FIG. 9 illustrates an embodiment having dies 114 and a package substrate 102 mutually interconnected in the manner discussed above with reference to FIG. 1, but in which the die 114-1 is not disposed in a recess in the package substrate 102. Instead, the dies 114 are disposed above a planar portion of the top surface of the package substrate 102. Any suitable ones of the embodiments disclosed herein that include recesses 108 may have counterpart embodiments that do not include a recess 108. For example, FIG. 10 illustrates a microelectronic assembly 100 having dies 114 and a package substrate 102 mutually interconnected in the manner discussed above with reference to FIG. 4, but in which the die 114-1 is not disposed in a recess in the package substrate 102.

Figure 11:
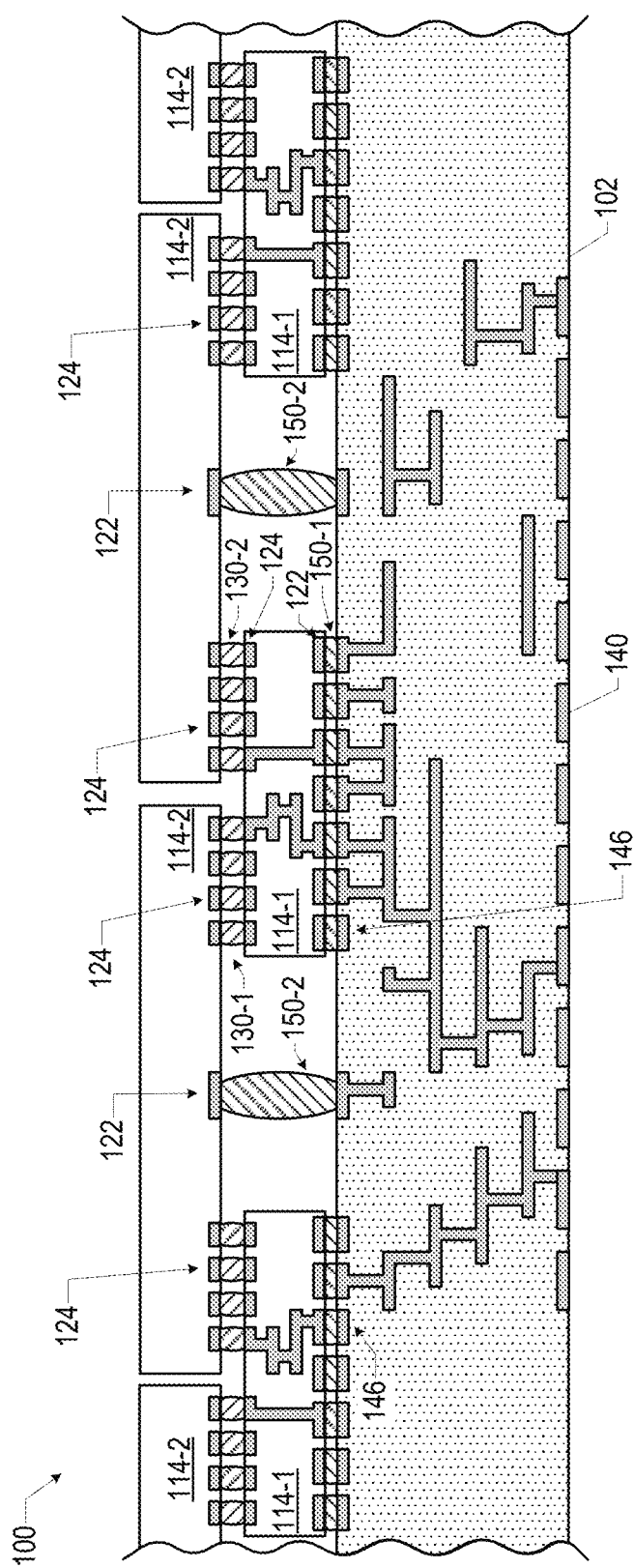

Any of the arrangements of dies 114 illustrated in any of the accompanying figures may be part of a repeating pattern in a microelectronic assembly 100. For example, FIG. 11 illustrates a portion of a microelectronic assembly 100 in which an arrangement like the one of FIG. 10 is repeated, with multiple dies 114-1 and multiple dies 114-2. The dies 114-1 may bridge the adjacent dies 114-2. More generally, the microelectronic assemblies 100 disclosed herein may include any suitable arrangement of dies 114. FIGS. 12-16 are top views of example arrangements of multiple dies 114 in various microelectronic assemblies 100, in accordance with various embodiments. The package substrate 102 is omitted from FIGS. 12-16; some or all of the dies 114 in these arrangements may be at least partially disposed in a recess 108 in a package substrate 102, or may not be disposed in a recess of a package substrate 102. In the arrangements of FIGS. 12-16, the different dies 114 may include any suitable circuitry. For example, in some embodiments, the die 114A may be an active or passive die, and the dies 114B may include input/output circuitry, high bandwidth memory, and/or enhanced dynamic random access memory (EDRAM). The arrays of FIGS. 12-16 are largely rectangular, but dies 114 may be positioned in any suitable arrangement (e.g., a non-rectangular array, such as a triangular array, a hexagonal array, etc.). Further, although dies 114 having rectangular footprints are illustrated herein, the dies 114 may have any desired footprints (e.g., triangular, hexagonal, etc.), and such dies 114 may be arranged in any desired array (e.g., triangular, hexagonal, etc.).

FIG. 12 illustrates an arrangement in which a die 114A is disposed below multiple different dies 114B. The die 114A may be connected to a package substrate 102 (not shown) in any of the manners disclosed herein with reference to the die 114-1, while the dies 114B may span the package substrate 102 and the die 114A (e.g., in any of the manners disclosed herein with reference to the die 114-2). FIG. 12 also illustrates a die 114C disposed on the die 114A (e.g., in the manner disclosed herein with reference to the die 114-3). In FIG. 12, the dies 114B "overlap" the edges and/or the corners of the die 114A, while the die 114C is wholly above the die 114A. Placing dies 114B at least partially over the corners of the die 114A may reduce routing congestion in the die 114A and may improve utilization of the die 114A (e.g., in case the number of input/outputs needed between the die 114A and the dies 114B is not large enough to require the full edge of the die 114A). In some embodiments, the die 114A may be disposed in a recess 108 in a package substrate 102. In some embodiments, the die 114A may be disposed in a recess 108 in a package substrate 102, and the dies 114B may be disposed in one or more recesses 108 in the package substrate 102. In some embodiments, none of the dies 114A or 114B may be disposed in recesses 108.

FIG. 13 illustrates an arrangement in which a die 114A is disposed below multiple different dies 114B. The die 114A may be connected to a package substrate 102 (not shown) in any of the manners disclosed herein with reference to the die 114-1, while the dies 114B may span the package substrate 102 and the die 114A (e.g., in any of the manners disclosed herein with reference to the die 114-2). FIG. 13 also illustrates dies 114C disposed on the die 114A (e.g., in the manner disclosed herein with reference to the die 114-3). In FIG. 13, the dies 114B "overlap" the edges of the die 114A, while the dies 114C are wholly above the die 114A. In some embodiments, the die 114A may be disposed in a recess 108 in a package substrate 102. In some embodiments, the die 114A may be disposed in a recess 108 in a package substrate 102, and the dies 114B may be disposed in one or more recesses 108 in the package substrate 102. In some embodiments, none of the dies 114A or 114B may be disposed in recesses 108. In the embodiment of FIG. 13, the dies 114B and 114C may be arranged in a portion of a rectangular array. In some embodiments, two dies 114A may take the place of the single die 114A illustrated in FIG. 13, and one or more dies 114C may "bridge" the two dies 114A (e.g., in the manner discussed below with reference to FIG. 15).

FIG. 14 illustrates an arrangement in which a die 114A is disposed below multiple different dies 114B. The die 114A may be connected to a package substrate 102 (not shown) in any of the manners disclosed herein with reference to the die 114-1, while the dies 114B may span the package substrate 102 and the die 114A (e.g., in any of the manners disclosed herein with reference to the die 114-2). In FIG. 14, the dies 114B "overlap" the edges and/or the corners of the die 114A. In some embodiments, the die 114A may be disposed in a recess 108 in a package substrate 102. In some embodiments, the die 114A may be disposed in a recess 108 in a package substrate 102, and the dies 114B may be disposed in one or more recesses 108 in the package substrate 102. In some embodiments, none of the dies 114A or 114B may be disposed in recesses 108. In the embodiment of FIG. 14, the dies 114B may be arranged in a portion of a rectangular array.

FIG. 15 illustrates an arrangement in which multiple dies 114A are disposed below multiple different dies 114B such that each die 114A bridges two or more horizontally or vertically adjacent dies 114B. The dies 114A may be connected to a package substrate 102 (not shown) in any of the manners disclosed herein with reference to the die 114-1, while the dies 114B may span the package substrate 102 and the die 114A (e.g., in any of the manners disclosed herein with reference to the die 114-2). In FIG. 12, the dies 114B "overlap" the edges of the adjacent dies 114A. In some embodiments, the dies 114A may be disposed in one or more recesses 108 in a package substrate 102. In some embodiments, the dies 114A may be disposed in one or more recesses 108 in a package substrate 102, and the dies 114B may be disposed in one or more recesses 108 in the package substrate 102. In some embodiments, none of the dies 114A or 114B may be disposed in recesses 108. In FIG. 15, the dies 114A and the dies 114B may be arranged in rectangular arrays.

FIG. 16 illustrates an arrangement in which multiple dies 114A are disposed below multiple different dies 114B such that each die 114A bridges the four diagonally adjacent dies 114B. The dies 114A may be connected to a package substrate 102 (not shown) in any of the manners disclosed herein with reference to the die 114-1, while the dies 114B may span the package substrate 102 and the die 114A (e.g., in any of the manners disclosed herein with reference to the die 114-2). In FIG. 12, the dies 114B "overlap" the corners of the adjacent dies 114A. In some embodiments, the dies 114A may be disposed in one or more recesses 108 in a package substrate 102. In some embodiments, the dies 114A may be disposed in one or more recesses 108 in a package substrate 102, and the dies 114B may be disposed in one or more recesses 108 in the package substrate 102. In some embodiments, none of the dies 114A or 114B may be disposed in recesses 108. In FIG. 16, the dies 114A and the dies 114B may be arranged in rectangular arrays.

Any suitable techniques may be used to manufacture the microelectronic assemblies disclosed herein. For example, FIGS. 17A-17F are side, cross-sectional views of various stages in an example process for manufacturing the microelectronic assembly 100 of FIG. 5, in accordance with various embodiments. Although the operations discussed below with reference to FIGS. 17A-17F (and others of the accompanying drawings representing manufacturing processes) are illustrated in a particular order, these operations may be performed in any suitable order. Additionally, although particular assemblies are illustrated in FIGS. 17A-17F (and others of the accompanying drawings representing manufacturing processes), the operations discussed below with reference to FIGS. 17A-17F may be used to form any suitable assemblies. In some embodiments, microelectronic assemblies 100 manufactured in accordance with the process of FIGS. 17A-17F (e.g., any of the microelectronic assemblies 100 of FIGS. 1-11) may have DTPS interconnects 150-1 that are solder interconnects, and DTD interconnects 130-1 and 130-2 that are non-solder interconnects (e.g., metal-to-metal interconnects or anisotropic conductive material interconnects). In the embodiment of FIGS. 17A-17F, the dies 114 may first be assembled into a "composite die," and then the composite die may be coupled to the package substrate 102. This approach may allow for tighter tolerances in the formation of the DTD interconnects 130, and may be particularly desirable for relatively small dies 114.

FIG. 17A illustrates an assembly 300 including a carrier 202 on which the dies 114-2 and 114-3 are disposed. The dies 114-2 and 114-3 are "upside down" on the carrier 202, in the sense that the conductive contacts 122 and 124 of the dies 114 are facing away from the carrier 202, and the conductive contacts 124 of the die 114-3 are facing away from the carrier 202. The dies 114-2 and 114-3 may be secured to the carrier using any suitable technique, such as a removable adhesive. The carrier 202 may include any suitable material for providing mechanical stability during subsequent manufacturing operations.

FIG. 17B illustrates an assembly 302 subsequent to coupling the die 114-1 to the dies 114-2 and 114-3. In particular, the die 114-1 may be arranged "upside down" in the assembly 302 such that the conductive contacts 124 of the die 114-1 may be coupled to the conductive contacts 124 of the dies 114-2 (via DTD interconnects 130-1) and to the conductive contacts 124 of the die 114-3 (via DTD interconnects 130-2). Any suitable technique may be used to form the DTD interconnects 130 of the assembly 302, such as metal-to-metal attachment techniques, solder techniques, or anisotropic conductive material techniques.

Figure 17C:
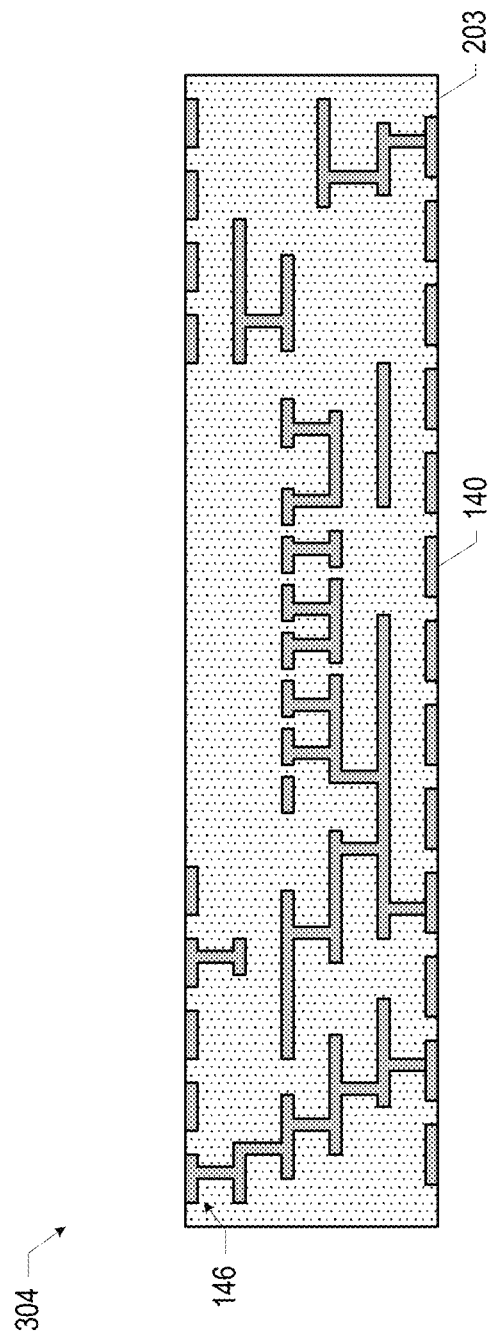

FIG. 17C illustrates an assembly 304 including a package substrate 203. The package substrate 203 may be structurally similar to the package substrate 102 of FIG. 5, but may not include the recess 108 of the package substrate 102. In some embodiments, the package substrate 203 may be manufactured using standard PCB manufacturing processes, and thus the package substrate 203 may take the form of a PCB, as discussed above. In some embodiments, the package substrate 203 may be a set of redistribution layers formed on a panel carrier (not shown) by laminating or spinning on a dielectric material, and creating conductive vias and lines by laser drilling and plating. Any method known in the art for fabrication of the package substrate 203 may be used, and for the sake of brevity, such methods will not be discussed in further detail herein.

Figure 17D:
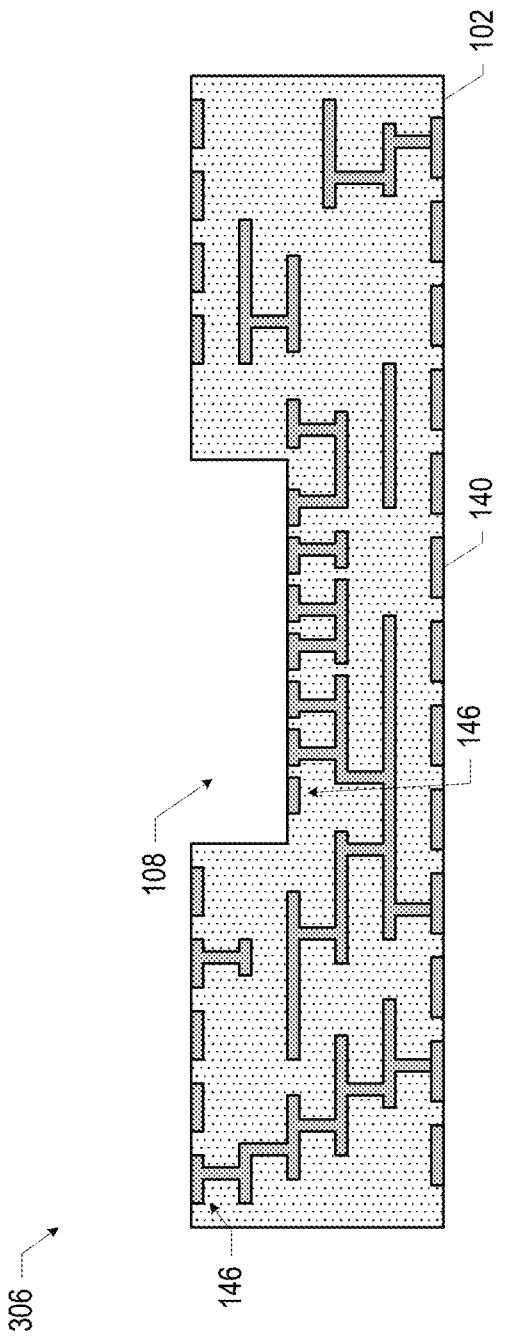

FIG. 17D illustrates an assembly 306 subsequent to forming a recess 108 in the package substrate 203 (FIG. 17C) to form the package substrate 102. The recess 108 may have a bottom surface at which conductive contacts 146 are exposed. Any suitable technique may be used to form the recess 108. For example, in some embodiments, the recess 108 may be laser-drilled down to a planar metal stop in the package substrate 203 (not shown); once the metal stop is reached, the metal stop may be removed to expose the conductive contacts 146 at the bottom of the recess 108. In some embodiments, the recess 108 may be formed by a mechanical drill.

Figure 17E:
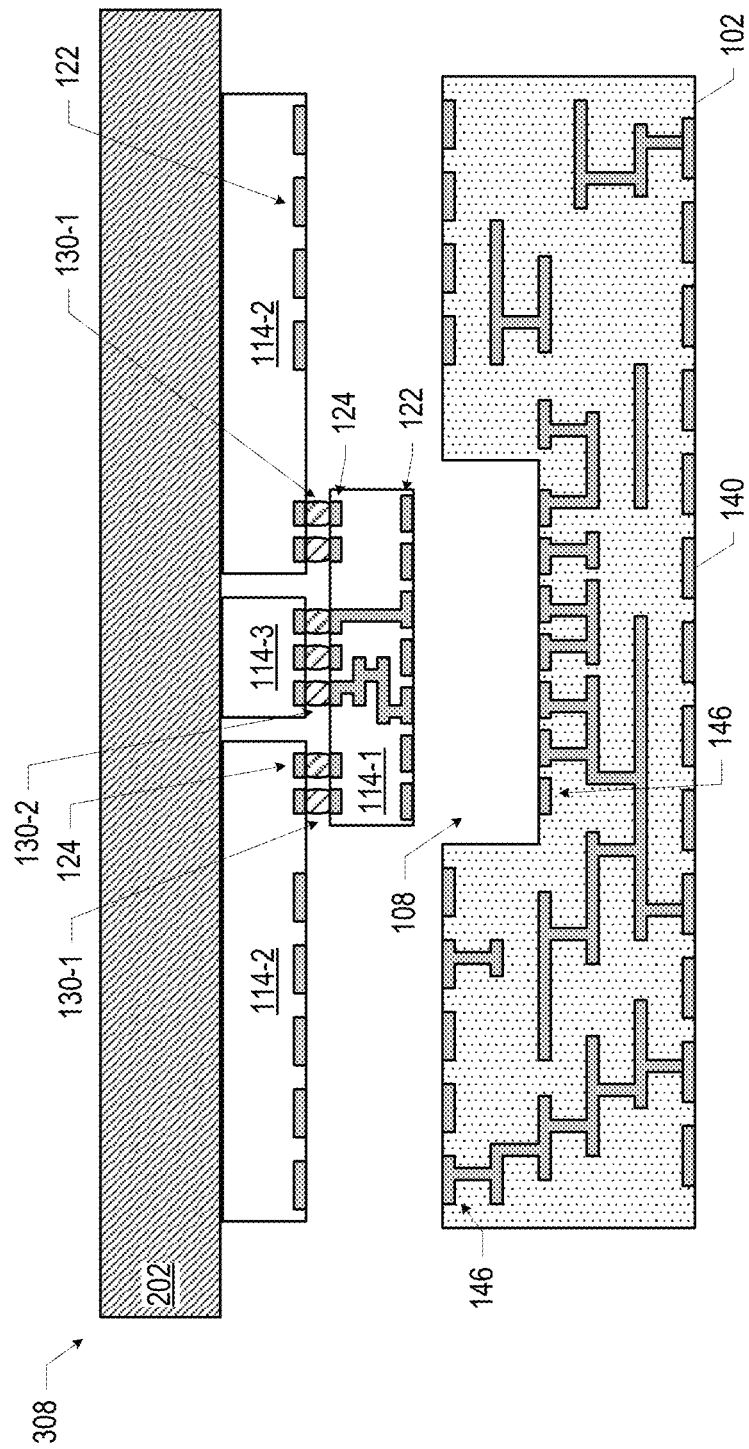

FIG. 17E illustrates an assembly 308 subsequent to "flipping" the assembly 302 (FIG. 17B) and bringing the dies 114-1 and 114-2 into alignment with the package substrate 102 (FIG. 17D) so that the conductive contacts 122 on the dies 114-1 and 114-2 are aligned with their respective conductive contacts 146 on the top surface of the package substrate 102.

Figure 17F:
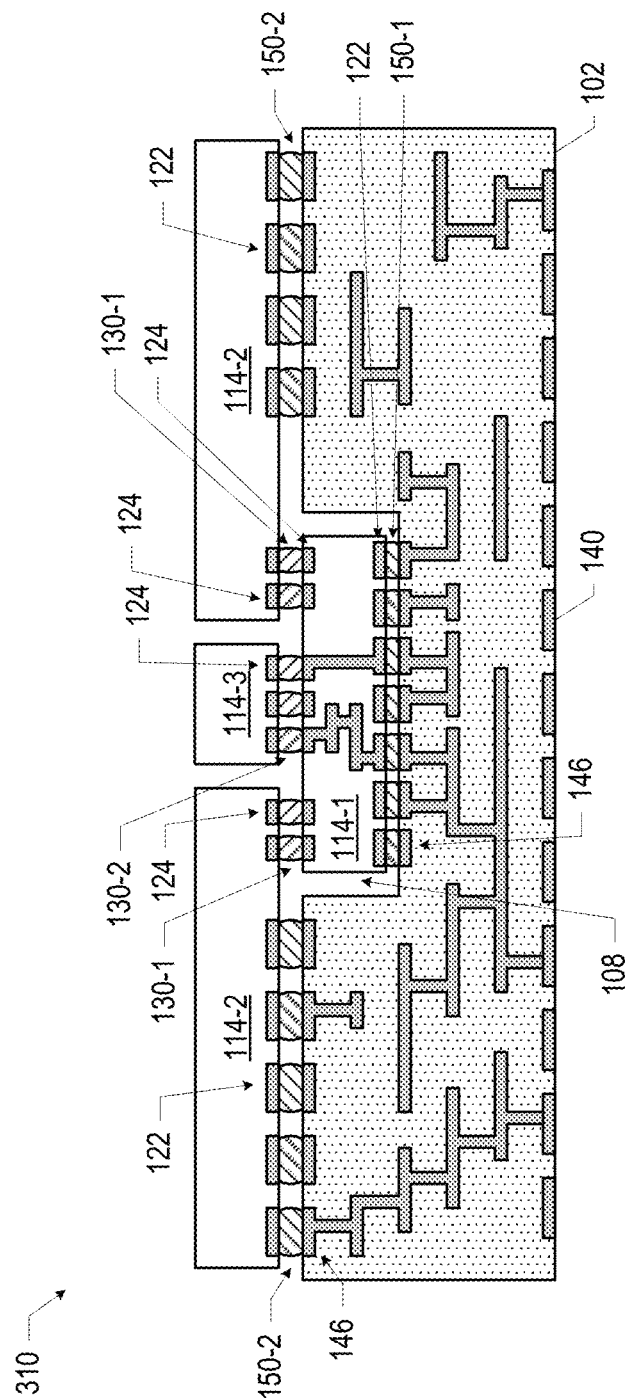

FIG. 17F illustrates an assembly 310 subsequent to forming DTPS interconnects 150 between the dies 114-1/114-2 and the package substrate 102 of the assembly 308 (FIG. 17E), then removing the carrier. The DTPS interconnects 150 may take any of the forms disclosed herein (e.g., solder interconnects, or anisotropic conductive material interconnects), and any suitable techniques may be used to form the DTPS interconnects 150 (e.g., a mass reflow process or a thermal compression bonding process). The assembly 310 may take the form of the microelectronic assembly 100 of FIG. 5. Further operations may be performed as suitable (e.g., providing a mold material 127, providing a TIM 129, providing a heat spreader 131, attaching additional dies 114 to the package substrate 102, etc.).

Figure 18A:
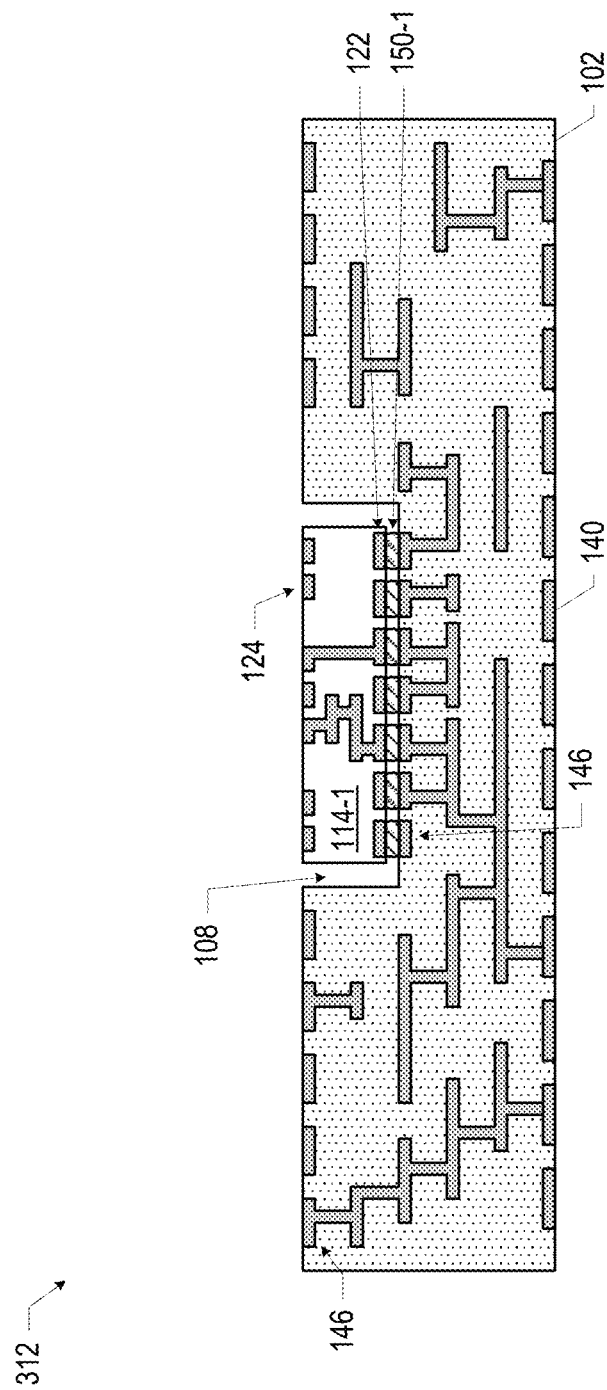
FIGS. 18A-18B are side, cross-sectional views of various stages in another example process for manufacturing the microelectronic assembly of FIG. 5, in accordance with various embodiments.
Figure 18B:
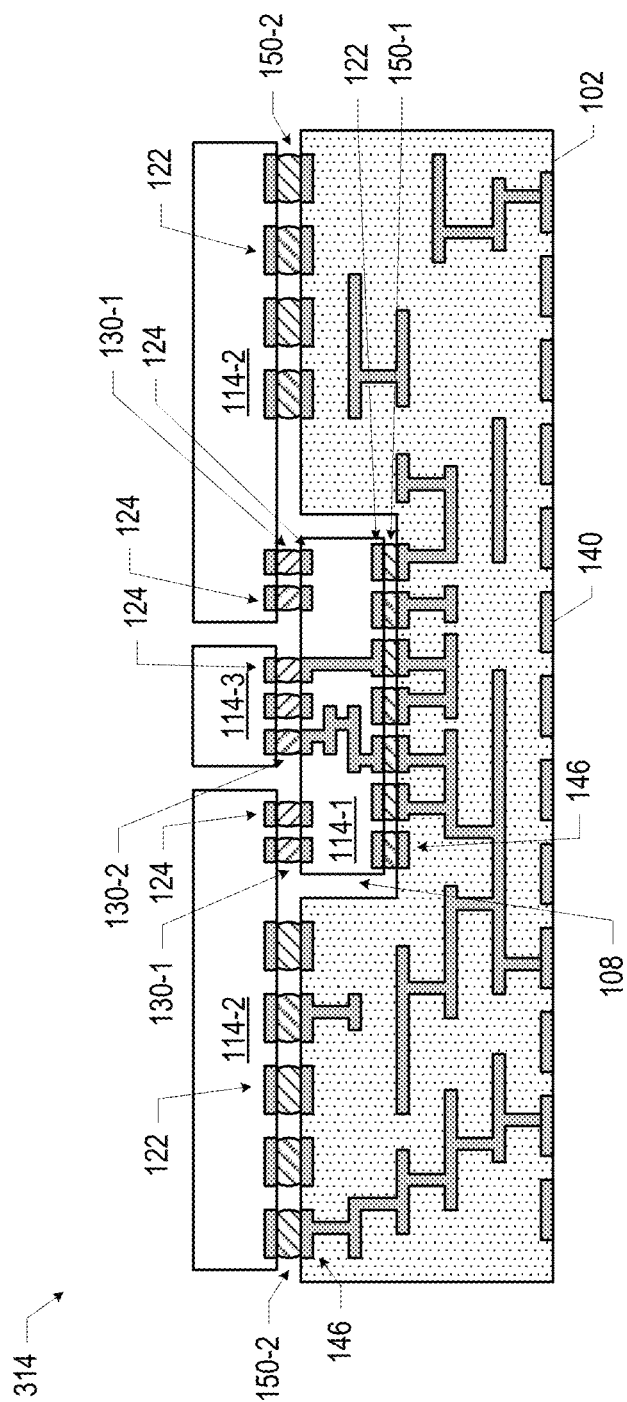

FIGS. 18A-18B are side, cross-sectional views of various stages in another example process for manufacturing the microelectronic assembly 100 of FIG. 5, in accordance with various embodiments. In some embodiments, microelectronic assemblies 100 manufactured in accordance with the process of FIGS. 18A-18B (e.g., any of the microelectronic assemblies 100 of FIGS. 1-11) may have DTPS interconnects 150-1 that are solder interconnects, and DTD interconnects 130-1 and 130-2 that are also solder interconnects. In the embodiment of FIGS. 18A-18B, the die 114-1 may be coupled to the package substrate 102, and then the remaining dies 114 may be attached. This approach may accommodate the tolerance and warpage of the package substrate 102, and may be particularly desirable for relatively larger dies 114. The process of FIGS. 17A-17F may advantageously be more compatible with non-solder DTD interconnects 130, while the process of FIGS. 18A-18B may advantageously involve simpler handling of the dies 114.

FIG. 18A illustrates an assembly 312 subsequent to coupling the die 114-1 to the package substrate 102. In particular, the die 114-1 may be positioned in the recess 108, and conductive contacts 122 at the bottom surface of the die 114-1 may be coupled to conductive contacts 146 at the top surface of the package substrate 102 by DTPS interconnects 150-1. The DTPS interconnects 150-1 may take the form of any of the embodiments disclosed herein, such as solder interconnects or anisotropic conductive material interconnects. The package substrate 102 may be formed in accordance with any of the techniques discussed above with reference to FIGS. 17C-17D.

FIG. 18B illustrates an assembly 314 subsequent to coupling the dies 114-2 and 114-3 to the assembly 312 (FIG. 18A). In particular, the conductive contacts 124 of the die 114-1 may be coupled to the conductive contacts 124 of the dies 114-2 (via DTD interconnects 130-1) and to the conductive contacts 124 of the die 114-3 (via DTD interconnects 130-2). Further, the conductive contacts 122 of the dies 114-2 may be coupled to conductive contacts 146 at the top surface of the package substrate 102 via DTPS interconnects 150-2. Any suitable technique may be used to form the DTD interconnects 130-1 and 130-2, and the DTPS interconnects 150-2, of the assembly 314, such as solder techniques or anisotropic conductive material techniques. For example, the DTPS interconnects 150-2 and the DTD interconnects 130-1/130-2 may be solder interconnects. The assembly 314 may take the form of the microelectronic assembly 100 of FIG. 5. Further operations may be performed as suitable (e.g., providing a mold material 127, providing a TIM 129, providing a heat spreader 131, attaching additional dies 114 to the package substrate 102, etc.).

FIGS. 19A-19H are side, cross-sectional views of various stages in another example process for manufacturing the microelectronic assembly 100 of FIG. 5, in accordance with various embodiments. In some embodiments, microelectronic assemblies 100 manufactured in accordance with the process of FIGS. 19A-19H (e.g., any of the microelectronic assemblies 100 of FIGS. 1-11) may have DTPS interconnects 150-1 that are non-solder interconnects (e.g., anisotropic conductive material interconnects), and DTD interconnects 130-1 and 130-2 that are solder interconnects.

Figure 19A:
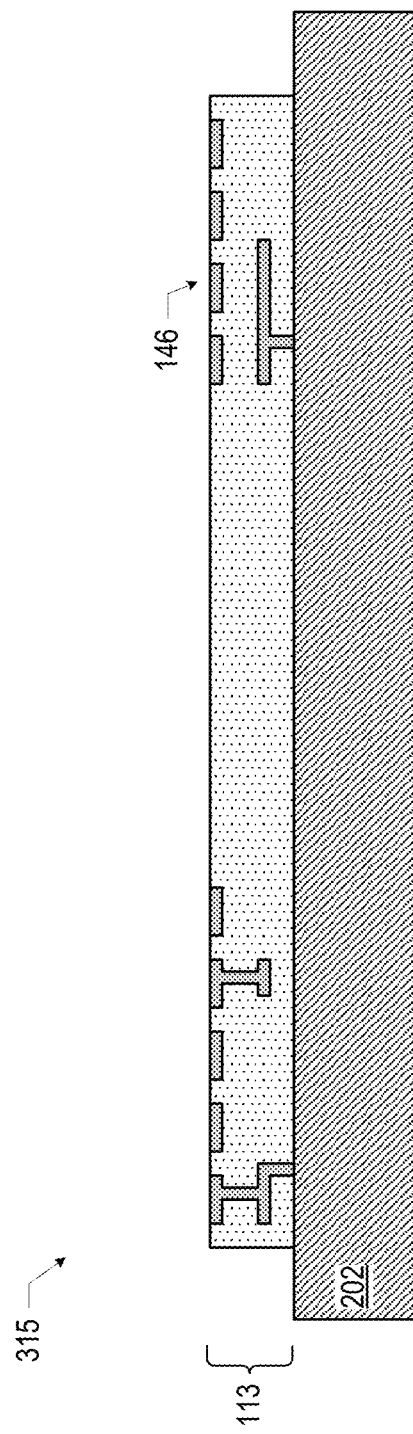
FIGS. 19A-19H are side, cross-sectional views of various stages in another example process for manufacturing the microelectronic assembly of FIG. 5, in accordance with various embodiments.

FIG. 19A illustrates an assembly 315 including a package substrate portion 113 on a carrier 202. The package substrate portion 113 may be the "top" portion of the package substrate 102, as discussed further below, and may include conductive contacts 146 at the surface of the package substrate portion 113 facing away from the carrier 202. The carrier 202 may take any of the forms disclosed herein. The package substrate portion 113 may be formed on the carrier 202 using any suitable technique, such as a redistribution layer technique.

Figure 19B:
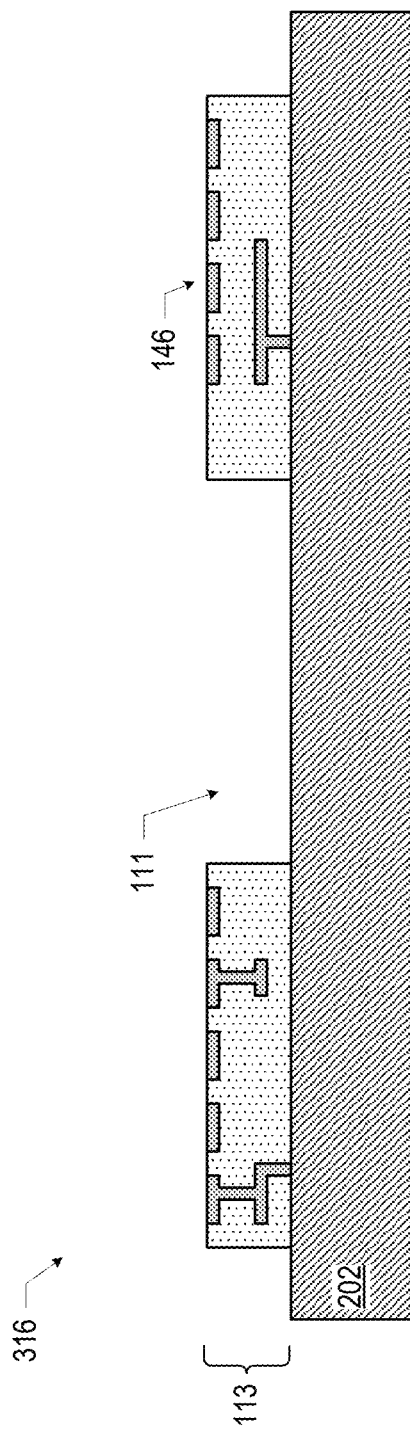

FIG. 19B illustrates an assembly 316 subsequent to forming a cavity 111 in the package substrate portion 113 of the assembly 315 (FIG. 19A). The cavity 111 may be formed using any of the techniques discussed above with reference to the recess 108 of FIG. 17D, for example. As discussed in further detail below, the cavity 111 may correspond to the recess 108.

Figure 19C:
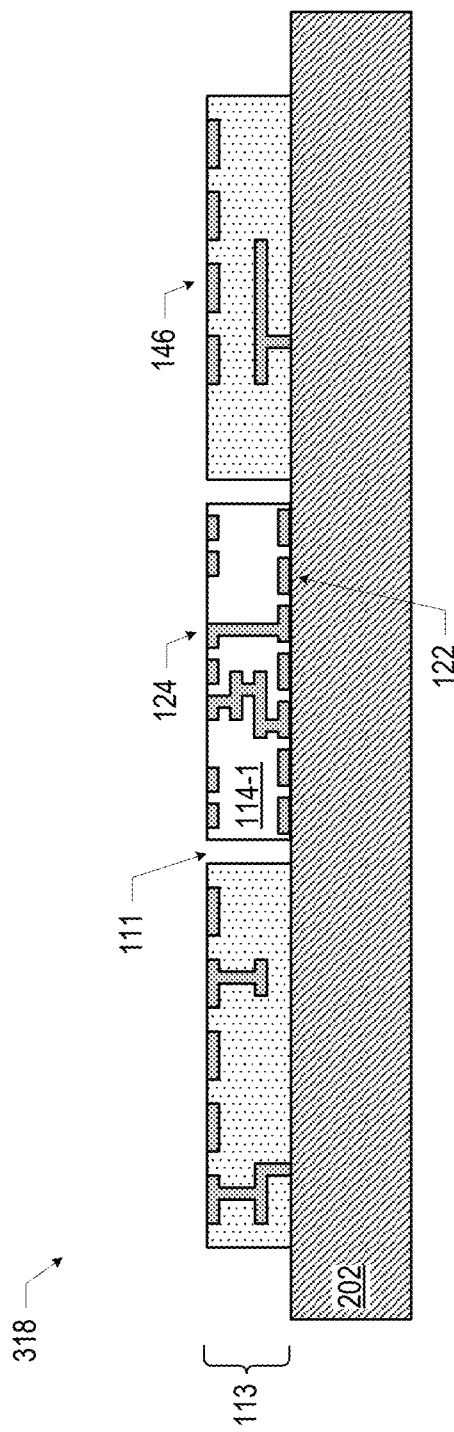

FIG. 19C illustrates an assembly 318 subsequent to positioning the die 114-1 in the cavity 111 of the assembly 316 (FIG. 19B). The die 114-1 may be positioned in the cavity 111 so that the conductive contacts 122 face the carrier 202, and the conductive contacts 124 face away from the carrier 202. In some embodiments, a pick-and-place machine may be used to position the die 114-1 in the cavity 111 on the carrier 202.

Figure 19D:
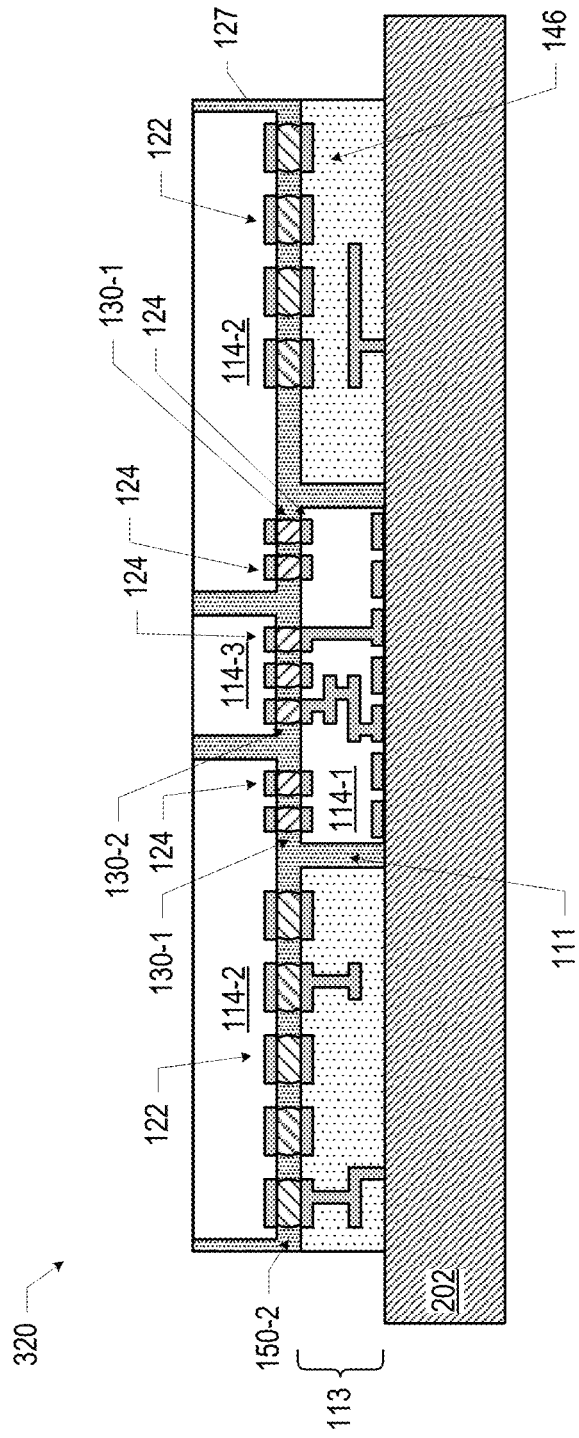

FIG. 19D illustrates an assembly 320 subsequent to coupling the dies 114-2 and 114-3 to the assembly 318 (FIG. 19C), and providing a mold material 127 around the dies 114. In particular, the conductive contacts 124 of the die 114-1 may be coupled to the conductive contacts 124 of the dies 114-2 (via DTD interconnects 130-1) and to the conductive contacts 124 of the die 114-3 (via DTD interconnects 130-2). Further, the conductive contacts 122 of the dies 114-2 may be coupled to conductive contacts 146 at the top surface of the package substrate 102 via DTPS interconnects 150-2. Any suitable technique may be used to form the DTD interconnects 130-1 and 130-2, and the DTPS interconnects 150-2, of the assembly 314, such as solder techniques or anisotropic conductive material techniques. For example, the DTPS interconnects 150-2 and the DTD interconnects 130-1/130-2 may be solder interconnects. The mold material 127 may take any of the forms disclosed herein, and may provide mechanical support for further manufacturing operations.

Figure 19E:
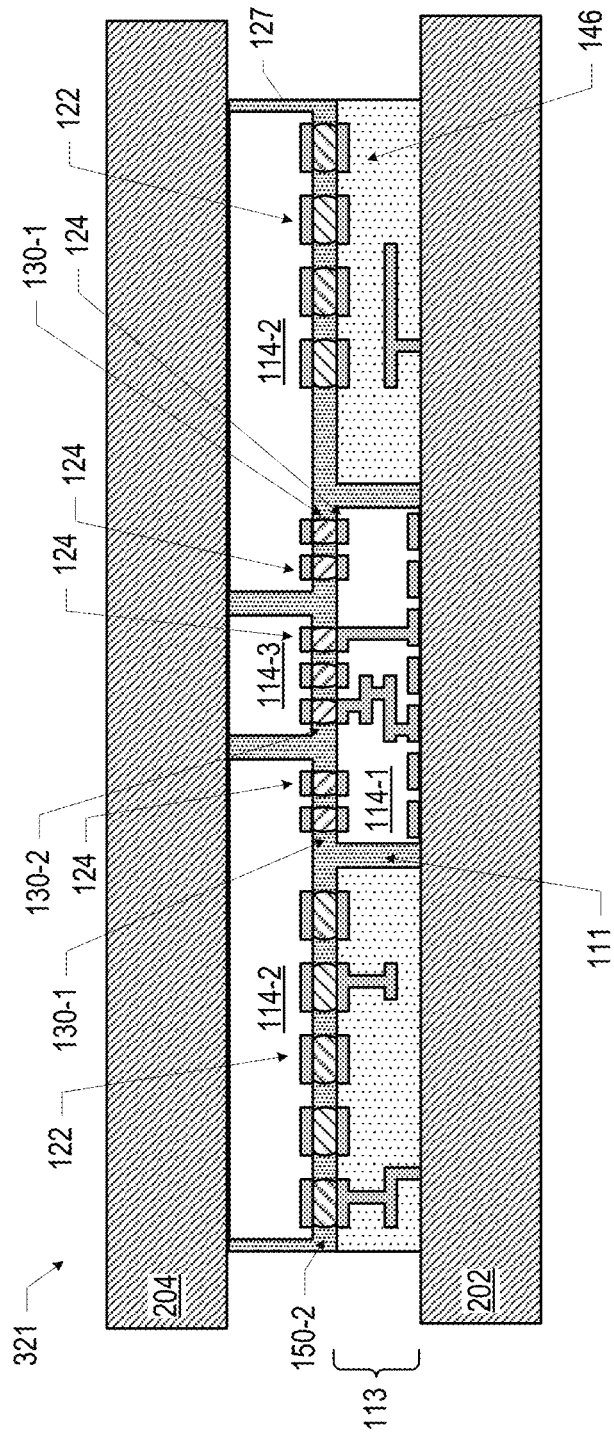

FIG. 19E illustrates an assembly 321 subsequent to attaching another carrier 204 to the top surface of the assembly 320 (FIG. 19D). The carrier 204 may take the form of any of the embodiments of the carrier 202 disclosed herein.

Figure 19F:
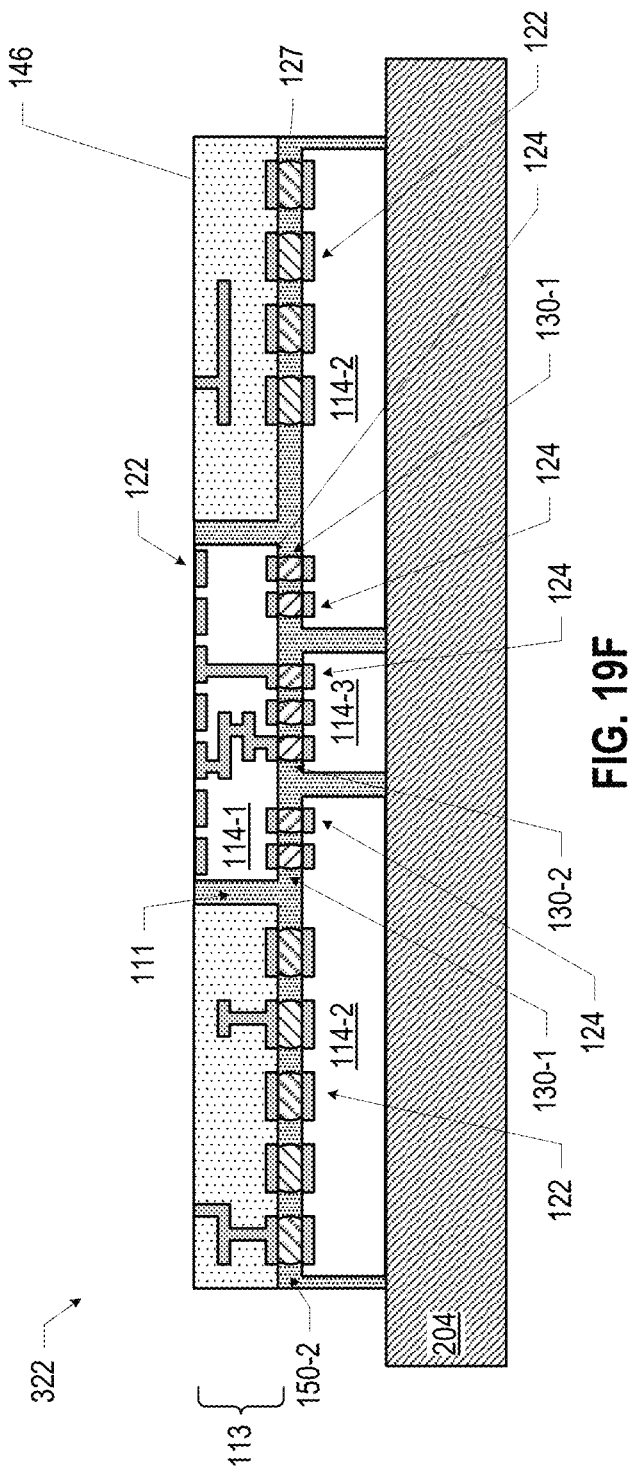

FIG. 19F illustrates an assembly 322 subsequent to removing the carrier 202 from the assembly 321 (FIG. 19E) and flipping the result so that the package substrate portion 113 and the conductive contacts 122 of the die 114-1 are exposed.

Figure 19G:
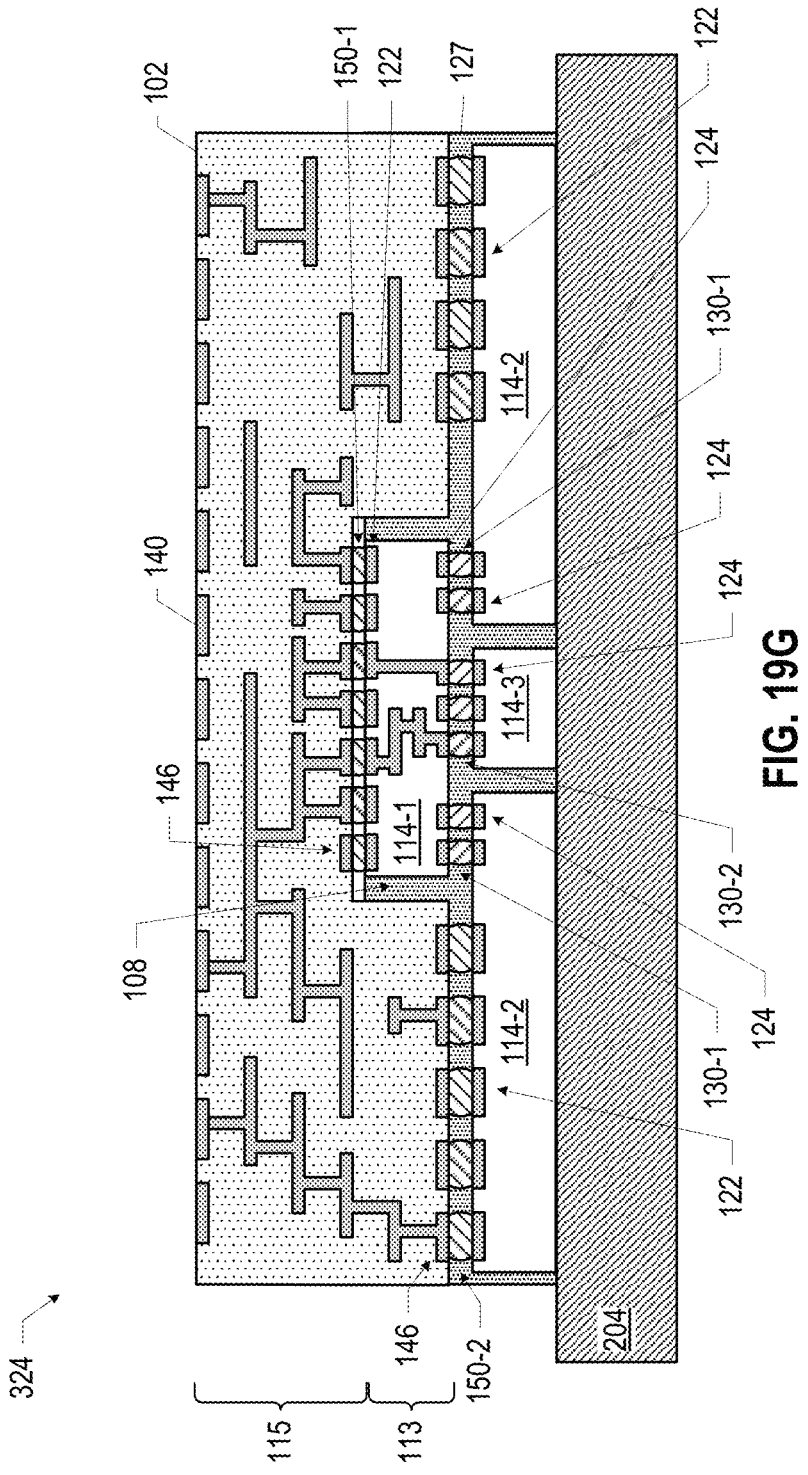

FIG. 19G illustrates an assembly 324 subsequent to forming an additional package substrate portion 115 on the package substrate portion 113 of the assembly 322 (FIG. 19F) to form the package substrate 102. Any suitable technique may be used to form the package substrate portion 113, including any of the techniques discussed above with reference to FIG. 19A, a bumpless build-up layer technique, a carrier-based panel-level coreless package substrate manufacturing technique, or an embedded panel-level bonding technique. In some embodiments, forming the package substrate portion 115 may include plating the conductive contacts 122 of the die 114-1 with a metal or other conductive material as part of forming the proximate conductive contacts 146 of the package substrate 102; consequently, the DTPS interconnects 150-1 between the die 114-1 and the package substrate 102 may be plated interconnects.

Figure 19H:
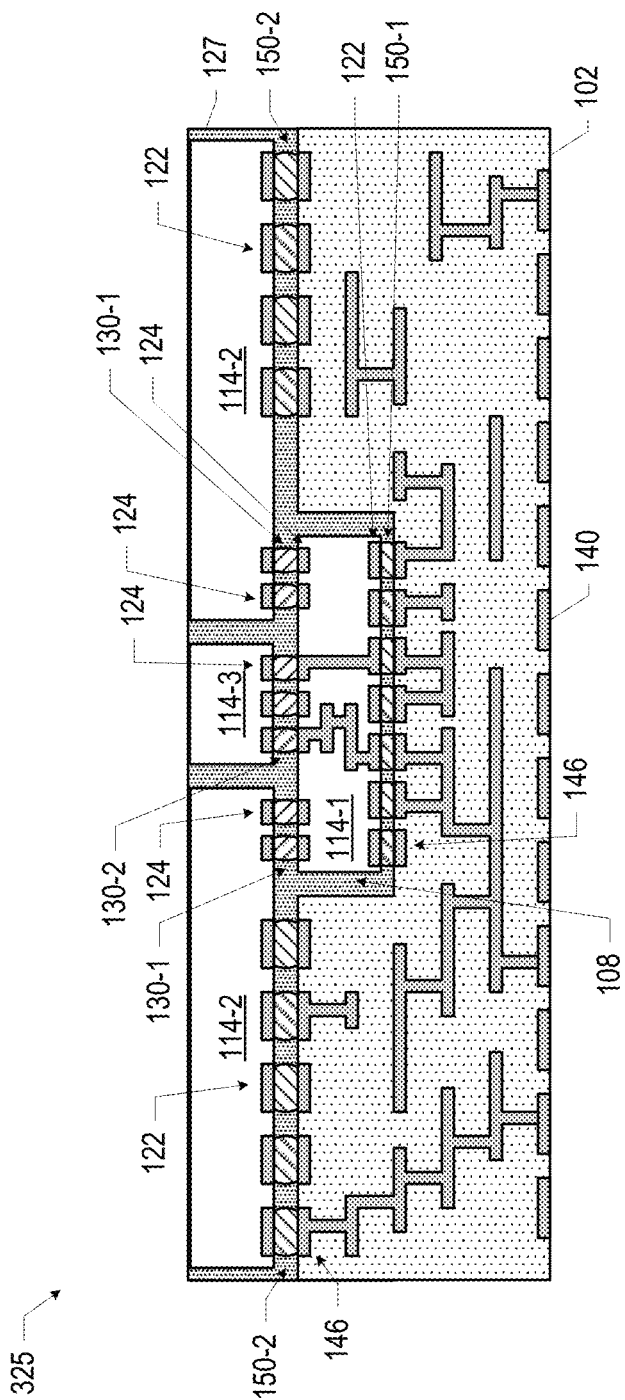

FIG. 19H illustrates an assembly 325 subsequent to removing the carrier 204 from the assembly 324 (FIG. 19G) and flipping the result. The assembly 325 may take the form of the microelectronic assembly 100 of FIG. 5. Further operations may be performed as suitable (e.g., providing a TIM 129, providing a heat spreader 131, attaching additional dies 114 to the package substrate 102, etc.).

Figure 20:
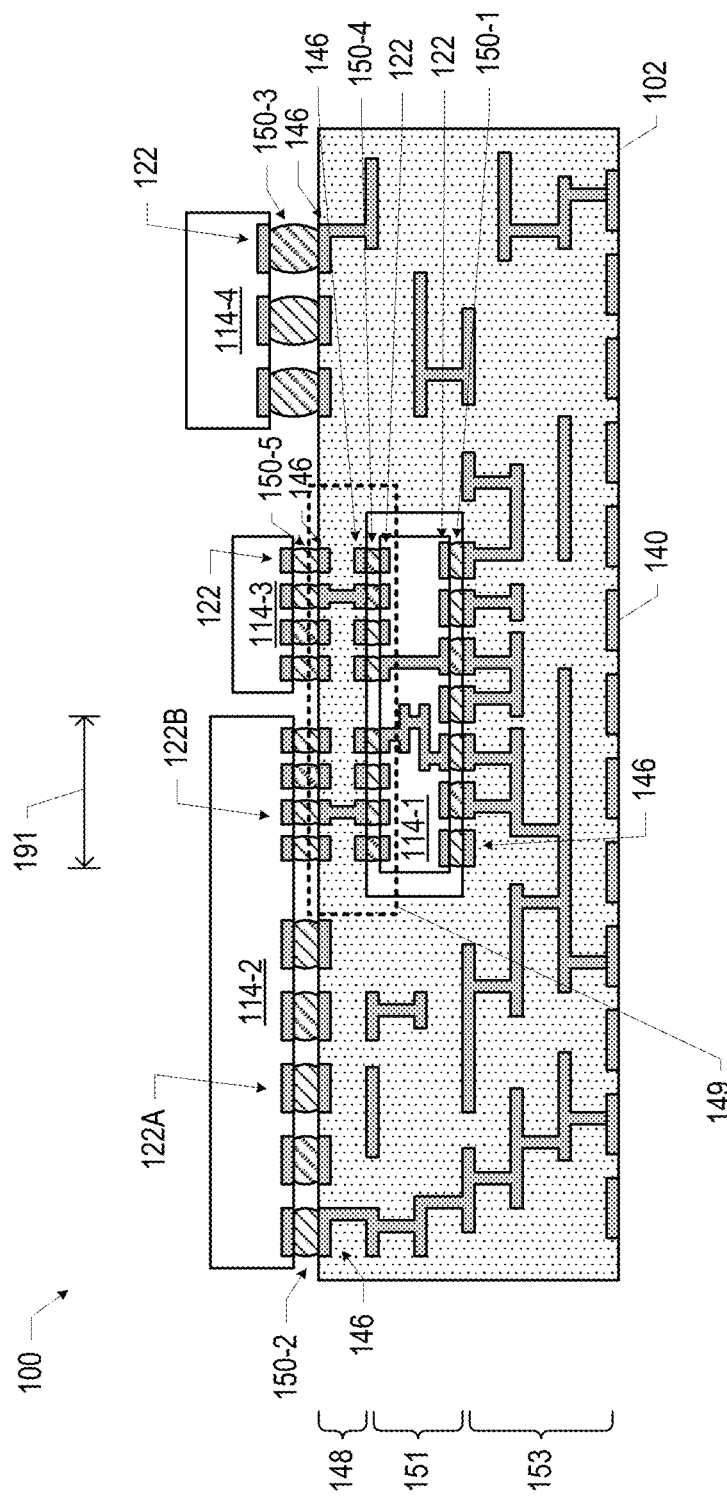
FIGS. 20-22 are side, cross-sectional views of example microelectronic assemblies, in accordance with various embodiments.
Figure 21:
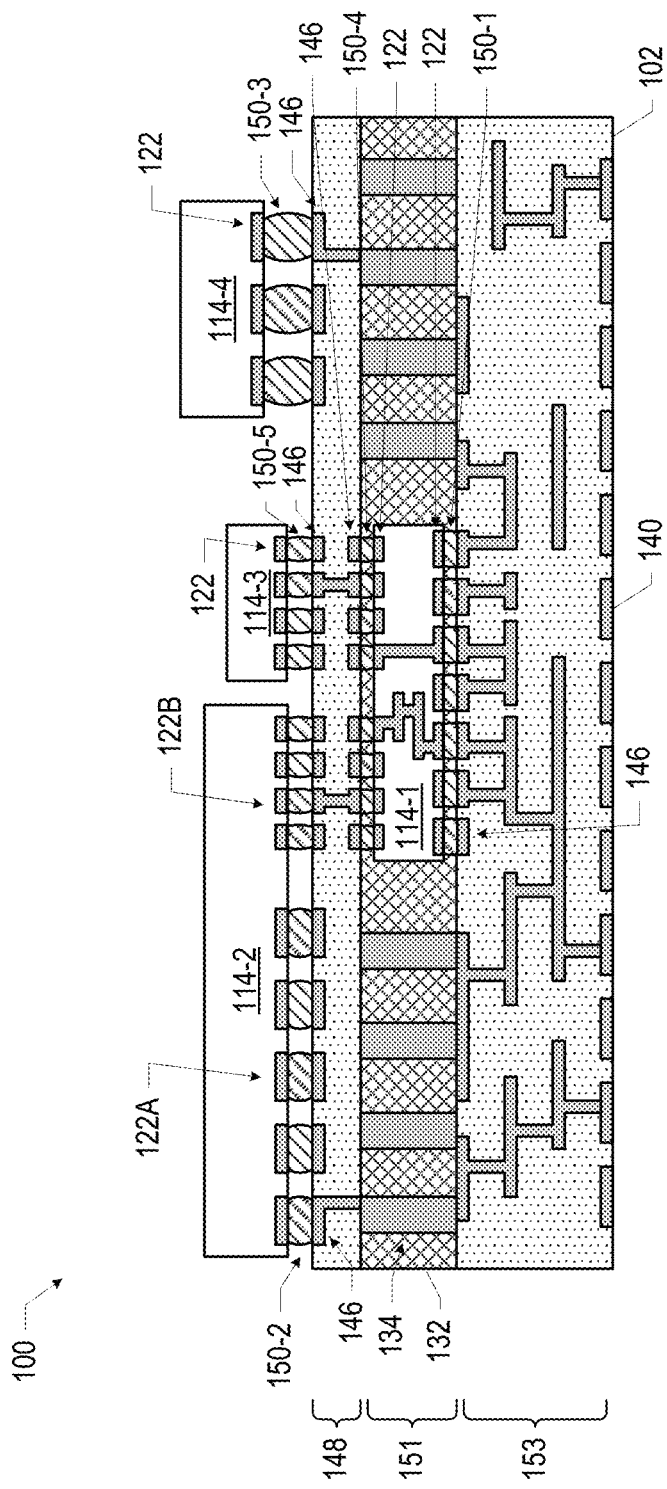
Figure 22:
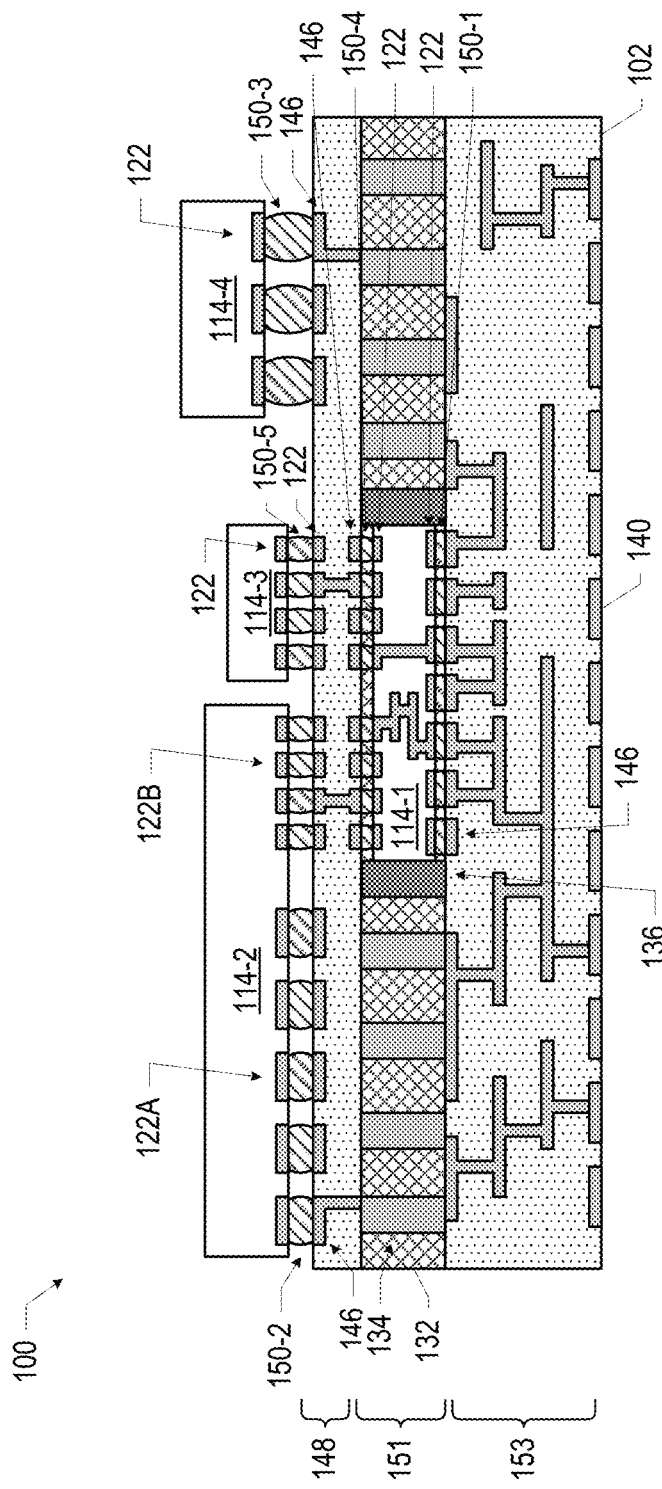

In the microelectronic assemblies 100 discussed above with reference to FIGS. 1-11, the die 114-1 is coupled directly to at least one die 114-2 without any intervening portion of the package substrate 102. In other embodiments of the microelectronic assemblies 100 disclosed herein, a portion of the package substrate 102 may be disposed between an embedded die 114-1 and a die 114-2. FIGS. 20-22 are side, cross-sectional views of example microelectronic assemblies 100 including such a feature, in accordance with various embodiments. In particular, FIGS. 20-22 illustrate arrangements of dies 114-1, 114-2, 114-3, and 114-4 that are similar to the arrangement illustrated in FIG. 1, but that further include a package substrate portion 148 between the top surface of the die 114-1 and the top surface of the package substrate 102. The dies 114-2, 114-3, and 114-4 may all be coupled to this package substrate portion 148. For example, the die 114-1 may include conductive contacts 122 at its bottom surface that couple to conductive contacts 146 of the package substrate 102 via DTPS interconnects 150-1, and the die 114-1 may include conductive contacts 122 at its top surface that couple to conductive contacts 146 of the package substrate 102 (in the package substrate portion 148) via DTPS interconnects 150-4.

In some embodiments, the package substrate portion 148 may include one or more areas 149 with higher conductive pathway density (e.g., the areas in which the footprint of the die 114-2 overlaps with the footprint of the die 114-1 and the package substrate portion 148 includes conductive pathways between the die 114-2 and the die 114-1, or the areas in which the footprint of the die 114-3 overlaps of the footprint of the die 114-1 and the package substrate portion 148 includes conductive pathways between the die 114-3 and the die 114-1). Thus, the die 114-2 may be a mixed-pitch die including larger-pitch conductive contacts 122A and smaller-pitch conductive contacts 122B; the larger-pitch conductive contacts 122A may couple (through some of the DTPS interconnects 150-2) to conductive contacts 146 on the top surface of the package substrate 102 (that themselves couple to conductive pathways through the bulk of the package substrate 102), and the smaller-pitch conductive contacts 122B may couple (through some of the DTPS interconnects 150-2) to conductive contacts 146 on the top surface of the package substrate 102 (that themselves couple to conductive pathways through the package substrate portion 148 and to the die 114-1). Similarly, the pitch of the conductive contacts 122 at the bottom surface of the die 114-3 (which may be coupled via the DTPS interconnects 150-5 to dense conductive pathways through the package substrate portion 148 to the die 114-1) may be smaller than the pitch of the conductive contacts 122 at the bottom surface of the die 114-4 (which may be coupled via the DTPS interconnects 150-3 to less dense conductive pathways through the package substrate 102).

The package substrate 102 may also include a portion 151 adjacent to the die 114-1, and a portion 153 below the die 114-1.

FIG. 20 illustrates an embodiment in which the conductive pathways in the package substrate 102 are provided by conductive lines and vias, as known in the art. In other embodiments, the package substrate 102 may include conductive pillars (e.g., copper pillars) and other structures. For example, FIG. 21 illustrates a microelectronic assembly 100 similar to that of FIG. 20, but in which the package substrate portion 151 includes a plurality of conductive pillars 134 disposed around the die 114-1. The conductive pillars 134 may be substantially surrounded by a mold material 132, which may take the form of any of the mold materials 127 disclosed herein. The conductive pillars 134 may be part of conductive pathways between the package substrate portion 148 and the package substrate portion 153. Non-conductive pillars (e.g., pillars formed of a permanent resist or a dielectric) may be used instead of or in addition to conductive pillars 134 in any suitable ones of the embodiments disclosed herein.

The conductive pillars 134 may be formed of any suitable conductive material, such as a metal. In some embodiments, the conductive pillars 134 may include copper. The conductive pillars 134 may have any suitable dimensions. For example, in some embodiments, an individual conductive pillar 134 may have an aspect ratio (height:diameter) between 1:1 and 4:1 (e.g., between 1:1 and 3:1). In some embodiments, an individual conductive pillar 134 may have a diameter between 10 microns and 300 microns. In some embodiments, an individual conductive pillar 134 may have a diameter between 50 microns and 400 microns.

In some embodiments in which a package substrate 102 includes a plurality of conductive pillars 134, the package substrate portion 151 may also include a placement ring. For example, FIG. 22 illustrates an embodiment of the microelectronic assembly 100 similar to that of FIG. 21, but further including a placement ring 136. The placement ring 136 may be formed of any suitable material (e.g., a plated copper feature with a coating of an organic material, stainless steel, or a non-conductive material, such as glass, sapphire, polyimide, or epoxy with silica), and may be shaped so as to fit closely around the die 114-1. In some embodiments, the placement ring 136 may have slanted or straight walls to help guide the die 114-1 into position. Thus, the shape of the placement ring 136 may complement the shape of the footprint of the die 114-1, and the placement ring 136 may help to align the die 114-1 during manufacture, as discussed further below.

Microelectronic assemblies 100 including embedded dies 114 may include any suitable arrangement of dies 114. For example, any of the arrangements illustrated in FIGS. 12-16 and 28-36 may be implemented with the die 114A embedded in a package substrate, with the dies 114A and 114B embedded in a package substrate 102, or with the dies 114A, 114B, and 114C embedded in a package substrate 102. Additionally, any of the arrangements illustrated in FIGS. 1-11 may be implemented with the die 114-1 (and optionally more of the dies 114) embedded in a package substrate 102, in accordance with any of the embodiments of FIGS. 20-22.

Figure 23A:
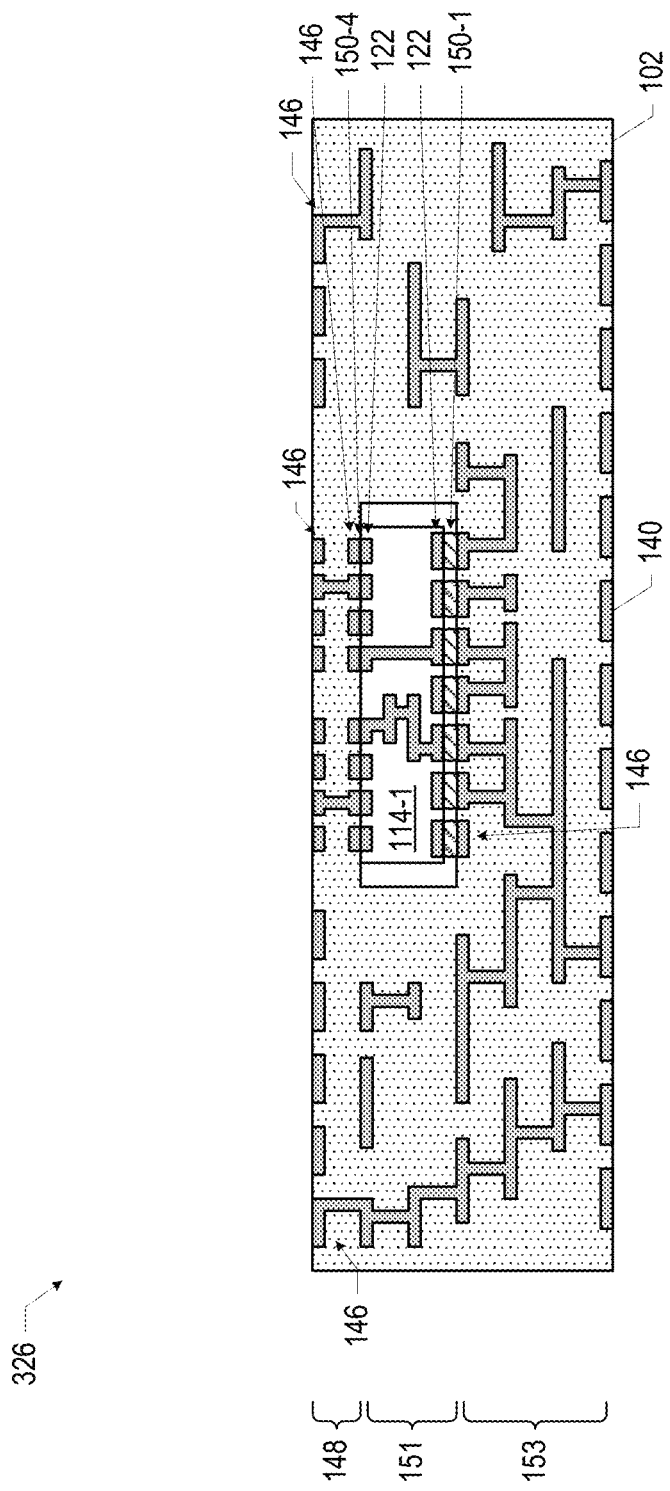
FIGS. 23A-23B are side, cross-sectional views of various stages in an example process for manufacturing the microelectronic assembly of FIG. 20, in accordance with various embodiments.
Figure 23B:
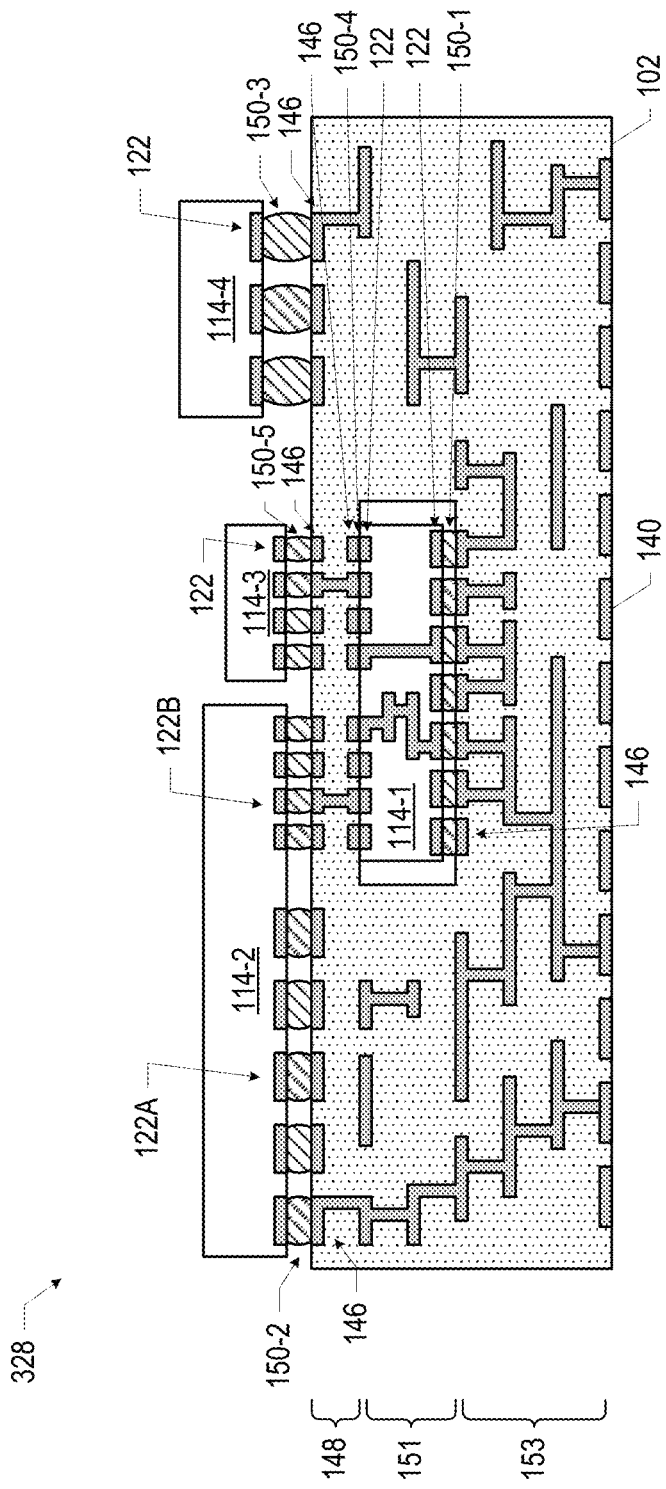

Any suitable techniques may be used to manufacture microelectronic assemblies 100 having an embedded die 114-1 (e.g., having a package substrate portion 148 between the die 114-1 and the die 114-2). For example, FIGS. 23A-23B are side, cross-sectional views of various stages in an example process for manufacturing the microelectronic assembly 100 of FIG. 20, in accordance with various embodiments. In some embodiments, microelectronic assemblies 100 manufactured in accordance with the process of FIGS. 23A-23B may have DTPS interconnects 150-1 that are solder interconnects, and DTPS interconnects 150-4 that are non-solder interconnects (e.g., plated interconnects).

FIG. 23A illustrates an assembly 326 subsequent to forming the package substrate portion 148 on the assembly 312 (FIG. 18A). The package substrate portion 148 may be formed using any suitable techniques, such as any of the techniques discussed above with reference to the formation of the package substrate portion 115 of FIG. 19G. In some embodiments, forming the package substrate portion 148 may include plating the conductive contacts 122 of the die 114-1 with a metal or other conductive material as part of forming the proximate conductive contacts 146 of the package substrate 102; consequently, the DTPS interconnects 150-4 between the die 114-1 and the package substrate portion 148 may be plated interconnects.

FIG. 23B illustrates an assembly 328 subsequent to attaching the dies 114-2, 114-3, and 114-4 to the assembly 326 (FIG. 23A). Any suitable techniques may be used to form the DTPS interconnects 150 between the dies 114-2, 114-3, and 114-4 and the package substrate 102, such as solder techniques or anisotropic conductive material techniques.

FIGS. 24A-24E are side, cross-sectional views of various stages in an example process for manufacturing the microelectronic assembly 100 of FIG. 21, in accordance with various embodiments. In some embodiments, microelectronic assemblies 100 manufactured in accordance with the process of FIGS. 24A-24E may have DTPS interconnects 150-1 that are solder interconnects, and DTPS interconnects 150-4 that are non-solder interconnects (e.g., plated interconnects).

Figure 24A:
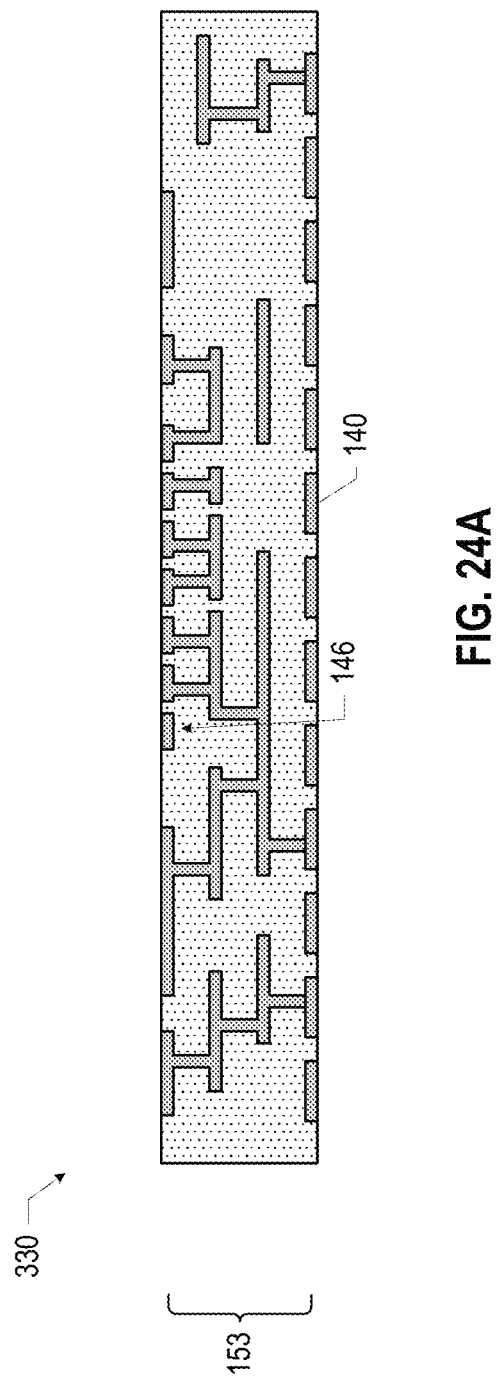
FIGS. 24A-24E are side, cross-sectional views of various stages in an example process for manufacturing the microelectronic assembly of FIG. 21, in accordance with various embodiments.

FIG. 24A illustrates an assembly 330 including the package substrate portion 153. The package substrate portion 153 may be manufactured using any suitable technique, such as a PCB technique or a redistribution layer technique.

Figure 24B:
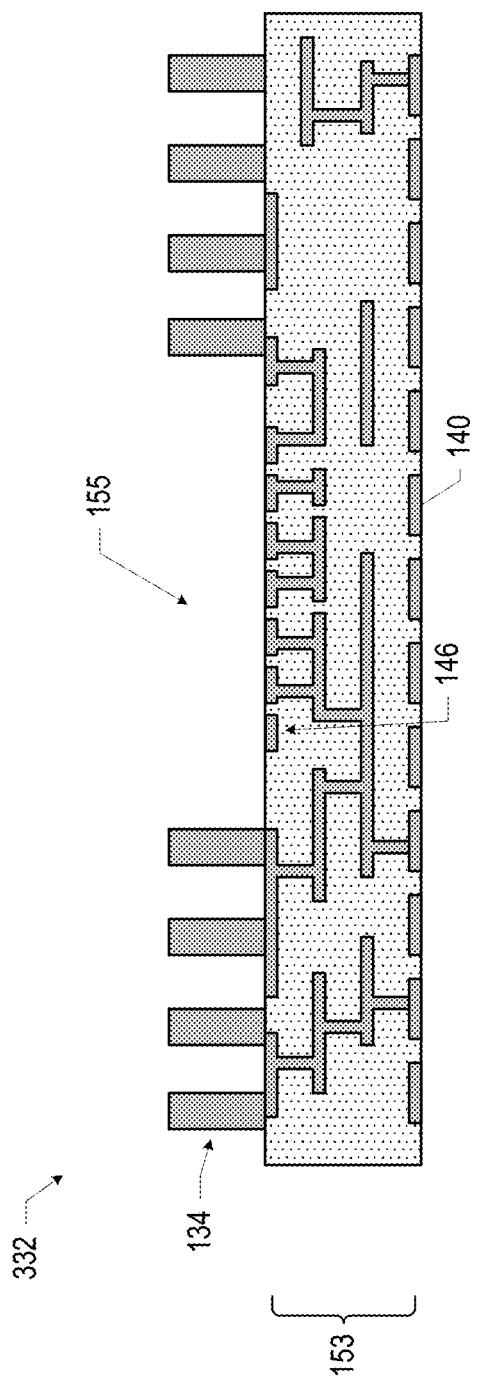

FIG. 24B illustrates an assembly 332 subsequent to forming conductive pillars 134 on the top surface of the package substrate portion 153 of the assembly 330 (FIG. 24A). The conductive pillars 134 may be disposed around a de-population region 155 in which no conductive pillars 134 are present. The conductive pillars 134 may take the form of any of the embodiments disclosed herein, and may be formed using any suitable technique (e.g., plating). For example, the conductive pillars 134 may include copper.

Figure 24C:
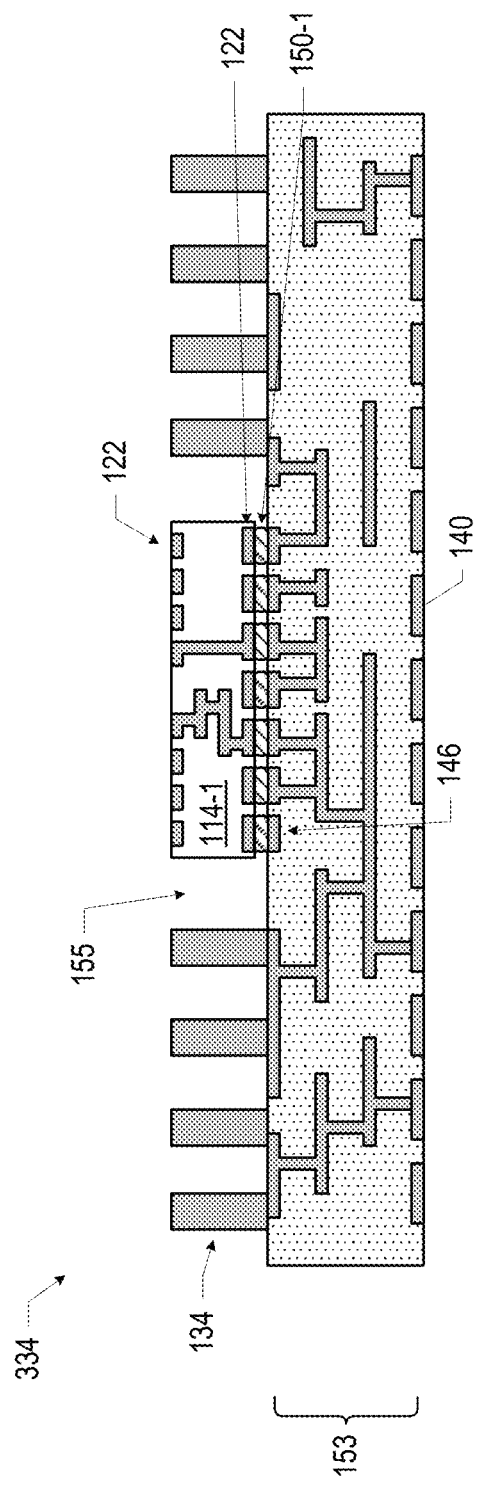

FIG. 24C illustrates an assembly 334 subsequent to placing the die 114-1 in the de-population region 155 of the assembly 332 (FIG. 24B) and coupling the die 114-1 to the package substrate portion 153. In particular, the conductive contacts 122 at the bottom surface of the die 114-1 may be coupled to the conductive contacts 146 at the top surface of the package substrate portion 153 via DTPS interconnects 150-1. The DTPS interconnects 150-1 may take any of the forms disclosed herein, such as solder interconnects or anisotropic conductive material interconnects.

Figure 24D:
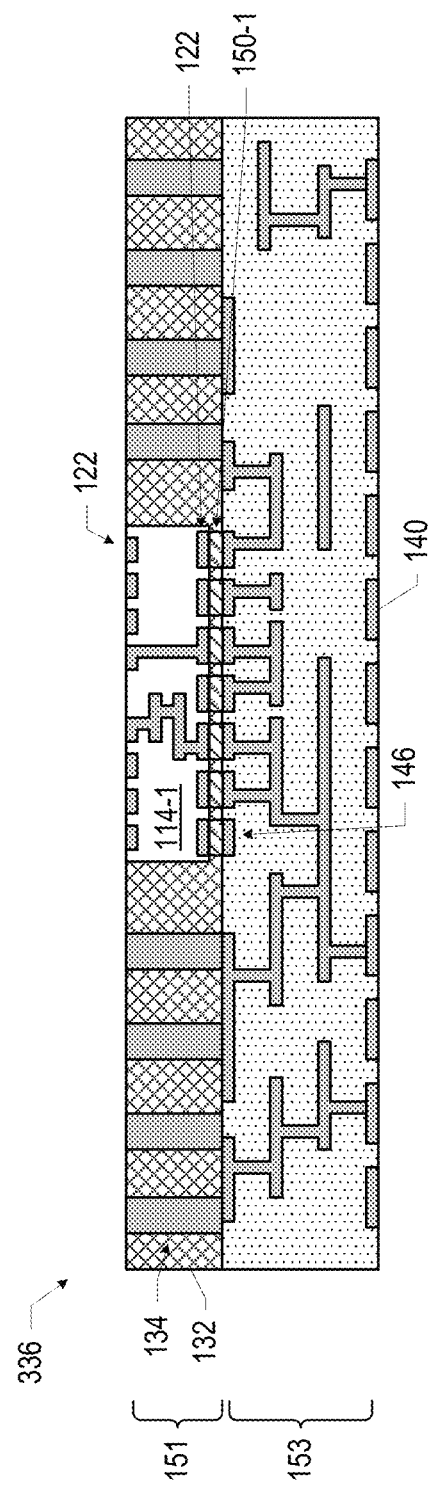

FIG. 24D illustrates an assembly 336 subsequent to providing a mold material 132 around the die 114-1 and the conductive pillars 134 of the assembly 334 (FIG. 24C) to complete the package substrate portion 151. In some embodiments, the mold material 132 may be initially deposited on and over the tops of the conductive pillars 134 and the die 114-1, then polished back to expose the conductive contacts 122 at the top surface of the die 114-1, and the top surfaces of the conductive pillars 134.

Figure 24E:
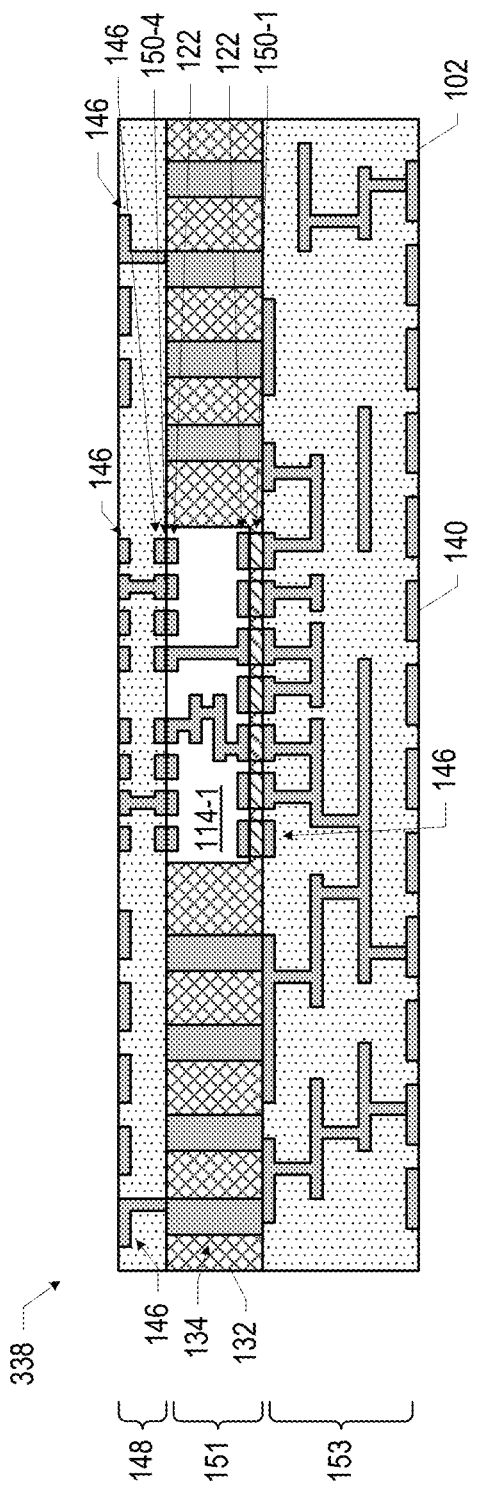

FIG. 24E illustrates an assembly 338 subsequent to forming the package substrate portion 148 on the assembly 336 (FIG. 24D). The package substrate portion 148 may be formed using any suitable techniques, such as any of the techniques discussed above with reference to the formation of the package substrate portion 115 of FIG. 19G. In some embodiments, forming the package substrate portion 148 may include plating the conductive contacts 122 of the die 114-1 with a metal or other conductive material as part of forming the proximate conductive contacts 146 of the package substrate 102; consequently, the DTPS interconnects 150-4 between the die 114-1 and the package substrate portion 148 may be plated interconnects. The dies 114-2, 114-3, and 114-4 may then be attached to the top surface of the package substrate portion 148 in accordance with any of the techniques discussed above with reference to FIG. 23B to form the microelectronic assembly 100 of FIG. 21.

FIGS. 25A-25F are side, cross-sectional views of various stages in an example process for manufacturing the microelectronic assembly 100 of FIG. 22, in accordance with various embodiments. In some embodiments, microelectronic assemblies 100 manufactured in accordance with the process of FIGS. 25A-25F may have DTPS interconnects 150-1 that are non-solder interconnects (e.g., plated interconnects), and DTPS interconnects 150-4 that are non-solder interconnects (e.g., plated interconnects).

Figure 25A:
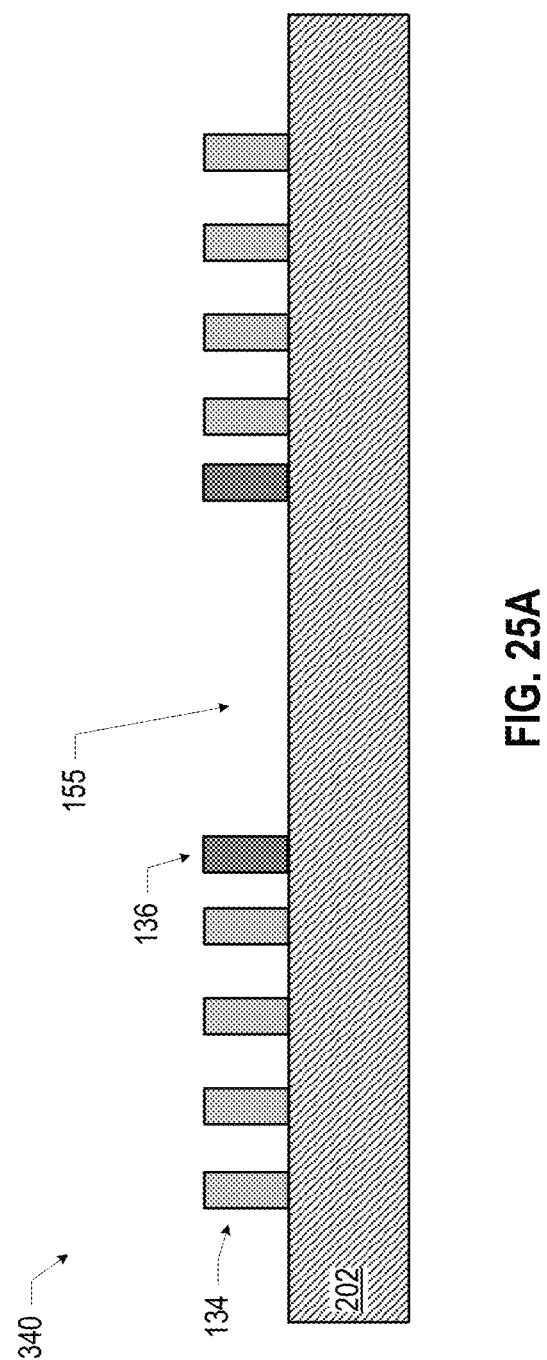
FIGS. 25A-25F are side, cross-sectional views of various stages in an example process for manufacturing the microelectronic assembly of FIG. 22, in accordance with various embodiments.

FIG. 25A illustrates an assembly 340 subsequent to forming a plurality of conductive pillars 134 and a placement ring 136 on a carrier 202. The conductive pillars 134 may take any of the forms disclosed herein, and may be formed using any suitable technique (e.g., the techniques discussed above with reference to FIG. 24B). The placement ring 136 may take any of the forms disclosed herein, and may be formed using any suitable technique (e.g., any of the techniques disclosed herein). The placement ring 136 may surround a de-population region 155 in which no conductive pillars 134 are present.

Figure 25B:
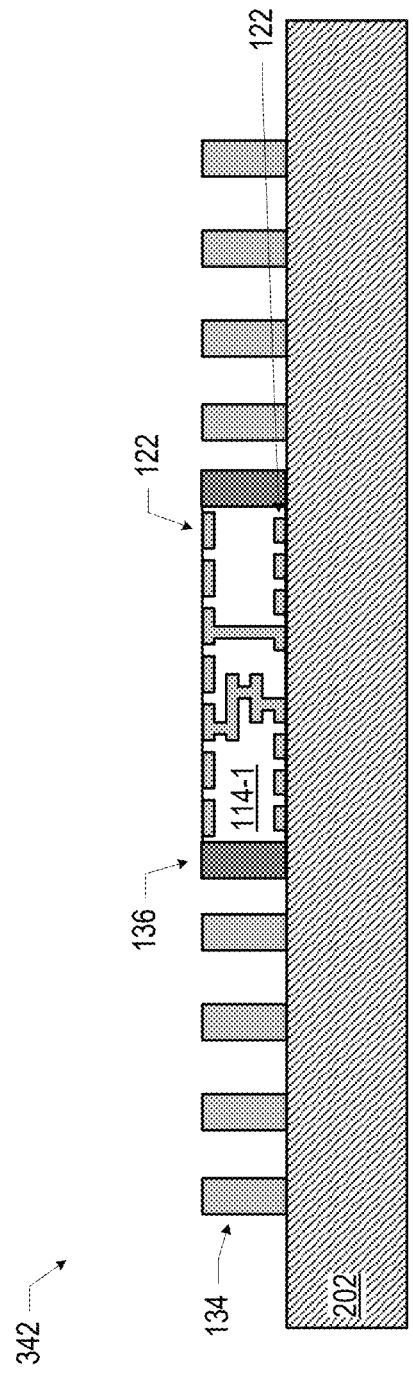

FIG. 25B illustrates an assembly 342 subsequent to positioning the die 114-1 in the de-population region 155 within the placement ring 136 of the assembly 340 (FIG. 25A). As noted above, the placement ring 136 may complement the footprint of the die 114-1, allowing the die 114-1 to be properly positioned.

Figure 25C:
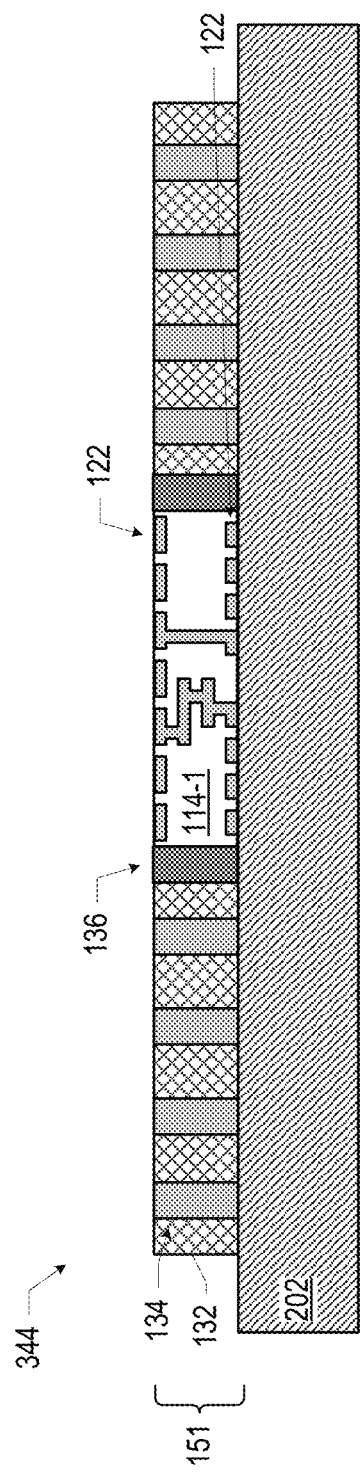

FIG. 25C illustrates an assembly 344 subsequent to providing a mold material 132 around the conductive pillars 134 and placement ring 136 of the assembly 342 (FIG. 25B) to complete the package substrate portion 151. In some embodiments, the mold material 132 may be initially deposited on and over the tops of the conductive pillars 134 and the die 114-1, then polished back to expose the conductive contacts 122 at the surface of the die 114-1, and the surfaces of the conductive pillars 134.

Figure 25D:
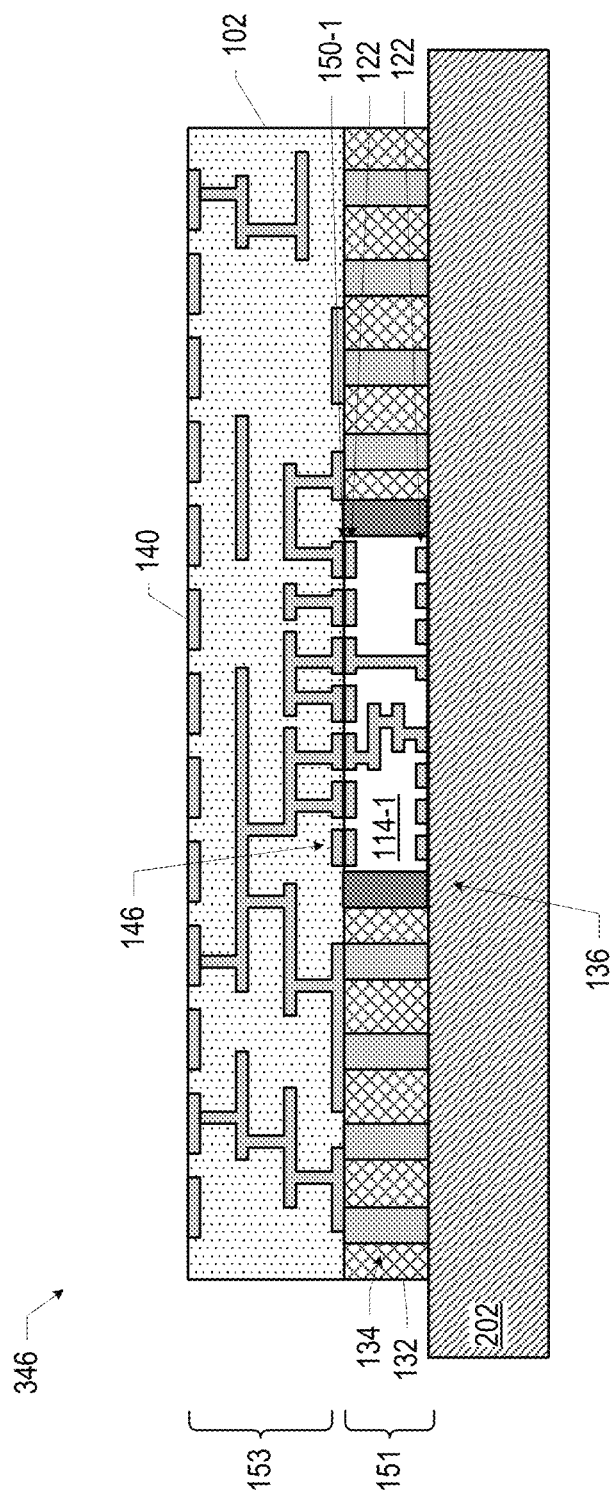

FIG. 25D illustrates an assembly 346 subsequent to forming the package substrate portion 153 on the assembly 344 (FIG. 25C). The package substrate portion 153 may be formed using any suitable techniques, such as any of the techniques discussed above with reference to the formation of the package substrate portion 115 of FIG. 19G. In some embodiments, forming the package substrate portion 153 may include plating the conductive contacts 122 of the die 114-1 with a metal or other conductive material as part of forming the proximate conductive contacts 146 of the package substrate 102; consequently, the DTPS interconnects 150-1 between the die 114-1 and the package substrate portion 148 may be plated interconnects.

Figure 25E:
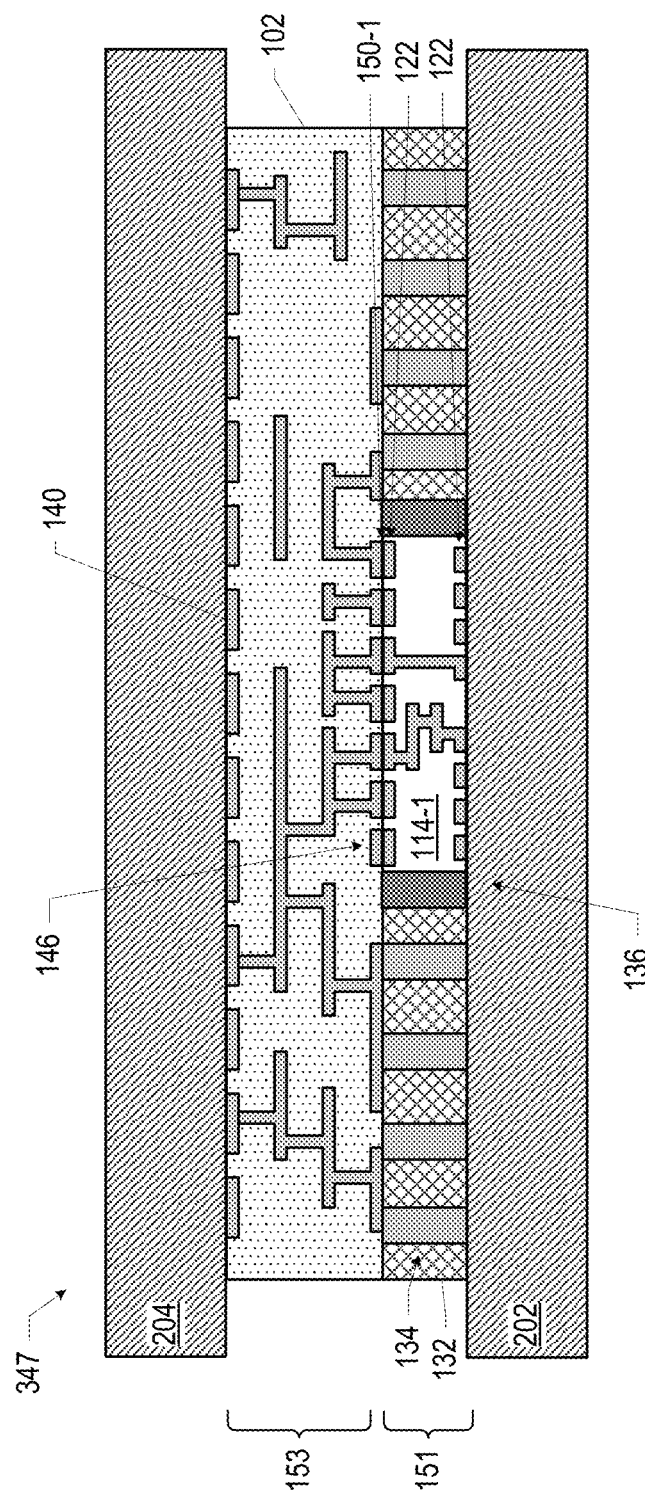

FIG. 25E illustrates an assembly 347 subsequent to attaching another carrier 204 to the top surface of the assembly 346 (FIG. 25D). The carrier 204 may take the form of any of the embodiments of the carrier 202 disclosed herein.

Figure 25F:
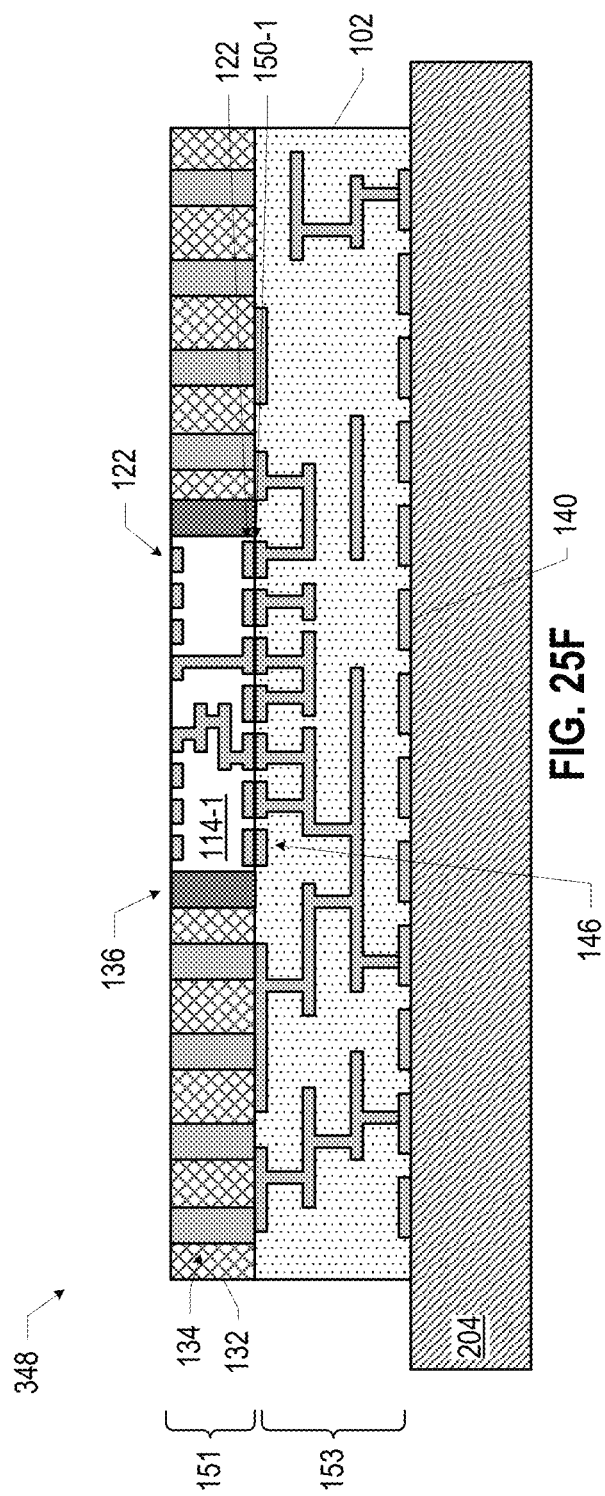

FIG. 25F illustrates an assembly 348 subsequent to removing the carrier 202 from the assembly 347 (FIG. 25E) and flipping the result so that the package substrate portion 151 and the other conductive contacts 122 of the die 114-1 are exposed. The package substrate portion 148 may then be formed on the assembly 348 in accordance with any of the techniques discussed above with reference to FIG. 24E, and the dies 114-2, 114-3, and 114-4 may be attached to the top surface of the package substrate portion 148 (e.g., in accordance with any of the techniques discussed above with reference to FIG. 23B) to form the microelectronic assembly 100 of FIG. 21.

In any of the embodiments disclosed herein, a portion of the package substrate 102 may be formed by assembling two separately manufactured sub-portions. For example, FIGS. 26A-26D are side, cross-sectional views of various stages in another example process for manufacturing the microelectronic assembly 100 of FIG. 21, in accordance with various embodiments. The process of FIGS. 26A-26D includes the assembly of the package substrate portion 153 from two sub-portions, but any package substrate 102 (or portion thereof) may be formed from multiple sub-portions.

Figure 26A:
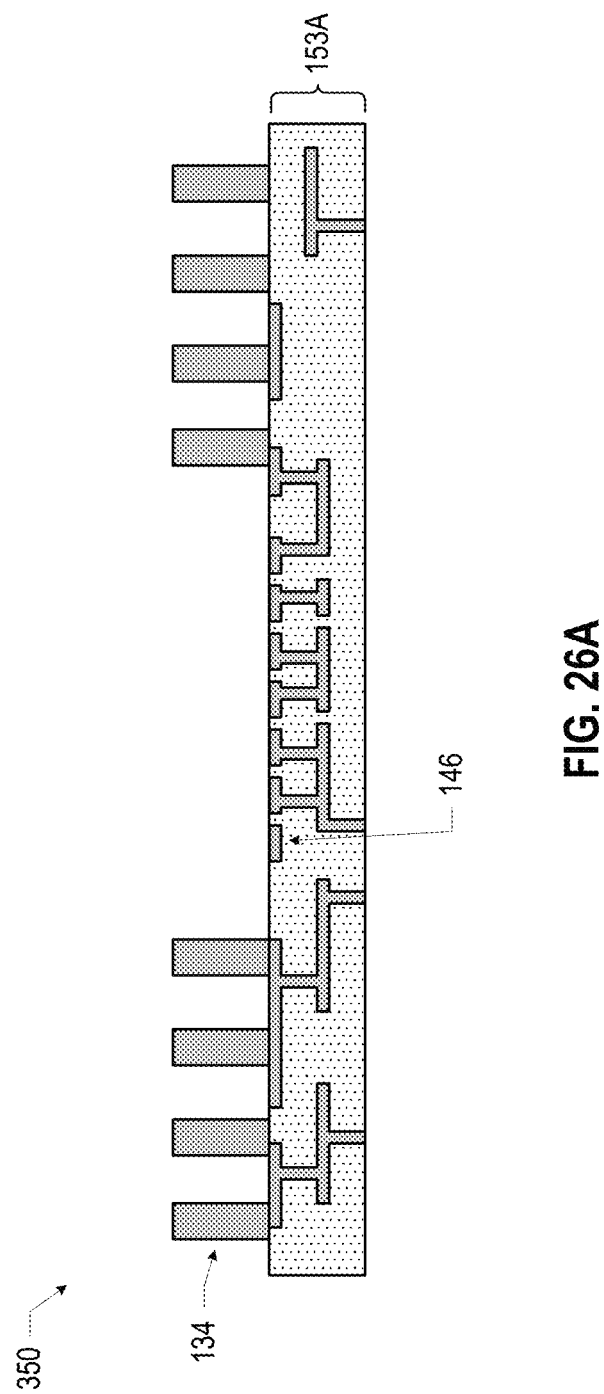
FIGS. 26A-26D are side, cross-sectional views of various stages in another example process for manufacturing the microelectronic assembly of FIG. 21, in accordance with various embodiments.

FIG. 26A illustrates an assembly 350 subsequent to forming a package substrate sub-portion 153A and forming conductive pillars 134 thereon. The conductive pillars 134 may take the form of any of the embodiments disclosed herein, and the package substrate sub-portion 153A may represent the top half of the package substrate portion 153, as discussed further below.

Figure 26B:
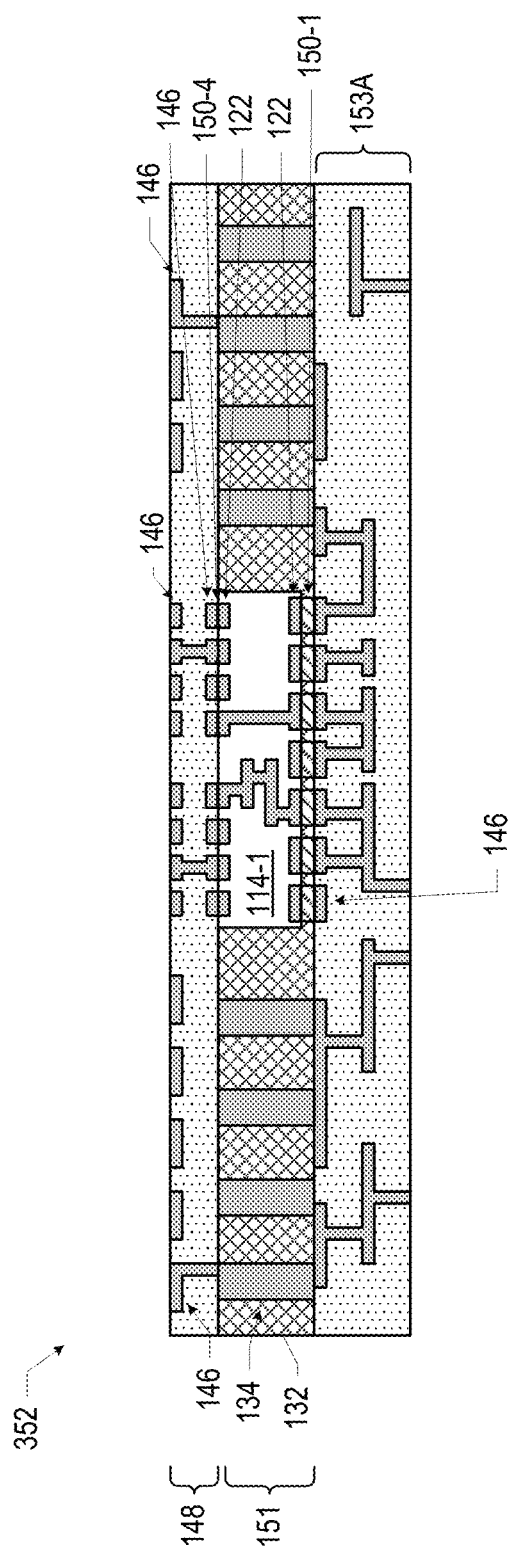

FIG. 26B illustrates an assembly 352 subsequent to attaching a die 114-1 to the assembly 350 (FIG. 26A), providing a mold material 132 around the conductive pillars 134 and the die 114-1 to complete the package substrate portion 151, and forming a package substrate portion 148 on the package substrate portion 151. These operations may take any of the forms discussed above.

Figure 26C:
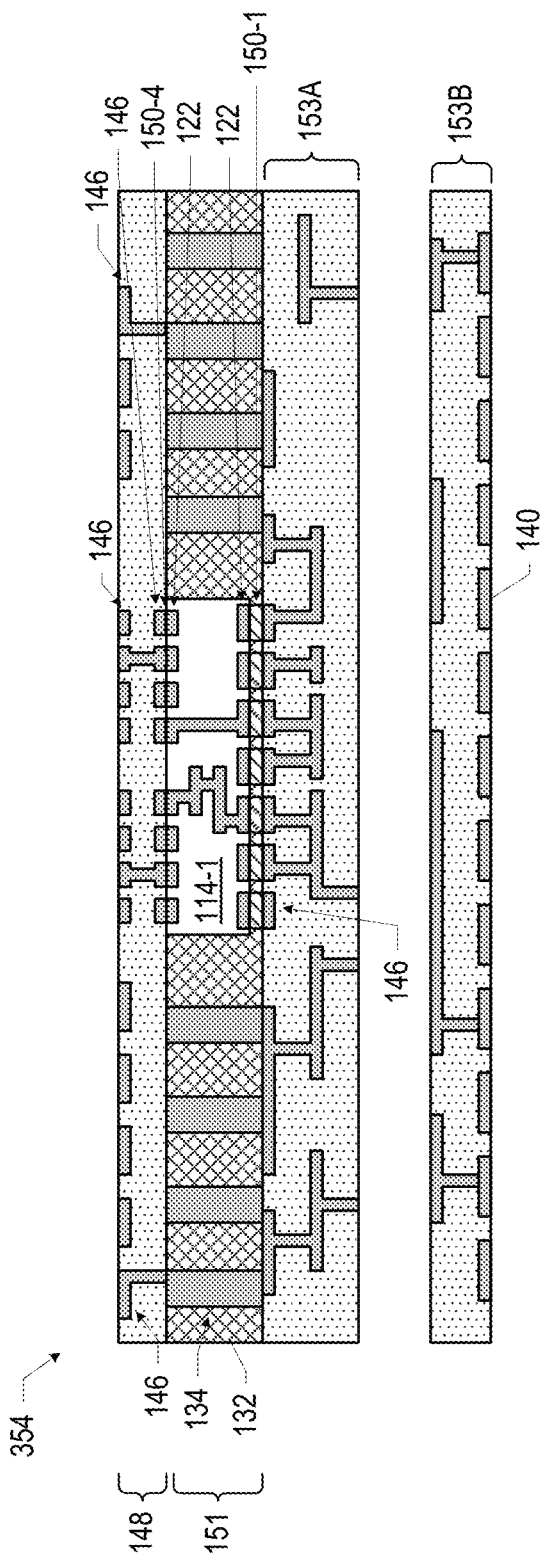

FIG. 26C illustrates an assembly 354 subsequent to bringing the assembly 352 (FIG. 26B) into alignment with a package substrate sub-portion 153B. In particular, the package substrate sub-portion 153A may be brought proximate to the package substrate sub-portion 153B.

Figure 26D:
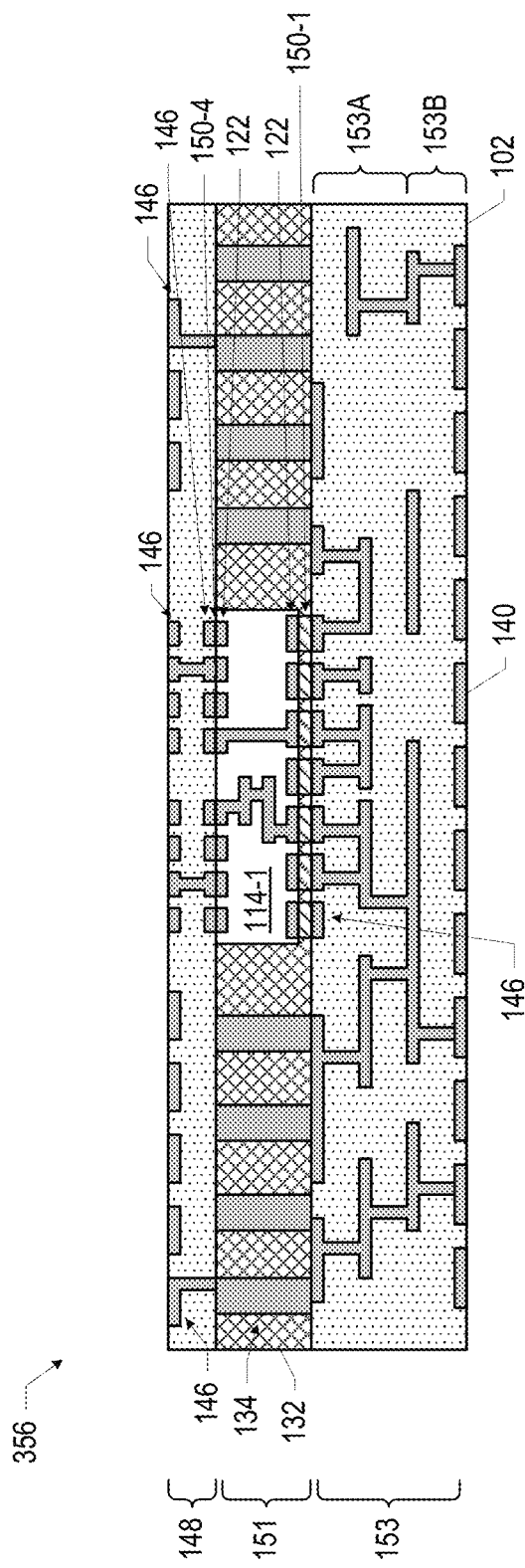

FIG. 26D illustrates an assembly 356 subsequent to coupling the package substrate sub-portion 153A and the package substrate sub-portion 153B of the assembly 354 (FIG. 26C) together to form the package substrate portion 153. The dies 114-2, 114-3, and 114-4 may be attached to the top surface of the package substrate portion 148 (e.g., in accordance with any of the techniques discussed above with reference to FIG. 23B, such as solder or anisotropic conductive material techniques) to form the microelectronic assembly 100 of FIG. 21.

Figure 27:
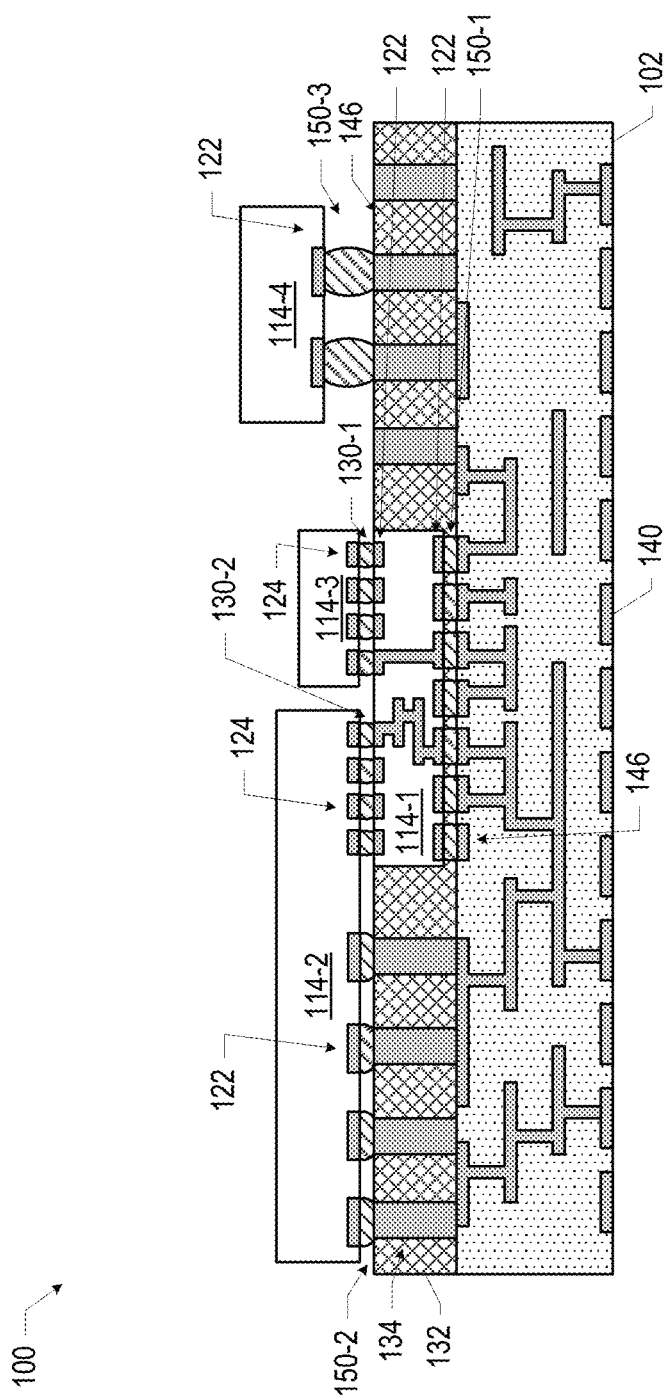
FIG. 27 is a side, cross-sectional view of an example microelectronic assembly, in accordance with various embodiments.

The microelectronic assemblies 100 disclosed herein may include conductive pillars 134 in the package substrate 102 even when the die 114-1 is not embedded in the package substrate 102 (e.g., even when no package substrate portion 148 is present). For example, FIG. 27 illustrates an example microelectronic assembly 100 in which the package substrate 102 includes conductive pillars 134 without a package substrate portion 148. In the microelectronic assembly 100 of FIG. 27, the conductive contacts 122 at the bottom surface of the die 114-2 are coupled to the conductive pillars 134 via DTPS interconnects 150-2, and the conductive contacts 124 at the bottom surface of the die 114-2 are coupled to the conductive contacts 122 at the top surface of the die 114-1 via DTD interconnects 130-2. Any of the other microelectronic assemblies 100 disclosed herein may include conductive pillars 134, as appropriate.

The microelectronic assemblies 100 disclosed herein may be used for any suitable application. For example, in some embodiments, a microelectronic assembly 100 may be used to provide an ultra-high density and high bandwidth interconnect for field programmable gate array (FPGA) transceivers and III-V amplifiers. For example, the die 114-1 may include FPGA transceiver circuitry or III-V amplifiers, and the die 114-2 may include FPGA logic. Communications between the die 114-1 and the die 114-2 may experience less delay than if such communications were routed through an intermediate device (e.g., a separate silicon bridge). In some embodiments, the pitch of the DTD interconnects 130-1 between the die 114-1 and the die 114-2 may be less than 100 microns (e.g., between 25 microns and 55 microns) and the pitch of the DTPS interconnects 150-2 between the die 114-2 and the package substrate 102 may be greater than 80 microns (e.g., between 100 microns and 150 microns). Such applications may be particularly suitable for military electronics, 5G wireless communications, WiGig communications, and/or millimeter wave communications.

More generally, the microelectronic assemblies 100 disclosed herein may allow "blocks" of different kinds of functional circuits to be distributed into different ones of the dies 114, instead of having all of the circuits included in a single large die, per some conventional approaches. In some such conventional approaches, a single large die would include all of these different circuits to achieve high bandwidth, low loss communication between the circuits, and some or all of these circuits may be selectively disabled to adjust the capabilities of the large die. However, because the DTD interconnects 130 of the microelectronic assemblies 100 may allow high bandwidth, low loss communication between different ones of the dies 114, different circuits may be distributed into different dies 114, reducing the total cost of manufacture, improving yield, and increasing design flexibility by allowing different dies 114 (e.g., dies 114 formed using different fabrication technologies) to be readily swapped to achieve different functionality. Additionally, a die 114 stacked on top of another die 114 may be closer to the heat spreader 131 than if the circuitry of the two dies were combined into a single die farther from the heat spreader 131, improving thermal performance.

In another example, a die 114-1 that includes active circuitry in a microelectronic assembly 100 may be used to provide an "active" bridge between other dies 114 (e.g., between the dies 114-2 and 114-3, or between multiple different dies 114-2, in various embodiments). In some such embodiments, power delivery may be provided to the "bottoms" of the die 114-1 and the other dies 114 through the package substrate 102 without requiring additional layers of package substrate 102 above the die 140-1 through which to route power.

In another example, the die 114-1 in a microelectronic assembly 100 may be a processing device (e.g., a central processing unit, a graphics processing unit, a FPGA, a modem, an applications processor, etc.), and the die 114-2 may include high bandwidth memory, transceiver circuitry, and/or input/output circuitry (e.g., Double Data Rate transfer circuitry, Peripheral Component Interconnect Express circuitry, etc.). In some embodiments, the die 114-1 may include a set of conductive contacts 124 to interface with a high bandwidth memory die 114-2, a different set of conductive contacts 124 to interface with an input/output circuitry die 114-2, etc. The particular high bandwidth memory die 114-2, input/output circuitry die 114-2, etc. may be selected for the application at hand.

In another example, the die 114-1 in a microelectronic assembly 100 may be a cache memory (e.g., a third level cache memory), and one or more dies 114-2 may be processing devices (e.g., a central processing unit, a graphics processing unit, a FPGA, a modem, an applications processor, etc.) that share the cache memory of the die 114-1.

As noted above, any of the arrangements of dies 114 illustrated in any of the accompanying figures may be part of a repeating pattern in a microelectronic assembly 100. Although FIGS. 12-16 were described above as "top" views of example arrangements of multiple dies 114 in various microelectronic assemblies 100, the arrangements of FIGS. 12-16 may also represent "bottom" views (i.e., arrangements in which the dies 114B are at least partially between the dies 114A and the package substrate 102, and the dies 114C are between the dies 114A and the package substrate 102). In this "flipped" orientation, some or all of the dies 114 in FIGS. 12-16 may be at least partially disposed in a recess 108 in a package substrate 102, or may not be disposed in a recess of a package substrate 102, and the different dies 114 may include any suitable circuitry (e.g., the dies 114A may be active or passive dies, and the dies 114B may include input/output circuitry (e.g., in-package input/output circuitry or external input/output circuitry, such as Double Data Rate or Peripheral Component Interconnect Express circuitry), high bandwidth memory, and/or enhanced dynamic random access memory (EDRAM)). In some embodiments, one or more of the dies 114 may include memory devices (e.g., random access memory), I/O drivers, high bandwidth memory, accelerator circuitry (e.g., artificial intelligence accelerator circuitry), an application-specific integrated circuit (e.g., an artificial intelligence application-specific integrated circuit), a field programmable gate array, a processor core, a central processing unit, a graphics processing unit, or any suitable circuitry.

FIGS. 28-32 are "top" views of other example arrangements of multiple dies 114 in various microelectronic assemblies 100, in accordance with various embodiments. The package substrate 102 is omitted from FIGS. 28-31; some or all the dies 114 in the arrangements of FIGS. 28-31 may be at least partially disposed in a recess 108 in a package substrate 102, or may not be disposed in the recess of the package substrate 102. The different dies 114 of the arrangements of FIGS. 28-31 may include any suitable circuitry (e.g., any of the circuitry discussed above with reference to FIGS. 12-16). Just as FIGS. 12-16 may also represent "bottom" views, the arrangements of FIGS. 28-31 may also represent "bottom" views (i.e., arrangements in which the dies 114B are at least partially between the dies 114A the package of 102).

FIGS. 28-30 illustrate arrangements similar to the arrangement of FIG. 15, but with fewer dies 114A "bridging" adjacent dies 114B. More generally, the microelectronic assemblies 100 disclosed herein may include sparser versions of any of the illustrated arrangements (e.g., arrangements including fewer dies 114A and/or 114B than an illustrated arrangement). The arrangement of FIG. 28 omits some of the central dies 114A from the arrangement of FIG. 15, while the arrangement of FIG. 29 omits some of the peripheral dies 114A from the arrangement of FIG. 15. In the arrangement of FIG. 30, various ones of the dies 114A have been omitted so that the arrangement has a serpentine or "S" shape; this is simply illustrative, and the arrangement of dies 114 in a microelectronic assembly 100 may have any desired footprint or other structure.

FIGS. 31-32 illustrate arrangements similar to the arrangement of FIG. 16, but with fewer dies 114B "bridging" adjacent dies 114A. In particular, the arrangement of FIG. 31 omits the central die 114B from the arrangement of FIG. 12, while the arrangement of FIG. 32 omits some of the peripheral dies 114B from the arrangement of FIG. 12.

In some embodiments, some or all of the dies 114 included in a microelectronic assembly 100 may support a communication network 170 between the dies 114. In particular, some or all of the dies 114 included in a microelectronic assembly 100 may include communication pathways 172 to other ones of the dies 114 so the data may be routed between different ones of the dies 114 via these communication pathways 172. In some such embodiments, different ones of the dies 114 may be different core processors between which high bandwidth communication is desired to achieve high performance. In some embodiments, a communication pathway 172 in a communication network 170 may include one or more clock lines (e.g., to control and coordinate timing of communications along the communication pathway 172) and one or more data lines (e.g., for the communication of data). In some embodiments, clock and data signals may be integrated in one or more lines to form a communication pathway 172 between different dies 114. The bandwidth of a communication pathway 172 may be increased by adding additional lines and/or by increasing the clock rate, for example.

In some embodiments, a communication pathway 172 between two dies 114 may go through DTD interconnects 130 between the two dies 114. For example, in an arrangement like the one illustrated in FIG. 11, a communication pathway 172 between the die 114-1 and a particular die 114-2 may go through the DTD interconnects 130-1 between the die 114-1 and the particular die 114-2. Allowing two dies 114 to communicate through a communication pathway 172 that does not route through the package substrate 102 may reduce losses, reduce errors, and/or improve latency.

In some embodiments, the "corner" dies 114B in any of the arrangements of FIG. 12-16 or 28-32 may include on-package memory devices (e.g., random access memory), I/O circuitry (e.g., I/O drivers), high bandwidth memory, accelerators, application-specific integrated circuits (e.g., artificial intelligence application-specific integrated circuits), a field programmable gate array, or any other suitable circuitry, and the dies 114A in direct communication with these corner dies 114B may be translator dies 114 (e.g., include translation circuitry 404, as discussed below) that convert signals between a protocol of the communication network 170 and a protocol readable by an interface of the corner dies 114B. In this manner, different dies 114 with different interfaces may be included in a single microelectronic assembly 100 (and translation performed by intervening dies 114 as suitable).

In some embodiments, the microelectronic assembly 100 may be included in a server, and many of the dies 114A may be processing cores. In some such embodiments, it may be useful to have memory devices physically proximate to these processing cores, and thus some or all of the dies 114B

(e.g., some of the dies 114B around the periphery of the arrangement) may be memory devices.

Figure 33:
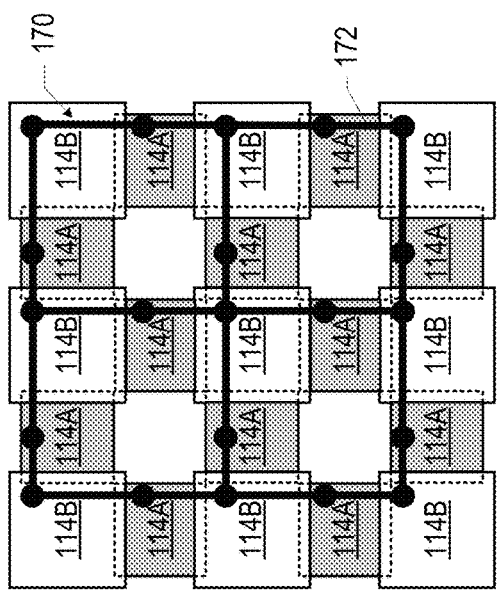

FIGS. 33-36 illustrate some examples of communication networks 170 (and their constituent communication pathways 172) that may be implemented in some of the example arrangements of dies 114 discussed herein. For example, FIG. 33 illustrates an example communication network 170 through the arrangement of FIG. 15. In the embodiment of FIG. 33, each of the dies 114 may be in direct communication with its nearest neighbors; in particular, a die 114A may receive/transmit data from/to the two dies 114B whose footprints overlap with the footprint of the die 114A, and a die 114B may receive/transmit data from/to the two, three, or four dies 114A whose footprints overlap with the footprint of the die 114B (e.g., with DTD interconnects 130 in the overlapping regions).

Figure 34:
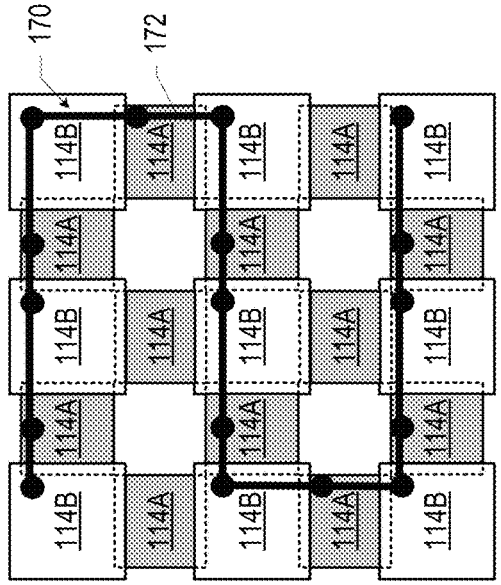
FIGS. 33-36 are top views of example arrangements of multiple dies supporting a communication network in a microelectronic assembly, in accordance with various embodiments.

FIG. 34 also illustrates an example communication network 170 through the arrangement of FIG. 15. In the embodiment of FIG. 34, the communication network 170 may route through the dies 114 in a serpentine or "S" shape such that any die 114B may receive/transmit data from/to at most two of the dies 114A whose footprints overlap with the footprint of the die 114B.

Figure 35:
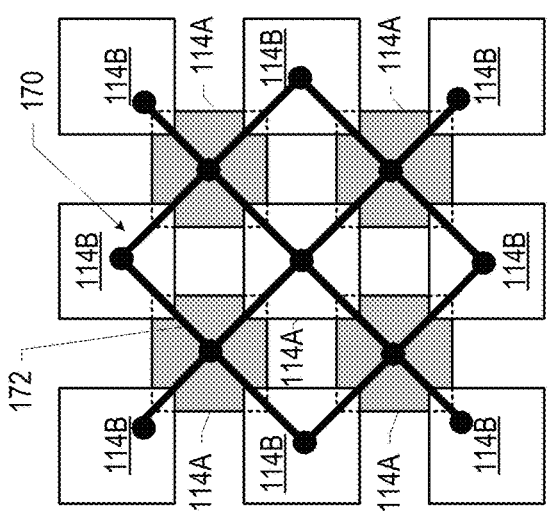

FIG. 35 illustrates an example communication network 170 through the arrangement of FIG. 16. In the embodiment of FIG. 35, a communication pathway 172 is present between each die 114A and its four nearest neighbor dies 114B (whose corners overlap with the corners of the die 114A).

Figure 36:
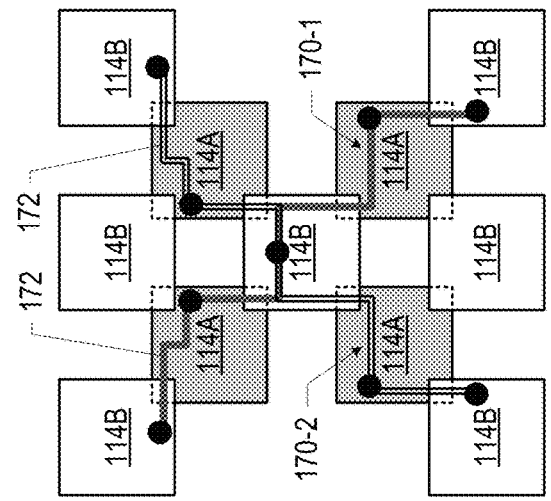

In some embodiments, a microelectronic assembly 100 may support multiple different communication networks 170 through some or all of the dies 114. For example, a first communication network 170 may have higher power consumption and lower latency, while a second communication network 170 may have lower power consumption and higher latency. Higher priority or time critical data may be communicated among the dies 114 using the first communication network 170, while lower priority or time insensitive data may be communicated among the dies 114 using the second communication network. One or more communication networks 170 included in a microelectronic assembly 100 may have the same topology (e.g., the same pattern of communication pathways 172 between the dies 114) or different topologies. For example, FIG. 36 illustrates the arrangement of FIG. 32 supporting two example communication networks 170-1 and 170-2. Certain ones of the dies 114 may be coupled to the communication network 170-1, certain ones of the dies 114 may be coupled to the communication network 170-2, and certain ones of the dies 114 may be coupled to both communication network 170-1 and 170-2. In another example, an arrangement like the arrangement of FIG. 15 may include two different communication networks 170, each having a topology like the communication network 170 illustrated in FIG. 33 (e.g., but with different power consumptions/performance). More generally, any arrangement of dies 114 in any of the micro electronic assemblies 100 disclosed herein may include one or more communication networks 170 having any desired topologies (e.g., a star topology, a partial mesh topology, a full mesh topology, a cluster tree topology, etc.).

The dies 114 included in a microelectronic assembly 100 may have any suitable structure. For example, FIGS. 37-40 illustrate example ones of the dies 114 a may be included in a microelectronic assembly 100. The dies 114 illustrated in FIG. 37-40 may include a die substrate 1602, one or more device layers 1604, and/or one or more metallization stacks 1619; these elements are discussed in further detail below with reference to FIG. 44.

FIG. 37 is a side, cross-sectional view of an example of the die 114-2 of FIG. 11, in accordance with various embodiments. As illustrated in FIG. 37, the die 114-2 may include a die substrate 1602, one or more device layers 1604, and a metallization stack 1619. The metallization stack 1619 may be between the conductive contacts 122/124 and the device layer 1604, and the device layer 1604 may be between the die substrate 1602 and the metallization stack 1619. Conductive pathways through the metallization stack 1619 (e.g., formed of conductive lines and/or vias) may conductively couple devices (e.g., transistors) in the device layer 1604 and the conductive contacts 122/124. Although the die 114-2 of FIG. 37 is discussed herein as belonging to the embodiment of FIG. 11, the structure of the die 114-2 represented in FIG. 37 may be the structure of any suitable ones of the single-sided dies 114 disclosed herein.

FIG. 38 is a side, cross-sectional view of an example of the die 114-1 of FIG. 11, in accordance with various embodiments. As illustrated in FIG. 37, the die 114-1 may include a die substrate 1602, one or more device layers 1604, and a metallization stack 1619. The metallization stack 1619 may be between the conductive contacts 122 and the device layer 1604, the device layer 1604 may be between the die substrate 1602 and the metallization stack 1619, and the die substrate 1602 may be between the device layer 1604 and the conductive contacts 124. One or more through-substrate vias (TSVs) 123 may extend through the die substrate 1602. Conductive pathways through the metallization stack 1619 (e.g., formed of conductive lines and/or vias) may conductively couple devices (e.g., transistors) in the device layer 1604 and the conductive contacts 122, while the TSVs 123 may conductively couple devices in the device layer 1604 and the conductive contacts 124.

FIG. 39 is a side, cross-sectional view of another example of the die 114-1 of FIG. 11, in accordance with various embodiments. As illustrated in FIG. 39, the die 114-1 may include a die substrate 1602, one or more device layers 1604, and a metallization stack 1619. The metallization stack 1619 may be between the conductive contacts 124 and the device layer 1604, the device layer 1604 may be between the die substrate 602 and the metallization stack 1619, and the die substrate 1602 may be between the device layer 1604 and the conductive contacts 122. One or TSVs 123 may extend through the die substrate 1602. Conductive pathways through the metallization stack 1619 may conductively couple devices in the device layer 1604 and the conductive contacts 124, while the TSVs 123 may conductively couple devices in the device layer 1604 and the conductive contacts 122. Although the die 114-1 of FIG. 39 is discussed herein as belonging to the embodiment of FIG. 11, the structure of the die 114-1 represented in FIG. 39 may be the structure of any suitable ones of the double-sided dies 114 disclosed herein. When a die 114-2 is structured as illustrated in FIG. 37, and is coupled to a die 114-1 (via DTD interconnects 130) that is structured as illustrated in FIG. 39, the distance between the device layers 1604 of the two dies 114 may be small and the DTD interconnects 130 may be closely spaced, resulting in a larger achievable bandwidth than if the die 114-1 were structured as illustrated in FIG. 38 (and the die 114-2 communicated with the die 114-1 through the TSVs 123). However, in such embodiments, power may be delivered to the die 114-2 from the package substrate 102 through the TSVs 123; since the TSVs 123 may be more widely spaced, the density of power delivery may be more limited than in an embodiment in which the die 114-1 is structured as illustrated in FIG. 38.

FIG. 40 is a side, cross-sectional view of another example of the die 114-1 of FIG. 11, in accordance with various embodiments. As illustrated in FIG. 40, the die 114-1 may include a first metallization stack 1619-1, one or more device layers 1604, and the second metallization stack 1619-2. The metallization stack 1619-1 may be between the conductive contacts 122 and the device layer 1604, the device layer 1604 may be between the first metallization stack 1619-1 and the second metallization stack 1619-2, and the second metallization stack 1619-2 may be between the device layer 1604 and the conductive contacts 124. Conductive pathways through the first metallization stack 1619-1 may conductively couple devices in the device layer 1604 and the conductive contacts 122, while the conductive pathways through the second metallization stack 1619-2 may conductively couple devices in the device layer 1604 and the conductive contacts 124. In the embodiment of FIG. 40, the device layer 1604 may first be fabricated on a die substrate 1602 (e.g., as discussed below with reference to FIG. 44), one metallization stack 1619 may be formed on the device layer 1604 (e.g., as discussed below with reference to FIG. 44), then the bulk of the die substrate 1602 may be removed and the second metallization stack 1619 formed on the other side of the device layer 1604.

The die 114-1 may have structures other than those depicted in FIGS. 37-40. For example, in some embodiments, a die 114-1 may have a structure similar to that depicted in FIG. 40, and further including a die substrate 1602 (and TSVs 123 therein) between the first metallization stack 1619-1 and the conductive contacts 122.

Figure 41:
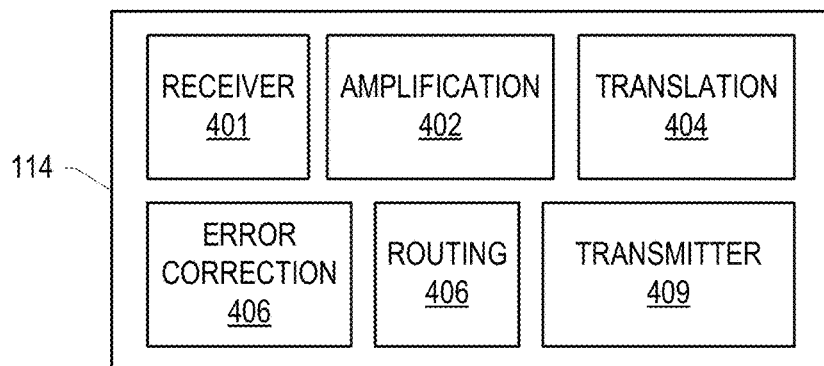
FIG. 41 is a block diagram of example circuitry that may be included in a die in a microelectronic assembly, in accordance with various embodiments.

One or more of the dies 114 included in a microelectronic assembly may include circuitry to support the operations of the communication network 170. FIG. 41 is a block diagram of various circuitry that may be included in one or more of the dies 114, in accordance with various embodiments. A particular die 114 may include some or all of the circuitry illustrated in FIG. 41. For example, in some embodiments, all of the dies 114 coupled to a communication network 114 may include amplification circuitry 402 (e.g., repeater circuitry).

In some embodiments, a die 114 may include receiver circuitry 401. The receiver circuitry 401 may be configured to receive signals transmitted to the die 114 along a communication pathway 172 from another one of the dies 114. In some embodiments, the receiver circuitry 401 may include filtering circuitry to remove or shape noise, baseband conversion circuitry, or any other appropriate circuitry.

In some embodiments, a die 114 may include amplification circuitry 402. The amplification circuitry 402 may include circuitry to amplify the magnitude of a signal received by the receiver circuitry 401 (e.g., to be transmitted along a conductive pathway 172 by the transmitter circuitry 409). In some embodiments, the amplification circuitry 402 may include repeater circuitry (e.g., bilateral repeater circuitry or unilateral repeater circuitry) to counteract the resistive losses experienced by signals as they are transmitted along a conductive pathway 172.

In some embodiments, a die 114 may include translation circuitry 404. The translation circuitry 404 may serve to convert signals received in accordance with a first protocol into signals that may be transmitted in accordance with a second, different protocol. For example, in some embodiments, the translation circuitry 404 may translate data into a Double Data Rate protocol or a Peripheral Component Interconnect Express protocol.

In some embodiments, the die 114 may include error correction circuitry 406. The error correction circuitry 406 may perform any suitable error detection techniques on signals received by the die 114 (e.g., repetition code techniques, parity bit techniques, checksum techniques, cyclic redundancy check techniques, or hash function techniques) and/or may perform any suitable error correction techniques on signals received by the die 114 (e.g., automatic repeat request techniques or error-correcting code techniques). In some embodiments, the die 114 may correct errors in the received signals before transmitting (or otherwise processing) those signals.

In some embodiments, a die 114 may include routing circuitry 408. The routing circuitry 408 may be configured to, when data is received by the receiver circuitry 401 and is destined for another die 114, determine on which conductive pathway 172 and/or to which other die 114 that data should be routed. The routing circuitry 408 may utilize any available information about the state of the other dies 114 or the communication network(s) 170 to determine on which conductive pathway 172 to route outgoing data traffic. For example, in some embodiments, the routing circuitry 408 may utilize data representative of the latency of different conductive pathways 172, data representative of the congestion of different conductive pathways 172, data representative of the utilization of different conductive pathways 172, data representative of the power available at different dies 114, data representative of the arrangement of other conductive pathways 172 in a communication network 170 (e.g., to determine the shortest path to a destination die 114), etc. In some embodiments, the routing circuitry 408 may utilize any available information about the outgoing data to determine where to route the outgoing data. For example, the routing circuitry 408 may determine that the outgoing data is relatively high priority data, and may select a conductive pathway 172 that is part of a higher power, lower latency communication network 170 (instead of a conductive pathway 172 that is part of a lower power, higher latency communication network 170). Generally, the routing circuitry 408 may implement any suitable routing techniques.

In some embodiments, a die 114 may include transmitter circuitry 409. The transmitter circuitry 409 may be configured to transmit signals along the communication pathway 172 to another one of the dies 114. In some embodiments, the transmitter circuitry 172 may include baseband conversion circuitry or any other appropriate circuitry. In some embodiments, the communication pathway 172 to another die 114 may route through the package substrate 102 (e.g., through a DTPS interconnect 150).

Figure 42:
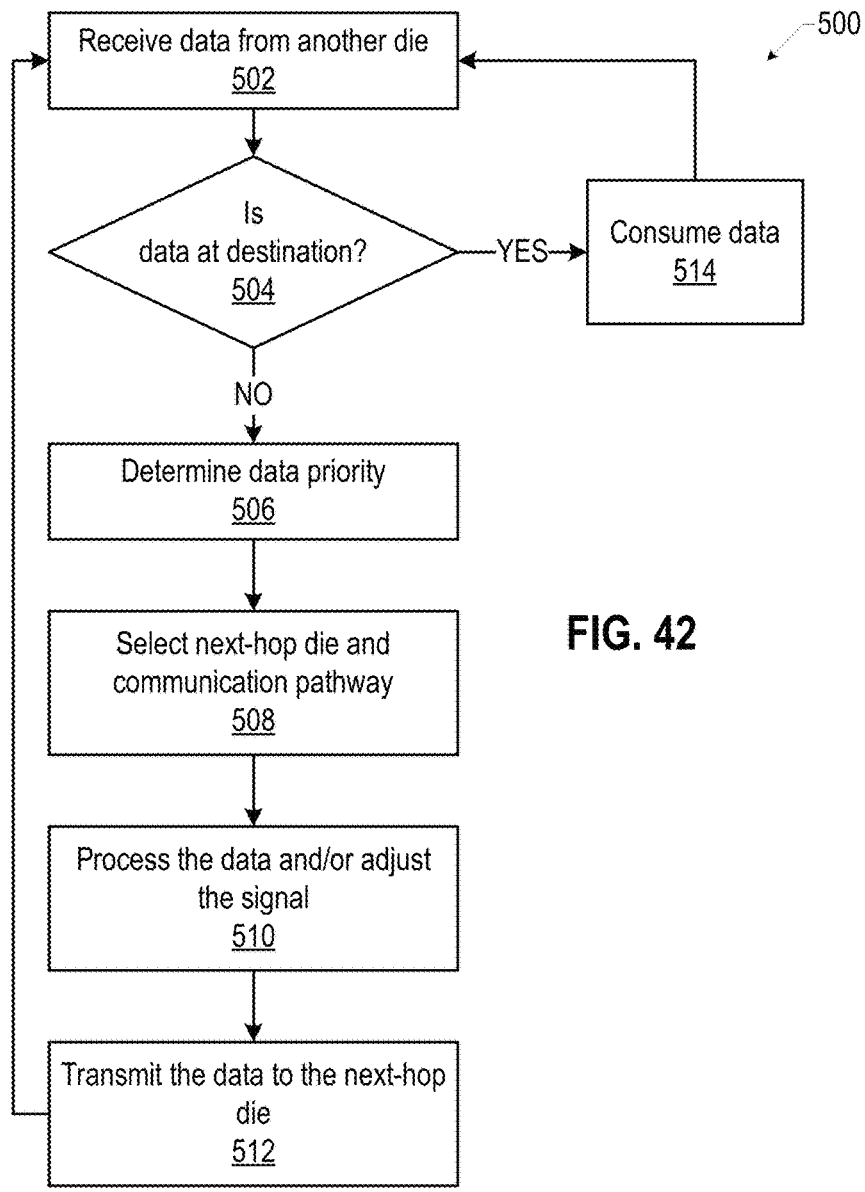
FIG. 42 is a flow diagram of a method of communicating data in a microelectronic assembly, in accordance with various embodiments.

As noted above, a die 114 may perform any suitable operations for supporting communication along the communication network 170. FIG. 42 is a flow diagram of an example method 500 of communicating data in a microelectronic assembly 100, in accordance with various embodiments. Although the operations of the method 500 may be illustrated with reference to particular embodiments of the dies 114 disclosed herein, the method 1000 may be implemented by any suitable ones of the dies 114 disclosed herein. Additionally, although operations are illustrated once each and in a particular order in FIG. 42, the operations may be reordered and/or repeated as desired (e.g., with different operations performed in parallel when receiving and transmitting data substantially simultaneously).

At 502, a die 114 (e.g., the receiver circuitry 401) may receive data from another die 114. For example, a die 114 (e.g., a die 114-1 or a die 114-2) may receive data from another die 114 (e.g., a die 114-2 or a die 114-1) via a communication pathway 172 of a communication network 170.

At 504, the die 114 (e.g., the routing circuitry 408) may determine whether the received data has reached its destination (i.e., if the destination of the data is the die 114 itself). In some embodiments, the die 114 may make this determination by identifying an indicator of the destination of the data (e.g., a destination address) in a header of one or more data packets associated with the data (along with an indicator of the source of the data, error detection/correction bits, etc.), for example. If the die 114 determines at 504 that the received data has reached its destination, the die 114 may proceed to 514 and consume the data (e.g., provide it to other circuitry included in the die 114 for processing, without further transmitting the data to another die 114).

If the die 114 determines at 504 that the received data has not reached its destination, the die 114 (e.g., the routing circuitry 408) may proceed to 506 and determine a priority of the data. In some embodiments, the die 114 may make this determination by identifying an indicator of the type or priority of the data in a header of one or more data packets associated with the data, for example. In some embodiments, the operations of 506 may not be performed.

At 508, the die 114 (e.g., the routing circuitry 408) may select a next-hop die 114 and/or a communication pathway 172 for transmitting the data. In some embodiments, the die 114 may have access to multiple communication networks 170 (e.g., with different performance levels), and may select the next-hop die 114 and/or a communication pathway 172 based at least in part on a desired communication network 170 (e.g., based on the priority of the data). In some embodiments, the die 114 may only be part of a single communication network 170, and may select the next-hop die 114 and/or the communication pathway 172 in accordance with any of the embodiments discussed above (e.g., to minimize the number of hops to the destination die 114, to minimize the latency to the destination die 114, etc.). In some embodiments, another die 114 may have determined the path that the data is to take through the communication network 170, and may have attached an indicator of this path to the packets associated with the data; in such embodiments, the die 114 may determine the next-hop die 114 and/or the communication pathway 172 based on the indicator of the predetermined path. In some embodiments, the die 114 may only route data in a single direction, or may only communicate with two other dies 114, and thus may readily determine a transmission direction of data without having to perform a more complex analysis (e.g., the die 114 may simply repeat and pass the data in a known direction through the communication network 170).

At 510, the die 114 (e.g., the amplification circuitry 402, the translation circuitry 404, and/or the error correction circuitry 406) may process the data and/or adjust the signal. For example, in some embodiments, the die 114 may include repeater circuitry to amplify a signal before transmitting it to another die 114. In some embodiments, the die 114 may perform error correction or translation before transmitting data to another die 114.

At 512, the die 114 (e.g., the transmitter circuitry 409) may transmit the data to the next-hop die over a communication pathway 172.

The microelectronic assemblies 100 disclosed herein may be included in any suitable electronic component. FIGS. 43-46 illustrate various examples of apparatuses that may include, or be included in, any of the microelectronic assemblies 100 disclosed herein.

Figure 43:
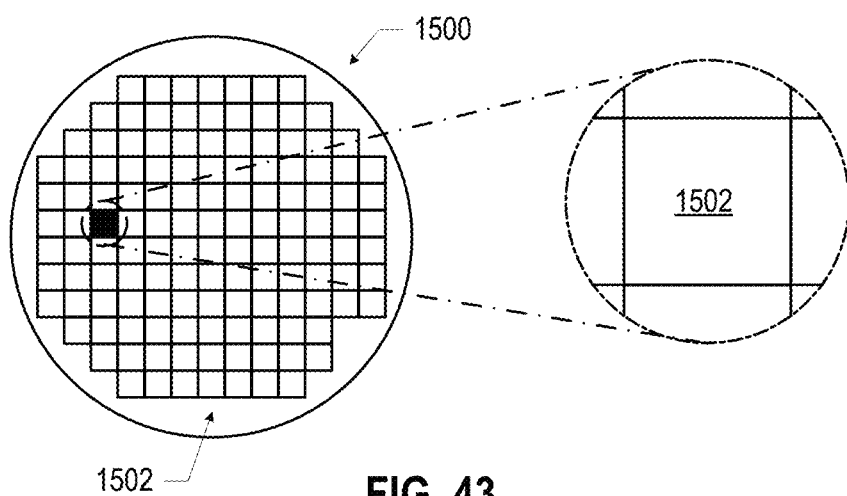
FIG. 43 is a top view of a wafer and dies that may be included in a microelectronic assembly, in accordance with any of the embodiments disclosed herein.

FIG. 43 is a top view of a wafer 1500 and dies 1502 that may be included in any of the microelectronic assemblies 100 disclosed herein (e.g., as any suitable ones of the dies 114). The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may be any of the dies 114 disclosed herein. The die 1502 may include one or more transistors (e.g., some of the transistors 1640 of FIG. 44, discussed below), supporting circuitry to route electrical signals to the transistors, passive components (e.g., signal traces, resistors, capacitors, or inductors), and/or any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 46) or other logic that is configured to store information in the memory devices or execute instructions stored in the memory array. Various ones of the microelectronic assemblies 100 disclosed herein may be manufactured using a die-to-wafer assembly technique in which some dies 114 are attached to a wafer 1500 that include others of the dies 114, and the wafer 1500 is subsequently singulated.

Figure 44:
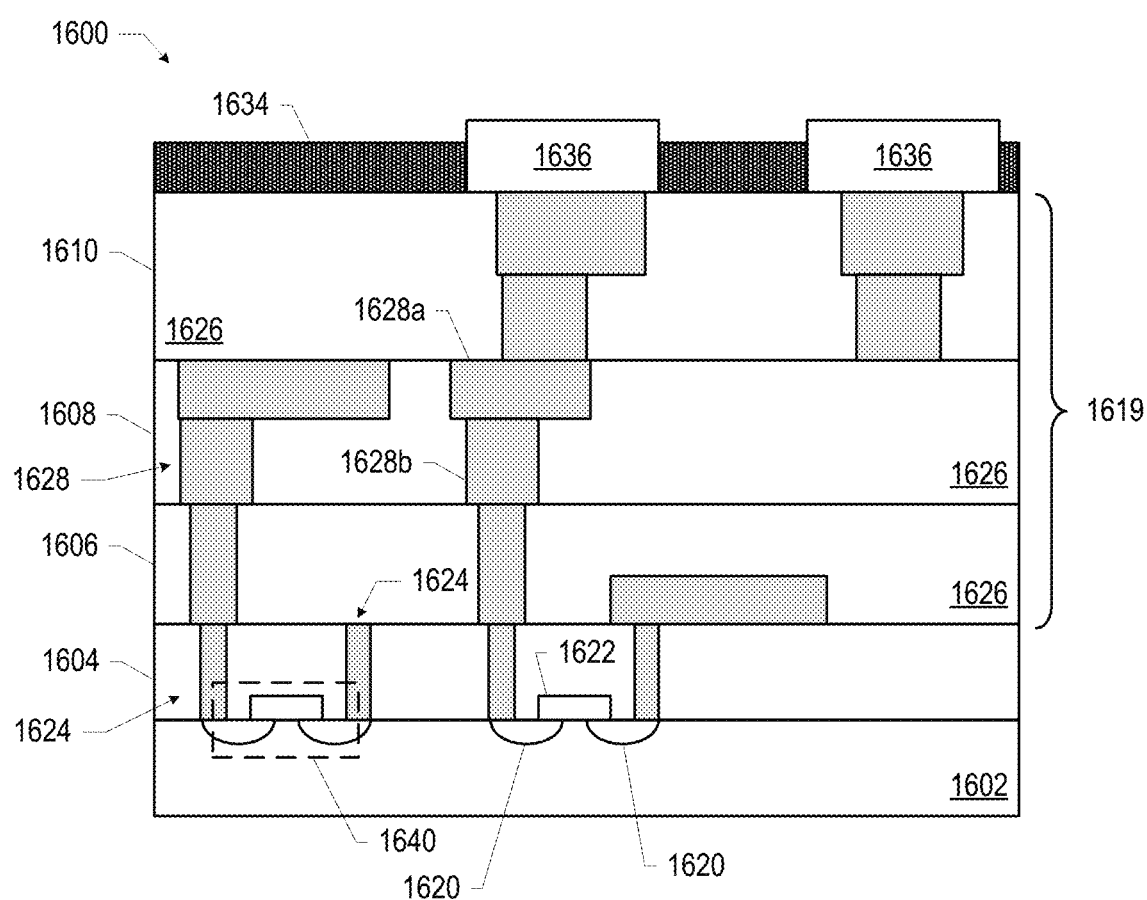
FIG. 44 is a cross-sectional side view of an integrated circuit (IC) device that may be included in a microelectronic assembly, in accordance with any of the embodiments disclosed herein.

FIG. 44 is a cross-sectional side view of an IC device 1600 that may be included in any of the microelectronic assemblies 100 disclosed herein (e.g., in any of the dies 114). One or more of the IC devices 1600 may be included in one or more dies 1502 (FIG. 43). The IC device 1600 may be formed on a die substrate 1602 (e.g., the wafer 1500 of FIG. 43) and may be included in a die (e.g., the die 1502 of FIG. 43). The die substrate 1602 may be a semiconductor substrate composed of semiconductor material systems including, for example, n-type or p-type materials systems (or a combination of both). The die substrate 1602 may include, for example, a crystalline substrate formed using a bulk silicon or a silicon-on-insulator (SOI) substructure. In some embodiments, the die substrate 1602 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 1602. Although a few examples of materials from which the die substrate 1602 may be formed are described here, any material that may serve as a foundation for an IC device 1600 may be used. The die substrate 1602 may be part of a singulated die (e.g., the dies 1502 of FIG. 43) or a wafer (e.g., the wafer 1500 of FIG. 43).

The IC device 1600 may include one or more device layers 1604 disposed on the die substrate 1602. The device layer 1604 may include features of one or more transistors 1640 (e.g., metal oxide semiconductor field-effect transistors (MOSFETs)) formed on the die substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 44 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the die substrate 1602 and two sidewall portions that are substantially perpendicular to the top surface of the die substrate 1602. In other embodiments, at least one of the metal layers that form the gate electrode may simply be a planar layer that is substantially parallel to the top surface of the die substrate 1602 and does not include sidewall portions substantially perpendicular to the top surface of the die substrate 1602. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the die substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the die substrate 1602 to form the S/D regions 1620. An annealing process that activates the dopants and causes them to diffuse farther into the die substrate 1602 may follow the ion-implantation process. In the latter process, the die substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., transistors 1640) of the device layer 1604 through one or more interconnect layers disposed on the device layer 1604 (illustrated in FIG. 44 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs; in particular, the arrangement is not limited to the particular configuration of interconnect structures 1628 depicted in FIG. 44. Although a particular number of interconnect layers 1606-1610 is depicted in FIG. 44, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628*a* may be arranged to route electrical signals in a direction of a plane that is substantially parallel with a surface of the die substrate 1602 upon which the device layer 1604 is formed. For example, the lines 1628*a* may route electrical signals in a direction in and out of the page from the perspective of FIG. 44. The vias 1628*b* may be arranged to route electrical signals in a direction of a plane that is substantially perpendicular to the surface of the die substrate 1602 upon which the device layer 1604 is formed. In some embodiments, the vias 1628*b* may electrically couple lines 1628*a* of different interconnect layers 1606-1610 together.

The interconnect layers 1606-1610 may include a dielectric material 1626 disposed between the interconnect structures 1628, as shown in FIG. 44. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include lines 1628*a* and/or vias 1628*b*, as shown. The lines 1628*a* of the first interconnect layer 1606 may be coupled with contacts (e.g., the S/D contacts 1624) of the device layer 1604.

A second interconnect layer 1608 (referred to as Metal 2 or "M2") may be formed directly on the first interconnect layer 1606. In some embodiments, the second interconnect layer 1608 may include vias 1628*b* to couple the lines 1628*a* of the second interconnect layer 1608 with the lines 1628*a* of the first interconnect layer 1606. Although the lines 1628*a* and the vias 1628*b* are structurally delineated with a line within each interconnect layer (e.g., within the second interconnect layer 1608) for the sake of clarity, the lines 1628*a* and the vias 1628*b* may be structurally and/or materially contiguous (e.g., simultaneously filled during a dual-damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 44, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components. The conductive contacts 1636 may serve as the conductive contacts 122 or 124, as appropriate.

In some embodiments in which the IC device 1600 is a double-sided die (e.g., like the die 114-1), the IC device 1600 may include another metallization stack (not shown) on the opposite side of the device layer(s) 1604. This metallization stack may include multiple interconnect layers as discussed above with reference to the interconnect layers 1606-1610, to provide conductive pathways (e.g., including conductive lines and vias) between the device layer(s) 1604 and additional conductive contacts (not shown) on the opposite side of the IC device 1600 from the conductive contacts 1636. These additional conductive contacts may serve as the conductive contacts 122 or 124, as appropriate.

In other embodiments in which the IC device 1600 is a double-sided die (e.g., like the die 114-1), the IC device 1600 may include one or more TSVs through the die substrate 1602; these TSVs may make contact with the device layer(s) 1604, and may provide conductive pathways between the device layer(s) 1604 and additional conductive contacts (not shown) on the opposite side of the IC device 1600 from the conductive contacts 1636. These additional conductive contacts may serve as the conductive contacts 122 or 124, as appropriate.

Figure 45:
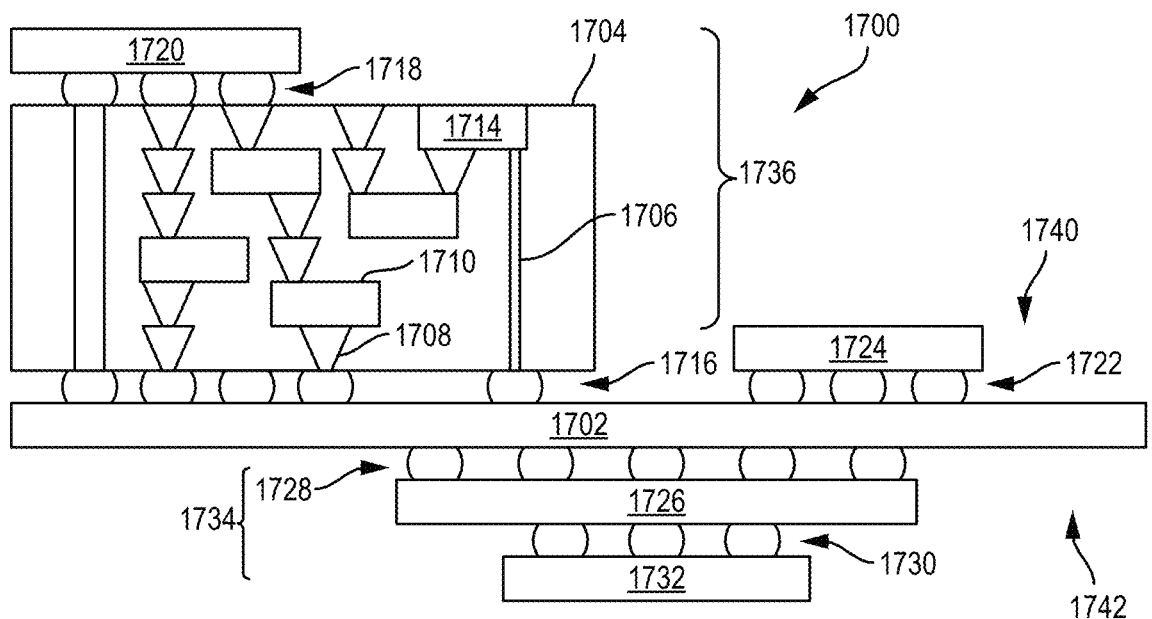
FIG. 45 is a cross-sectional side view of an IC device assembly that may include a microelectronic assembly, in accordance with any of the embodiments disclosed herein.

FIG. 45 is a cross-sectional side view of an IC device assembly 1700 that may include any of the microelectronic assemblies 100 disclosed herein. In some embodiments, the IC device assembly 1700 may be a microelectronic assembly 100. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any suitable ones of the embodiments of the microelectronic assemblies 100 disclosed herein.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate. In some embodiments the circuit board 1702 may be, for example, the circuit board 133.

The IC device assembly 1700 illustrated in FIG. 45 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 45), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 45, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 43), an IC device (e.g., the IC device 1600 of FIG. 44), or any other suitable component. Generally, the interposer 1704 may spread a connection to a wider pitch or reroute a connection to a different connection. For example, the interposer 1704 may couple the IC package 1720 (e.g., a die) to a set of ball grid array (BGA) conductive contacts of the coupling components 1716 for coupling to the circuit board 1702. In the embodiment illustrated in FIG. 45, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

In some embodiments, the interposer 1704 may be formed as a PCB, including multiple metal layers separated from one another by layers of dielectric material and interconnected by electrically conductive vias. In some embodiments, the interposer 1704 may be formed of an epoxy resin, a fiberglass-reinforced epoxy resin, an epoxy resin with inorganic fillers, a ceramic material, or a polymer material such as polyimide. In some embodiments, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to TSVs 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 45 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 46:
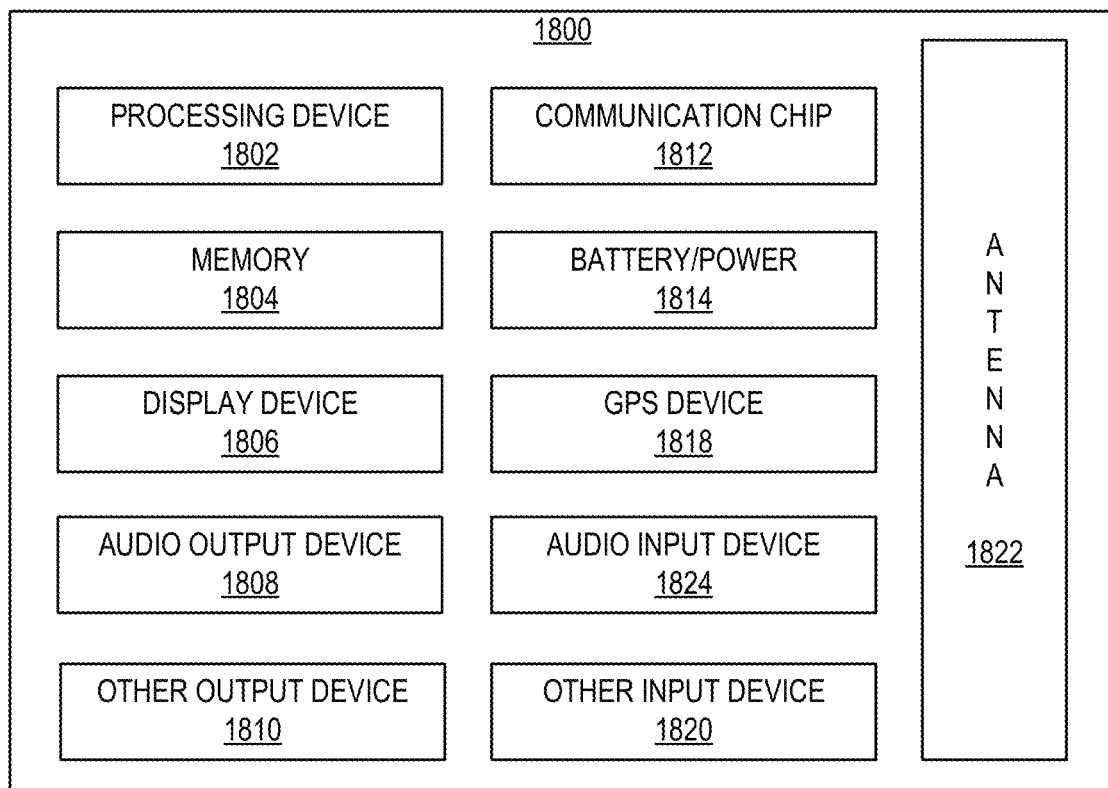
FIG. 46 is a block diagram of an example electrical device that may include a microelectronic assembly, in accordance with any of the embodiments disclosed herein.

FIG. 46 is a block diagram of an example electrical device 1800 that may include one or more of the microelectronic assemblies 100 disclosed herein. For example, any suitable ones of the components of the electrical device 1800 may include one or more of the IC device assemblies 1700, IC devices 1600, or dies 1502 disclosed herein, and may be arranged in any of the microelectronic assemblies 100 disclosed herein. A number of components are illustrated in FIG. 46 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 46, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is a microelectronic assembly, including: a package substrate; a first die coupled to the package substrate with first interconnects; and a second die coupled to the first die with second interconnects, wherein the second die is coupled to the package substrate with third interconnects; wherein a communication network is at least partially included in the first die and at least partially included in the second die, and the communication network includes a communication pathway between the first die and the second die.

Example 2 may include the subject matter of Example 1, and may further specify that the communication network includes at least one clock line and at least one data line.

Example 3 may include the subject matter of any of Examples 1-2, and may further specify that the first die includes amplification circuitry for the communication network.

Example 4 may include the subject matter of any of Examples 1-3, and may further specify that the first die includes translation circuitry for the communication network.

Example 5 may include the subject matter of any of Examples 1-4, and may further specify that the first die includes error correction circuitry for the communication network.

Example 6 may include the subject matter of any of Examples 1-5, and may further specify that the first die includes a memory device.

Example 7 may include the subject matter of any of Examples 1-6, and may further specify that the first die includes input/output circuitry.

Example 8 may include the subject matter of any of Examples 1-7, and may further specify that the first die includes artificial intelligence accelerator circuitry.

Example 9 may include the subject matter of any of Examples 1-8, and may further specify that the first die is a field programmable gate array.

Example 10 may include the subject matter of any of Examples 1-8, and may further specify that the first die is a central processing unit or a graphics processing unit.

Example 11 may include the subject matter of any of Examples 1-8, and may further specify that the first die is an application-specific integrated circuit.

Example 12 may include the subject matter of any of Examples 1-11, and may further specify that the second die includes amplification circuitry for the communication network.

Example 13 may include the subject matter of any of Examples 1-12, and may further specify that the second die includes translation circuitry for the communication network.

Example 14 may include the subject matter of any of Examples 1-13, and may further specify that the second die includes error correction circuitry for the communication network.

Example 15 may include the subject matter of any of Examples 1-14, and may further specify that the second die includes a memory device.

Example 16 may include the subject matter of any of Examples 1-15, and may further specify that the second die includes input/output circuitry.

Example 17 may include the subject matter of any of Examples 1-16, and may further specify that the second die includes artificial intelligence accelerator circuitry.

Example 18 may include the subject matter of any of Examples 1-17, and may further specify that the second die is a field programmable gate array.

Example 19 may include the subject matter of any of Examples 1-17, and may further specify that the second die is a central processing unit or a graphics processing unit.

Example 20 may include the subject matter of any of Examples 1-17, and may further specify that the second die is an application-specific integrated circuit.

Example 21 may include the subject matter of any of Examples 1-20, and may further specify that a footprint of the second die overlaps a footprint of an edge of the first die.

Example 22 may include the subject matter of any of Examples 1-21, and may further specify that a footprint of a corner of the second die overlaps a footprint of a corner of the first die.

Example 23 may include the subject matter of any of Examples 1-22, and may further specify that: the first die is one of a plurality of first dies; individual ones of the first dies are coupled to the package substrate with first interconnects; the second die is one of a plurality of second dies; and individual ones of the second dies are coupled to one or more of the first dies with second interconnects, wherein individual ones of the second dies are coupled to the package substrate with third interconnects.

Example 24 may include the subject matter of Example 23, and may further specify that the plurality of first dies are arranged in an array, and the plurality of second dies are arranged in an array.

Example 25 may include the subject matter of any of Examples 23-24, and may further specify that adjacent pairs of second dies have footprints that overlap a footprint of an associated first die.

Example 26 may include the subject matter of any of Examples 23-25, and may further specify that individual ones of the first dies have footprints that are overlapped by footprints of at least two second dies.

Example 27 may include the subject matter of any of Examples 23-26, and may further specify that individual ones of the first dies have footprints that are overlapped by footprints of at least four second dies.

Example 28 may include the subject matter of any of Examples 1-27, and may further specify that the first interconnects include solder.

Example 29 may include the subject matter of any of Examples 1-28, and may further specify that the first interconnects include an anisotropic conductive material.

Example 30 may include the subject matter of any of Examples 1-29, and may further specify that the third interconnects include solder.

Example 31 may include the subject matter of any of Examples 1-30, and may further specify that the third interconnects include an anisotropic conductive material.

Example 32 may include the subject matter of any of Examples 1-31, and may further specify that the second interconnects include solder.

Example 33 may include the subject matter of any of Examples 1-32, and may further specify that the second interconnects include an anisotropic conductive material.

Example 34 may include the subject matter of any of Examples 1-33, and may further specify that the second interconnects are plated interconnects.

Example 35 may include the subject matter of any of Examples 1-34, and may further specify that the second interconnects are metal-to-metal interconnects.

Example 36 is a microelectronic assembly, including: a plurality of first dies arranged in a first array; and a plurality of second dies arranged in a second array, wherein at least one of the second dies is coupled to at least two of the first dies with first interconnects; wherein a communication network is at least partially included in the first dies and at least partially included in the second dies, and the communication network includes communication pathways between the first dies and the second dies.

Example 37 may include the subject matter of Example 36, and may further include: a package substrate; wherein individual ones of the first dies are coupled to the package substrate with second interconnects, and individual ones of the second dies are coupled to the package substrate with third interconnects.

Example 38 may include the subject matter of any of Examples 36-37, and may further specify that the communication network includes at least one clock line and at least one data line.

Example 39 may include the subject matter of any of Examples 36-38, and may further specify that the first dies include amplification circuitry for the communication network.

Example 40 may include the subject matter of any of Examples 36-39, and may further specify that the first dies include translation circuitry for the communication network.

Example 41 may include the subject matter of any of Examples 36-40, and may further specify that the first dies include error correction circuitry for the communication network.

Example 42 may include the subject matter of any of Examples 36-41, and may further specify that the first dies include a memory device.

Example 43 may include the subject matter of any of Examples 36-42, and may further specify that the first dies include input/output circuitry.

Example 44 may include the subject matter of any of Examples 36-43, and may further specify that the first dies include artificial intelligence accelerator circuitry.

Example 45 may include the subject matter of any of Examples 36-44, and may further specify that the first dies include a field programmable gate array.

Example 46 may include the subject matter of any of Examples 36-45, and may further specify that the first dies include a central processing unit or a graphics processing unit.

Example 47 may include the subject matter of any of Examples 36-46, and may further specify that the first dies include an application-specific integrated circuit.

Example 48 may include the subject matter of any of Examples 36-47, and may further specify that the second dies include amplification circuitry for the communication network.

Example 49 may include the subject matter of any of Examples 36-48, and may further specify that the second dies include translation circuitry for the communication network.

Example 50 may include the subject matter of any of Examples 36-49, and may further specify that the second dies include error correction circuitry for the communication network.

Example 51 may include the subject matter of any of Examples 36-50, and may further specify that the second dies include a memory device.

Example 52 may include the subject matter of any of Examples 36-51, and may further specify that the second dies include input/output circuitry.

Example 53 may include the subject matter of any of Examples 36-52, and may further specify that the second dies include artificial intelligence accelerator circuitry.

Example 54 may include the subject matter of any of Examples 36-53, and may further specify that the second dies include a field programmable gate array.

Example 55 may include the subject matter of any of Examples 36-54, and may further specify that the second dies include a central processing unit or a graphics processing unit.

Example 56 may include the subject matter of any of Examples 36-55, and may further specify that the second dies include an application-specific integrated circuit.

Example 57 may include the subject matter of any of Examples 36-56, and may further specify that a footprint of at least one second die overlaps a footprint of an edge of at least one first die.

Example 58 may include the subject matter of any of Examples 36-57, and may further specify that a footprint of a corner of at least one second die overlaps a footprint of a corner of at least one first die.

Example 59 may include the subject matter of any of Examples 36-58, and may further specify that the first array is a rectangular array.

Example 60 may include the subject matter of any of Examples 36-59, and may further specify that the second array is a rectangular array.

Example 61 may include the subject matter of any of Examples 36-60, and may further specify that adjacent pairs of second dies have footprints that overlap a footprint of an associated first die.

Example 62 may include the subject matter of any of Examples 36-61, and may further specify that individual ones of the first dies have footprints that are overlapped by footprints of at least two second dies.

Example 63 may include the subject matter of any of Examples 36-62, and may further specify that individual ones of the first dies have footprints that are overlapped by footprints of at least four second dies.

Example 64 may include the subject matter of any of Examples 36-63, and may further specify that the second interconnects include solder.

Example 65 may include the subject matter of any of Examples 36-64, and may further specify that the second interconnects include an anisotropic conductive material.

Example 66 may include the subject matter of any of Examples 36-65, and may further specify that the third interconnects include solder.

Example 67 may include the subject matter of any of Examples 36-66, and may further specify that the third interconnects include an anisotropic conductive material.

Example 68 may include the subject matter of any of Examples 36-67, and may further specify that the first interconnects include solder.

Example 69 may include the subject matter of any of Examples 36-68, and may further specify that the first interconnects include an anisotropic conductive material.

Example 70 may include the subject matter of any of Examples 36-68, and may further specify that the first interconnects are plated interconnects.

Example 71 may include the subject matter of any of Examples 36-68, and may further specify that the first interconnects are metal-to-metal interconnects.

Example 72 is a computing device, including: a circuit board; and a microelectronic package coupled to the circuit board, wherein the microelectronic package includes a plurality of first dies and a plurality of second dies, at least one of the second dies is coupled to at least two of the first dies with first interconnects, and at least one of the second dies is coupled to a package substrate with second interconnects.

Example 73 may include the subject matter of Example 72, and may further specify that a communication network is at least partially included in the first dies and at least partially included in the second dies, and the communication network includes a communication pathway between the first die and the second die.

Example 74 may include the subject matter of any of Examples 72-73, and may further specify that at least one of the first dies or at least one of the second dies includes translation circuitry.

Example 75 may include the subject matter of any of Examples 72-73, and may further specify that the computing device is a server.

Example 76 may include the subject matter of any of Examples 72-73, and may further specify that the computing device is a mobile computing device.

Example 77 may include the subject matter of any of Examples 72-76, and may further specify that individual ones of the first dies include a die substrate, a metallization stack, and a device layer between the die substrate and the metallization stack, and wherein the die substrate is between the package substrate and the device layer.

Example 78 may include the subject matter of any of Examples 72-76, and may further specify that individual ones of the first dies include a die substrate, a metallization stack, and a device layer between the die substrate and the metallization stack, and wherein the device layer is between the package substrate and the die substrate.

Example 79 may include the subject matter of any of Examples 72-76, and may further specify that individual ones of the first dies include a first metallization stack, a second metallization stack, and a device layer between the first metallization stack and the second metallization stack.

Example 80 may include the subject matter of any of Examples 72-79, and may further specify that the first interconnects include solder.

Example 81 may include the subject matter of any of Examples 72-80, and may further specify that the first interconnects include an anisotropic conductive material.

Example 82 may include the subject matter of any of Examples 72-79, and may further specify that the first interconnects are plated interconnects.

Example 83 may include the subject matter of any of Examples 72-79, and may further specify that the first interconnects are metal-to-metal interconnects.

Example 84 may include the subject matter of any of Examples 72-83, and may further specify that the second interconnects include solder.

Example 85 may include the subject matter of any of Examples 72-84, and may further specify that the second interconnects include an anisotropic conductive material.

Example 86 is a method of communicating data in a microelectronic assembly, including: receiving data at a first die from a second die via a first communication pathway, wherein the first die is coupled to a package substrate with first interconnects, the second die is coupled to the first die with second interconnects, the second die is coupled to the package substrate with third interconnects, and the first communication pathway goes through at least some of the second interconnects; and transmitting data from the first die to a third die via a second communication pathway, wherein the third die is coupled to the first die with fourth interconnects, the third die is coupled to the package substrate with fifth interconnects, and the second communication pathway goes through at least some of the fourth interconnects.

Example 87 may include the subject matter of Example 86, and may further specify that the first communication pathway and the second communication pathway each include at least one clock line and at least one data line.

Example 88 may include the subject matter of any of Examples 86-87, and may further specify that the first die is at least partially in a recess in the package substrate.

Example 89 may include the subject matter of any of Examples 86-88, and may further specify that the second die is at least partially in a recess in the package substrate.

Example 90 may include the subject matter of any of Examples 86-89, and may further specify that the data received at the first die is the same data transmitted from the first die, and the method further includes: translating the data, by the first die, from a first protocol into a second protocol before transmitting it from the first die.

Example 91 may include the subject matter of Example 90, and may further specify that the second protocol is a Double Data Rate protocol.

Example 92 may include the subject matter of any of Examples 86-91, and may further specify that the data received at the first die is the same data transmitted from the first die, and the method further includes: amplifying the data, by the first die, before transmitting it from the first die.

Example 93 is a method of communicating data in a microelectronic assembly, including: receiving data at a second die from a first die via a first communication pathway, wherein the first die is coupled to a package substrate with first interconnects, the second die is coupled to the first die with second interconnects, the second die is coupled to the package substrate with third interconnects, and the first communication pathway goes through at least some of the second interconnects; and transmitting data from the second die to a third die via a second communication pathway, wherein the third die is coupled to the second die with fourth interconnects, and the second communication pathway goes through at least some of the fourth interconnects.

Example 94 may include the subject matter of Example 93, and may further specify that the first communication pathway and the second communication pathway each include at least one clock line and at least one data line.

Example 95 may include the subject matter of any of Examples 93-94, and may further specify that the first die is at least partially in a recess in the package substrate.

Example 96 may include the subject matter of any of Examples 93-95, and may further specify that the second die is at least partially in a recess in the package substrate.

Example 97 may include the subject matter of any of Examples 93-96, and may further specify that the data received at the second die is the same data transmitted from the second die, and the method further includes: translating the data, by the second die, from a first protocol into a second protocol before transmitting it from the second die.

Example 98 may include the subject matter of Example 97, and may further specify that the second protocol is a Double Data Rate protocol.

Example 99 may include the subject matter of any of Examples 93-98, and may further specify that the data received at the second die is the same data transmitted from the second die, and the method further includes: amplifying the data, by the second die, before transmitting it from the second die.

The invention claimed is:

1. A microelectronic assembly, comprising:
   a first redistribution layer;
   a first die above the redistribution layer, the first die having a top side and a bottom side, and a first sidewall and a second sidewall between the top side and the bottom side, the second sidewall laterally opposite the first sidewall, and the first die comprising a plurality of through substrate vias;
   a first conductive pillar laterally spaced apart from the first sidewall of the first die;
   a second conductive pillar laterally spaced apart from the second sidewall of the first die;
   a mold material on the first redistribution layer and laterally adjacent to the first die, the first conductive pillar, and the second conductive pillar, the mold material in contact with the first conductive pillar and the second conductive pillar;
   a second redistribution layer having a top surface and a bottom surface, the bottom surface on the first conductive pillar, on the second conductive pillar, on the mold material, and over the first die;
   a second die coupled to the top surface of the second redistribution layer, the second die vertically over the first die; and
   a third die coupled to the top surface of the second redistribution layer, the third die vertically over the first die, and the third die laterally spaced apart from the second die, wherein the first die electrically couples the second die to the third die.

2. The microelectronic assembly of claim 1, wherein the first die comprises silicon.

3. The microelectronic assembly of claim 1, wherein the second redistribution layer couples the second die to the first die, and the second redistribution layer couples the third die to the first die.

4. The microelectronic assembly of claim 1, wherein the second die is coupled to the first conductive pillar.

5. The microelectronic assembly of claim 4, wherein the third die is coupled to the second conductive pillar.

6. The microelectronic assembly of claim 1, wherein the second die is vertically over the first conductive pillar.

7. The microelectronic assembly of claim 6, wherein the third die is vertically over the second conductive pillar.

8. A method of fabricating a microelectronic assembly, the method comprising:
    forming a first package substrate portion;
    providing a first component above the package substrate portion, the first component having a top side and a bottom side, and a first sidewall and a second sidewall between the top side and the bottom side, the second sidewall laterally opposite the first sidewall, and the first component comprising a plurality of through substrate vias;
    forming a first conductive pillar laterally distanced apart from the first sidewall of the first component;
    forming a second conductive pillar laterally distanced apart from the second sidewall of the first component;
    forming a mold material on the first package substrate portion and laterally adjacent to the first component, the first conductive pillar, and the second conductive pillar, the mold material in contact with the first conductive pillar and the second conductive pillar;
    forming a second package substrate portion having a top surface and a bottom surface, the bottom surface on the first conductive pillar, on the second conductive pillar, on the mold material, and over the first component;
    providing a second component coupled to the top surface of the second package substrate portion, the second component vertically over the first component; and
    providing a third component coupled to the top surface of the second package substrate portion, the third component vertically over the first component, and the third component laterally distanced apart from the second component, wherein the first component electrically couples the second component to the third component.

9. The method of claim 8, wherein the first component comprises silicon.

10. The method of claim 8, wherein the second package substrate portion couples the second component to the first component, and the second package substrate portion couples third component to the first component.

11. The method of claim 8, wherein the second component is coupled to the first conductive pillar.

12. The method of claim 11, wherein the third component is coupled to the second conductive pillar.

13. The method of claim 8, wherein the second component is vertically over the first conductive pillar.

14. The method of claim 13, wherein the third component is vertically over the second conductive pillar.

15. An electrical device, comprising:
    a board; and
    a microelectronic assembly coupled to the board, the microelectronic assembly comprising:
        a first redistribution layer;
        a first die above the redistribution layer, the first die having a top side and a bottom side, and a first sidewall and a second sidewall between the top side and the bottom side, the second sidewall laterally opposite the first sidewall, and the first die comprising a plurality of through substrate vias;
        a first conductive pillar laterally spaced apart from the first sidewall of the first die;
        a second conductive pillar laterally spaced apart from the second sidewall of the first die;
        a mold material on the first redistribution layer and laterally adjacent to the first die, the first conductive pillar, and the second conductive pillar, the mold material in contact with the first conductive pillar and the second conductive pillar;
        a second redistribution layer having a top surface and a bottom surface, the bottom surface on the first conductive pillar, on the second conductive pillar, on the mold material, and over the first die;
        a second die coupled to the top surface of the second redistribution layer, the second die vertically over the first die; and
        a third die coupled to the top surface of the second redistribution layer, the third die vertically over the first die, and the third die laterally spaced apart from the second die, wherein the first die electrically couples the second die to the third die.

16. The electrical device of claim 15, further comprising: a memory coupled to the board.

17. The electrical device of claim 15, further comprising: a processing device coupled to the board.

18. The electrical device of claim 15, further comprising: a communication chip coupled to the board.

19. The electrical device of claim 15, further comprising: a battery coupled to the board.

20. The electrical device of claim 15, further comprising: a display device coupled to the board.

* * * * *